US010275556B2

(12) United States Patent
Sarpeshkar

(10) Patent No.: US 10,275,556 B2
(45) Date of Patent: Apr. 30, 2019

(54) EMULATION OF QUANTUM AND QUANTUM-INSPIRED DISCRETE-STATE SYSTEMS WITH CLASSICAL TRANSCONDUCTOR-CAPACITOR CIRCUITS

(71) Applicant: The Trustees of Dartmouth College, Hanover, NH (US)

(72) Inventor: Rahul Sarpeshkar, Hanover, NH (US)

(73) Assignee: The Trustees of Dartmouth College, Hanover, NH (US)

( * ) Notice: Subject to any disclaimer, the term of this patent is extended or adjusted under 35 U.S.C. 154(b) by 0 days.

(21) Appl. No.: 15/826,100

(22) Filed: Nov. 29, 2017

(65) Prior Publication Data

US 2018/0150760 A1 May 31, 2018

Related U.S. Application Data

(60) Provisional application No. 62/427,776, filed on Nov. 29, 2016.

(51) Int. Cl.
*G06N 99/00* (2019.01)
*G06F 9/455* (2018.01)
(Continued)

(52) U.S. Cl.
CPC ............ *G06F 17/5036* (2013.01); *G06F 7/48* (2013.01); *G06F 9/455* (2013.01);
(Continued)

(58) Field of Classification Search
CPC ........ G06F 9/455; G06F 17/5036; G06F 7/48; G06F 9/45504; G06F 2207/428;
(Continued)

(56) References Cited

U.S. PATENT DOCUMENTS

2014/0201126 A1* 7/2014 Zadeh ................... G06K 9/627
706/52
2018/0150761 A1* 5/2018 Sarpeshkar ............ G06N 10/00

OTHER PUBLICATIONS

Clerk et al., "Introduction to quantum noise, measurement, and amplification", Reviews of Modern Physics, vol. 82, Apr.-Jun. 2010, pp. 1155-1208.

(Continued)

*Primary Examiner* — Ly D Pham
(74) *Attorney, Agent, or Firm* — Davis & Bujold PLLC; Michael J. Bujold

(57) ABSTRACT

We disclose transconductor-capacitor classical dynamical systems that emulate quantum dynamical systems and quantum-inspired systems by composing them with 1) a real capacitor, whose value exactly emulates the value of the quantum constant $\hbar$ termed a Planck capacitor; 2) a 'quantum admittance' element, which has no classical equivalent, but which can be emulated by approximately 18 transistors of a coupled transconductor system; 3) an emulated 'quantum transadmittance element' that can couple emulated quantum admittances to each other; and 4) an emulated 'quantum transadmittance mixer element' that can couple quantum admittances to each other under the control of an input. We describe how these parts may be composed together to emulate arbitrary two-state and discrete-state quantum or quantum-inspired systems including stochastics, state preparation, probability computations, state amplification, state attenuation, control, dynamics, and loss compensation.

37 Claims, 48 Drawing Sheets

(51) Int. Cl.
*H03H 11/12* (2006.01)
*G06F 17/50* (2006.01)
*G06N 10/00* (2019.01)
*G06F 7/48* (2006.01)
*G06N 7/00* (2006.01)
*H01L 39/02* (2006.01)
*G05F 3/26* (2006.01)
*H03H 11/04* (2006.01)

(52) U.S. Cl.
CPC ......... *G06F 9/45504* (2013.01); *G06N 7/005* (2013.01); *G06N 10/00* (2019.01); *H01L 39/025* (2013.01); *H03H 11/1204* (2013.01); *G05F 3/262* (2013.01); *G06F 2207/482* (2013.01); *H03H 11/0422* (2013.01)

(58) Field of Classification Search
CPC ...... G06N 99/002; G06N 10/00; G06N 7/005; H03H 11/0422; H03H 11/1204; H01L 39/025; G05F 3/262
USPC ........................................................ 706/52
See application file for complete search history.

(56) References Cited

OTHER PUBLICATIONS

Daniel et al., "Synthetic analog computation in living cells", Nature, vol. 497, May 30, 2013, pp. 619-624.

Hahnloser et al., www.nature.com, "Digital selection and analogue amplification coexist in a cortex-inspired silicon circuit", Nature, vol. 408, Dec. 21/28, 2000, pp. 1012 and vol. 405, Jun. 22, 2000, pp. 947-951.

Kassal et al., www.annualreviews.org, "Simulating Chemistry Using Quantum Computers", Annual Review of Physical Chemistry, 2011, 62:185-207; including Contents 3 pages [See Specification, p. 2].

Laszlo B. Kish, SPIEDigitalLibrary.org/conference-proceedings-of-spie, "Quantum computing with analog circuits: Hilbert space computing", Proc. of SPIE vol. 5055, Smart Structures and Materials, Jul. 22, 2003, 10 pages [See Specification, p. 1].

La Cour et al., iopscience.iop.org, "Signal-based classical emulation of a universal quantum computer", New Journal of Physics, 17, May 13, 2015, pp. 1-20 [See Specification, p. 1].

Mandal et al., "A Bio-Inspired Active Radio-Frequency Silicon Cochlea", IEEE Journal of Solid-State Circuits, vol. 44, No. 6, Jun. 2009, pp. 1814-1828.

Nielson et al., "Quantum Computation and Quantum Information", Cambridge, 33 pp. [See Specification, p. 2].

Rahul Sarpeshkar, "Analog Versus Digital: Extrapolating from Electronics to Neurobiology", Neural Computation, 10, 1601-1638, Mar. 4, 1998.

Sarpeshkar et al., "White Noise in MOS Transistors and Resistors", Nov. 1993, pp. 23-29.

Rahul Sarpeshkar, "Ultra Low Power Bioelectronics" Fundamentals, Biomedical Applications and Bio-Inspired Systems, Cambridge, pp. 354-384.

Whitfield et al., "Simulation of electronic structure Hamiltonians using quantum computers", Molecular Physics, vol. 109, No. 5, Mar. 10, 2011, pp. 735-750; including first page cover.

Woo et al., "A Cytomorphic Chip for Quantitative Modeling of Fundamental Bio-Molecular Circuits", IEEE Transactions on Biomedical Circuits and Systems, vol. 9, No. 4, Aug. 2015, pp. 527-542.

Woo et al., "A Spiking-Neuron Collective Analog Adder with Scalable Precision", IEEE, 2013, pp. 1620-1623.

* cited by examiner

EMULATION OF QUANTUM AND QUANTUM-INSPIRED DISCRETE-STATE SYSTEMS WITH CLASSICAL TRANSCONDUCTOR-CAPACITOR CIRCUITS

CROSS-REFERENCE TO RELATED APPLICATIONS

This application claims benefit under 35 USC § 119(e) of U.S. Provisional Patent Application Ser. No. 62/427,776, filed Nov. 29, 2016, the contents of which are incorporated herein in their entirety by reference.

STATEMENT OF FEDERALLY SPONSORED RESEARCH OR DEVELOPMENT

Not Applicable.

BACKGROUND

Prior work has previously used attempted to use analog circuits, e.g., Laszlo B. Kisch, "Quantum Computing with Analog Circuits: Hilbert Space Computing", Proceedings of SPIE Vol. 5055 (2003) or signal processing, e.g., B. R. LaCour and G. E. Ott, "Signal-based Classical Emulation of a Universal Quantum Computer", New Journal of Physics, 17, 2015 to attempt to emulate quantum dynamical systems. However, such systems require the use of a 90°-phase shifter to represent the imaginary number i in quantum mechanics, which is impossible to practically create over an infinite frequency range as is needed. They do not have the capability to automatically represent and efficiently control essential quantum features such as the Planck constant, probability conservation, and energy conservation, important in quantum entanglement and correlated quantum operations. They do not have the capability to or do not efficiently emulate the stochastics or noise of quantum mechanical systems that couples quantum damping and quantum fluctuation, and which is an integral part of quantum uncertainty and some quantum-computing applications. They use other ideal mathematical signal-processing elements that require large numbers of devices to create, making them impractical to implement in actual physical systems or with compact physical circuits built with transistors. They do not provide methods that compensate for loss in actual physical systems such that they can behave in an ideal nearly lossless quantum or quantum-inspired fashion, which is beneficial for both quantum control and for quantum computing and necessary for actual physical emulations. They do not exploit efficient means for probability measurement and probability pattern recognition that are amenable to compact transistor implementations. They do not show how easily-created nonlinear operation in classical systems can create novel hybrid quantum-classical architectures that are useful for both quantum and quantum-inspired computing or for investigation of non-independent particle interactions. Finally, they do not show how a linear scaling in the number of classical circuits can help implicitly represent and initiate an exponential number of quantum tensor-product superposition states, even if they are not all simultaneously accessible as in actual quantum systems.

Given the large numbers of applications of quantum and quantum-inspired systems possible with even the interaction of a modest number of quantum two-state systems, e.g. for novel computing M. Nielsen & I. Chuang, "Quantum Computation and Quantum Information," Cambridge University Press, 2000, communication, and quantum chemistry, e.g., Ivan Kassal, et. al, "Simulating chemistry using quantum computers." Annual Review of Physical Chemistry, Vol. 62 pp. 185-207, 2011, as well as the easy availability of large numbers of transistors on current integrated-circuit chips at room temperature, there is both a need and an opportunity for efficient emulation of quantum circuits with classical circuit building blocks. Such emulation can not only be directly useful in applications that classically emulate quantum operation on transistor chips in hardware but it can also help create circuit-based software tools that design and analyze actual synthetic or natural quantum or quantum-inspired systems, e.g, as in Josephson-junction based superconducting quantum systems.

SUMMARY OF THE INVENTION

In this application, we disclose transconductor-capacitor classical dynamical systems that exactly emulate quantum dynamical systems by composing them with 1) a real capacitor, whose value exactly emulates the value of $\hbar=h/(2\pi)$ with h being Planck's constant, and being adjustable; complex voltage variables are then composed of two parts corresponding to the real and imaginary parts of the quantum probability-amplitude wave function and represented on two such $\hbar$ capacitors; such 'Planck capacitors', as we shall term them, are ubiquitous in our emulations. 2) a 'quantum admittance' element, which has no classical equivalent, but which can be emulated exactly by a coupled transconductor system; these transconductors effectively create an exact emulation of quantum behavior with two classical $\hbar$ capacitors that couple to each other via a symmetric negative-feedback loop, creating the oscillatory behavior and energy-current flows seen in an isolated quantum admittance; Transistor-based implementations that compensate for loss can effectively emulate such systems with approximately 18 transistors; 3) a 'quantum transadmittance element' wherein the current output of the transadmittance at one complex voltage variable site is controlled by another complex voltage variable input; transistor-based implementations can take just 12 transistors for physical emulation by leveraging transistors already in existence within quantum admittance elements; 4) a 'quantum transadmittance mixer element', which enables control of one complex voltage variable at one frequency by two complex voltage variables at two other frequencies that mix, thus enabling controlled and spectrally resonant quantum interactions. Such interactions can raise or lower quantum states between energy levels as in atomic energy transitions controlled by light inputs. A cascade of N emulated quantum transadmittance mixer elements, along with associated emulated quantum two-state systems can classically emulate and implicitly spectrally represent a superposition of $2^N$ simultaneous quantum states with different amplitudes and phases at $2^N$ frequencies, with a linear scaling in resources, which is useful in several quantum computing applications.

Current-mode versions of the voltage-mode circuits described in this emulation can also be easily created via exact mapping of transconductor-capacitor topologies to current-mode topologies as disclosed in [1]. The transconductors can leverage the stochastics of actual current flow in transistors to create efficient dynamical systems that utilize amplified thermal noise in these transistors to emulate stochastic quantum behavior.

We can also compose novel quantum-inspired dynamical systems using interacting quantum admittance, quantum transadmittance, quantum mixer and h capacitor elements to create arbitrary quantum or quantum-inspired dynamical systems. One such system is a classic quantum two-state system, such as is seen in NMR (B-field-controlled dynamical transitions between two spin states) or in optical atomic systems (light-controlled dynamical transitions between two atomic states at different energy). The deep mathematical relations between quantum fluctuations and dissipation in such two-state systems can also be efficiently emulated.

Distributed quantum systems such as those obeying Schroedinger's equation can be emulated by several quantum admittance and transadmittance circuits with appropriate values and nearest-neighbor coupling to create traveling-wave behavior. Circuit elements can be composed to create distributed traveling-wave systems with novel and less-well-known behavior as well. As an example, we describe how a 'Quantum Cochlea' can be composed using all of our four circuit building blocks. The Quantum Cochlea mimicks the biological cochlea to do highly efficient broadband quantum spectral analysis via traveling-wave nearest-neighbor coupling of quantum admittance, quantum transadmittance mixer and capacitive h elements in an exponentially tapered transmission-line architecture. It provides amplitude and frequency information about its input from the spectral resonance of its component quantum admittance, mixer, and transadmittance circuit parts; but, it also uses novel probability measurement and pattern-recognition circuits to enhance the spectral resolution to be better than that possible by purely-quantum operation alone. The Quantum Cochlea does not require infinite Q to operate, a bottle neck in the experimental realization of prior quantum spectrum analyzers.

We describe how novel parametric amplification and probability-measurement circuits can be utilized for creating probability-amplitude control and measurement architectures in transconductor-capacitor systems. Such adaptive feedback loops can effectively implement probability normalization of the voltage amplitude of the wave function as well as help with quantum state preparation and control.

The fundamental transconductor-capacitor building-block circuits operate with loss in actual physical systems, e.g., in transconductor-capacitor systems built with transistors. Adaptive feedback loops help balance loss with fine control and balance of instability and nonlinearity to create stable systems in practical implementations.

In general, our circuit instantiations of mathematical quantum Hamiltonians with Planck capacitors, quantum admittance, quantum transadmittance, and quantum transadmittance-mixer elements serve to both emulate and to understand quantum mechanics. They also help design revolutionary quantum-inspired circuits and quantum computational architectures that leverage nonlinear, stochastic, analog, or bio-inspired operation. Our approach has seven benefits that are not enabled by other approaches: 1) Since h is merely the value of a capacitor, we can change the $kT/\hbar$ ratio artificially to emulate quantum mechanics at room temperature rather than decreasing kT, the thermal energy to do so via a simple change of the value of our Planck capacitors; 2) Classical dynamical systems can inspire quantum dynamical systems and vice versa as in the example of the quantum cochlea leading to cross fertilization; 3) Non-linear classical systems can be mapped to analogous quantum dynamical systems, e.g., in representing non-independent particle transport in quantum particles in a solid lattice, as we show; 4) Hybrid quantum-classical systems, which are important in chemistry, systems on the verge of a quantum-classical transition, or synthetic physical systems with an inhomogeneous $\hbar$ that have mixed quantum and classical behavior in different spatial locations can be emulated; 5) We can emulate exponentially large Hilbert spaces in transistor systems on mm-scale integrated-circuit chips which are eminently feasible today. We also show how a linear scaling in the number of emulated quantum two-state systems with associated emulated quantum transadmittance mixers can help represent an exponential number of quantum tensor-product states in quantum systems, even if they are not all simultaneously accessible as in actual quantum systems. We show how to initialize and prepare such states in an efficient linear fashion via both classical inputs and emulated quantum inputs; 6) Emulated quantum systems can be read out non-destructively without collapsing superpositions as in natural quantum systems. We show an example where a quantum cochlea can be used to provide sensitive spectral readout of a quantum superposition with resources that scale linearly rather than quadratically in the precision of such readout; 7) Our approach can tackle hard computational problems that exploit both deterministic quantum tunneling as well as stochastics to avoid local minima, in learning and computation, simultaneously emulating the stochastics of measurement via the use of existing or amplified white noise already inherent in physical transistor circuits. Thus we create new innovations for quantum analog, stochastic, and bio-inspired computation; fast quantum emulation and quantum-inspired computation; quantum circuit design; and quantum computer aided circuit design.

These and still other advantages of the invention will be apparent from the detailed description and drawings. What follows is merely a description of some preferred embodiments of the present invention. To assess the full scope of this invention the claims should be looked to as these preferred embodiments are not intended to be the only embodiments within the scope of the claims The claims of this invention focus on two-state and discrete-state dynamical systems that are essential in the emulation of all quantum dynamical systems.

DETAILED DESCRIPTION

Figure 1:
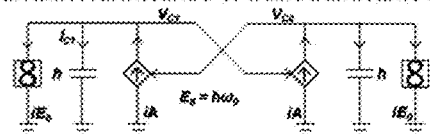
FIG. 1 illustrates how the equations for a quantum two-state system can be mapped exactly to analog circuits with novel complex signal variables and circuit elements that have no classical equivalents using probability-amplitude voltages, energy-flow currents, quantum admittances, quantum transadmittances, and capacitors of value equal to Planck's constant.

FIG. 1 begins illustrates how mathematical dynamics that govern quantum Hamiltonians can be mapped to analog circuit motifs, which are useful for their design, analysis, and emulation. Here, by dividing both sides of the equation by i, a two-state Hamiltonian, which is at the core of how many atomic, optical, and spin quantum systems function, is mapped to an equivalent analog circuit. The resulting probability-amplitude voltages $V_{c1}$ and $V_{c2}$, reactive energy-flow currents $I_{c1}$ and $I_{c2}$, two-terminal quantum admittance element (an admittance takes the ratio of current/voltage) with a squiggly '8', and three-terminal diamond quantum transadmittance elements (cross-current/voltage) then generate a quantum circuit that has no direct classical equivalent. The value of $\hbar$ is simply the value of the capacitor in the circuit; the quantum transadmittance appears to behave somewhat like a 'transcapacitance' with no classical equivalent. Moving the voltages, $V_{C1}$ and $V_{C2}$ up and down together in synchrony as a common-mode voltage $V_C$ reveals that the $iE_0$ and $iA$ currents oppose each other exactly such that a common-mode 'eigencircuit' with an effective $i(E_0-A)$ admittance eigenvalue results. Moving the voltages, $V_{C1}$ and $V_{C2}$ together in differential anti-synchrony reveals that the $iE_0$ and $iA$ currents add to each other exactly such that the differential-mode eigencircuit with an effective $i(E_0+A)$ admittance eigenvalue results. Furthermore, the equations lead to two simple circuit theorems in a very straightforward fashion: Probability conservation in this closed quantum system (the quantum admittances have no real parts) implies that the sum of the $\hbar$ capacitor energies (represented by <V/V>) is a constant. Energy conservation implies that the sum of the power flows in the two capacitors (represented by <V|I>) is a constant. It is the power flows that lead to quantum entanglement with different constants of power flow in different eigenmodes, and energy and power flow conservation constraints leading to correlated changes in variables. As the coupling factor expressed by the transadmittance A varies, root-locus feedback plots [1] show the split in the eigenvalues in FIG. 1.

The $i^2=-1$ in quantum mechanics often causes classical positive-feedback loops to map to quantum negative-feedback loops, e.g., classical mutual-inductance coupled resonators have highly analogous mathematical formulas to the quantum two-state systems in FIG. 1 except for the sign of their feedback loop transmission. Quantum feedback loops are actually simpler to analyze because complex eigenvalues at $+i\omega$ and $-i\omega$ can each be separately analyzed with each eigenvalue representing the energy of one oscillation mode. In contrast, paired complex eigenvalues have to be analyzed together in the classical case with a pair of eigenvalues representing the energy of one oscillation mode. Dissipative and reactive measurement currents and admittances are reflected via 'conjugate back action' in such feedback loops, which are analogous to 'loading' of the quantum circuit by the measurement admittances and can lead to correlations and quantum entanglement. Back action can be represented by 'reflected admittances' that can alter the unloaded circuit, both in its dynamical and probabilistic or stochastic behavior. Such effects are extremely hard to efficiently account for in mathematical signal-processing-based emulations of quantum mechanics that do not take flows, noise, energy conservation, probability conservation and loading into account automatically as circuits do.

In contrast, the currents and voltages of a circuit inseparably link state and the flows that cause it, thus making circuit-based formulations and emulations of quantum mechanics, potentially powerful as FIG. 1 shows. However, given that the quantum circuit elements of FIG. 1 have no classical circuit equivalents, that terms that we have invented like 'quantum admittance' or 'quantum transadmittance' are not even known words or concepts in decades-old fields of circuit theory or quantum mechanics, that $\hbar$ does not have the right units to be a 'Planck capacitor', and that probability amplitude is not a voltage, it is completely non-obvious that any of invented diagrams of FIG. 1 would actually be useful or practical. This invention shows, in part, how to utilize these concepts in a practical fashion such that they can actually lead to completely new circuits, systems, and architectures that emulate quantum and quantum-inspired systems efficiently.

Figure 2A:
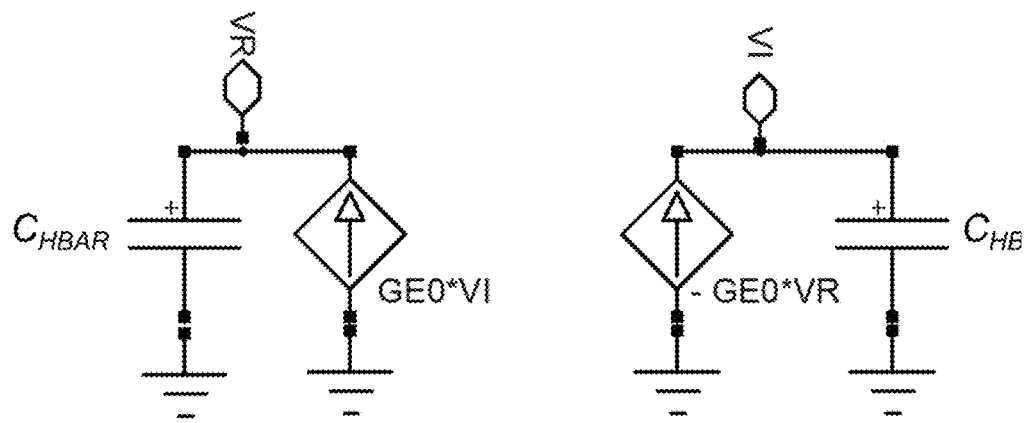
FIG. 2A illustrates how to exactly emulate a quantum admittance element with classical transconductor-capacitor circuits that have real and imaginary variables coupled to each other in a negative-feedback loop.

FIG. 2A shows how to make the concept of a quantum admittance practical in a classical embodiment. Since the probability amplitude is represented by its real and imaginary parts, we may map it to $V_R$ and $V_I$ respectively, i.e., $V_C = V_R + iV_I$. Then, complex current flows of $-iE_0V_C$ onto a $\hbar$ capacitor naturally map to two coupled-transconductor circuits interacting with the Planck $C_{HBAR}$ capacitors as shown in FIG. 2. The value of $E_0$ is mapped to a transconductance $G_{E0}$. Note that, if $E_0$ is positive and real, the imaginary voltage causes a positive real current that increases $V_R$ while the real voltage causes a negative imaginary current that decreases $V_I$. If $E_0$ is negative and real, the magnitude of $E_0$ still maps to a transconductance $G_{E0}$ but the imaginary voltage then causes a negative real current that decreases $V_R$ while the real voltage causes a positive imaginary current that increases $V_I$. As a result, quantum admittances naturally lead to a negative-feedback loop involving two coupled transconductor-capacitor integrators with an eigen-frequency of oscillation of $-G_{E0}/(2\pi C_{HBAR})$ if $E_0$ is real and positive and an eigen frequency of $+G_{E0}/(2\pi C_{HBAR})$ if $E_0$ is real and negative.

In our circuit formulation, any two quantum variables in a feedback loop interact such that they cannot be independently specified. Any necessarily stochastic (due to the postulates of quantum mechanics) measurement back action due to the measurement being part of a larger conservative Hamiltonian system will cause back currents that affect both interacting variables. The real and imaginary parts will also naturally be in quadrature in our circuit, i.e, in the case of $E_0$ being positive, with $V_I$ being a cosine waveform and $V_R$ being a sine waveform, the sum of their squares is a constant related to the amplitude of the oscillation. If two variables are correlated as any two variables in an interacting feedback loop will be, the product of their variances has a minimum related to such correlation. It is well known that the real and imaginary parts of a quantum wave function are subject to an uncertainty principle. It is also well known that the two phase quadratures of a photonic oscillation mode are subject to an uncertainty principle. Finally, since the current and voltage into each of the $C_{HBAR}$ capacitors are correlated, there is an uncertainty principle between the current and voltage variables at each node as well. Our circuit naturally and compactly emulates these relations. In fact, a simple noise voltage source located at the ground of the $C_{HBAR}$ capacitors (a noisy ground), which can be implemented via a digitally programmed pseudo-random-noise generator or from an amplified analog thermal noise source (including within transistors already existing in integrated circuits that are used for quantum emulation) can emulate zero-point fluctuation in an oscillatory mode easily and be consistent with uncertainty relations between $V_R$ and $I_R$ (the current into the capacitor at the $V_R$ node) or between $V_I$ and $I_I$ (the current into the capacitor at the $V_I$ node).

Our quantum-admittance circuit can even represent 'quantum squeezed states' wherein $V_I$ and $V_R$ are not symmetric because either or both of the $G_{E0}$ transconductors or the $C_{HBAR}$ capacitors are not equal in FIG. 2A. Thus, neither the oscillatory amplitudes of $V_I$ and $V_R$ nor their variances need be equal at the oscillator's eigenfrequency, given now by $E_0/\hbar = \sqrt{(G_{E0R}G_{E0I})}/\sqrt{(C_{HBAR\_R}C_{HBAR\_I})}$ with the oscillatory amplitudes in the ratio $V_I/V_R = \sqrt{(G_{E0R}/C_{HBAR\_R})}/\sqrt{(G_{E0I}/C_{HBAR\_I})}$. The unequal correlation between $V_I$ and $V_R$ when $V_R$ varies, versus between $V_R$ and $V_I$ when $V_I$ varies leads to the squeezing with more variance in one variable versus another.

The controlled transconductors have opposite signs on their control inputs in FIG. 2A regardless of the sign of $E_0$. Thus, even when there is no asymmetry in $G_{E0}$ or $C_{HBAR}$ at real or imaginary nodes, the correlations between $V_R$ and $V_I$ when one or the other varies have opposite sign such that the variables may be said to be non-commutative.

Figure 2B:
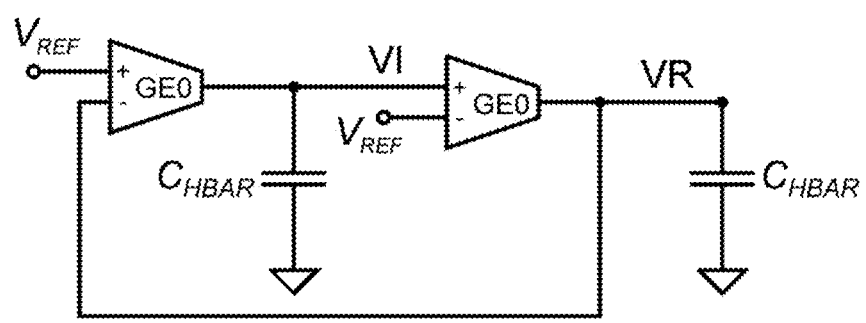
FIG. 2B illustrates how electronic differential transconductors can practically implement such transconductor-capacitor circuits.

FIG. 2B shows how to map the emulated quantum-admittance circuit of FIG. 2A to differential transconductor circuits, wherein the voltages are all referenced to $V_{REF}$, a voltage between the power-supply rails of $V_{DD}$ and ground respectively.

Figure 3:
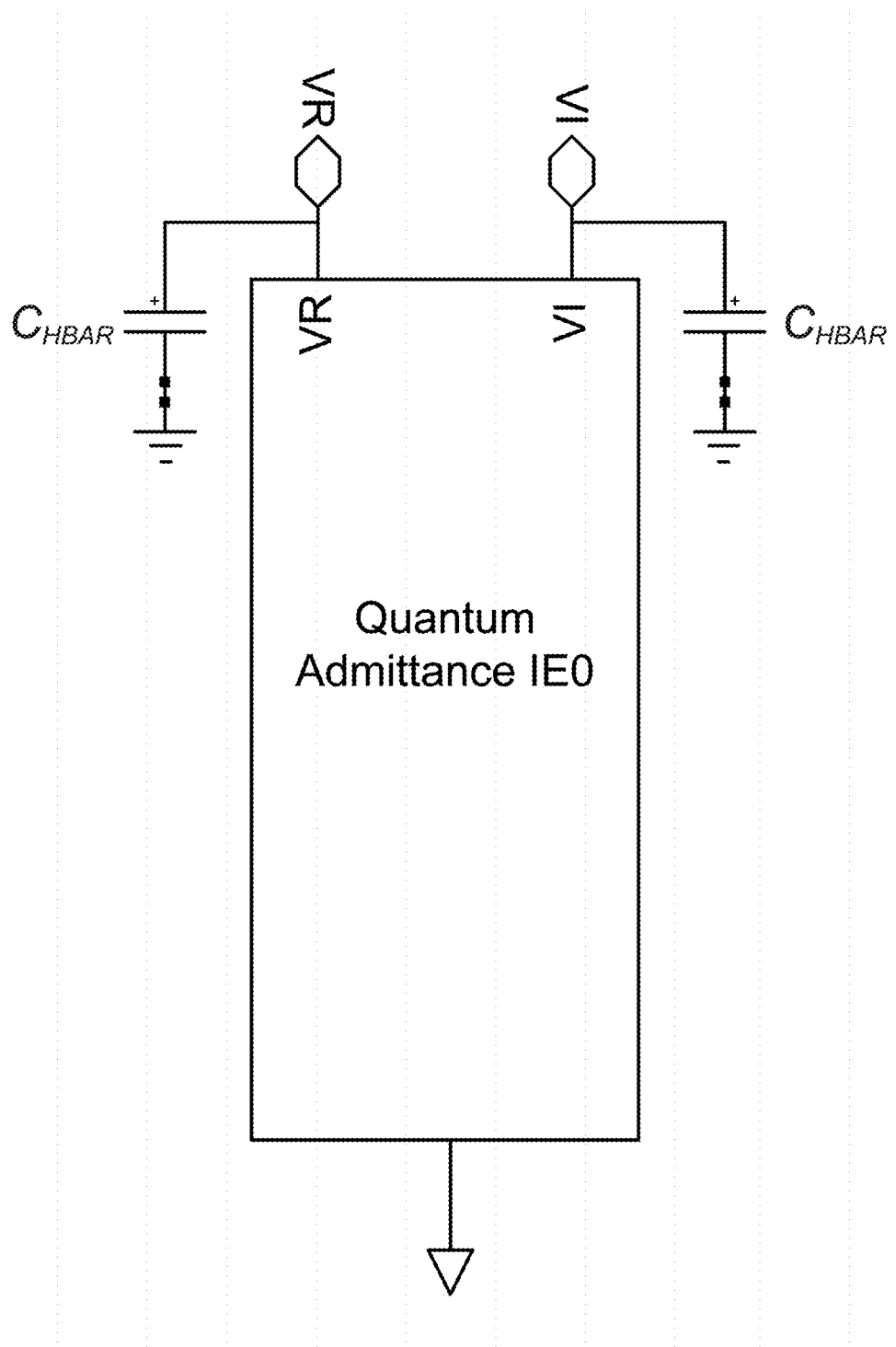
FIG. 3 shows a schematic symbol for an emulated quantum admittance element, which is typically always used with the $C_{HBAR}$ Planck capacitors connected to it.

FIG. 3 shows a classical circuit symbol for representing an emulated quantum admittance, along with the Planck capacitors that it is connected to. We shall use this symbol extensively as a short hand when we discuss more complex systems emulated with quantum admittances including for quantum systems with many state variables, i.e, for vector quantum states.

Figure 4:
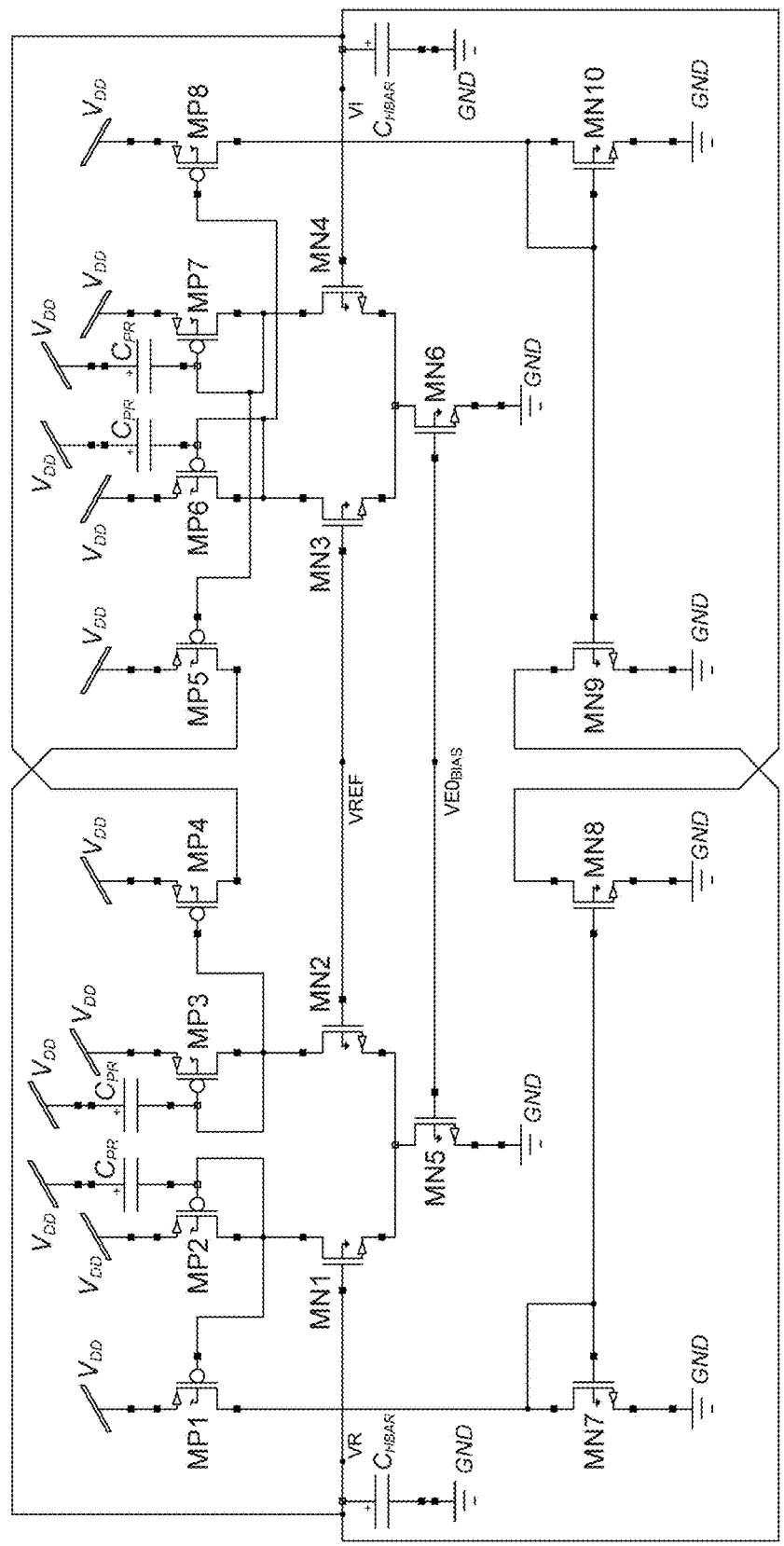
FIG. 4 shows an electronic transistor embodiment of an emulated quantum admittance element.

FIG. 4 shows a practical 18-transistor electronic circuit embodiment of FIG. 2B for emulating a quantum admittance along with the $C_{HBAR}$ capacitors that it is connected to. The transistors MN1, MN2, and MN5 form the differential pair of the $G_{E0}$ transconductor attached to $V_R$ as do MN3, MN4, and MN6 for the one attached to $V_I$. MP2 and MP3 as well as MP6 and MP7 serve as diode loads that steer the differential-pair output currents, biased from MN5 and MN6 respectively, towards the appropriate $V_I$ or $V_R$ variables respectively. The MP2-MP1, MP3-MP4, MP7-MP5, MP6-MP8, MN7-MN8, and MN10-MN9 pairs serve as current mirrors that convey these currents, with appropriate sign flips for positive or negative control. The $V_{REF}$ bias sets the d.c. reference while the $VE0_{BIAS}$ voltage determines the bias current and consequently the $G_{E0}$ transconductance value of the emulated quantum admittance.

The $C_{PR}$ capacitors may be parasitically determined by the source-to-gate capacitances of the mirror transistors. But, they can also be intentionally introduced to control the oscillatory amplitude (as we describe in depth later) of the quantum state. Thus, some embodiments may carry these capacitors and some may not.

One useful generalization of quantum-admittance emulations arises from FIGS. 2 and 4: Suppose the left transconductor in FIG. 2B has a wide linear range of operation, e.g., via a well-known subthreshold circuit [1], and the right transconductor in FIG. 2B has a narrow tan h linear range of operation. Using well-known formulas for the derivatives of hyperbolic and inverse hyperbolic functions, the transconductor with the tan h-like behavior will exhibit an incremental transconductance that behaves like $1/(1-x^2)$ where $x=1$ represents the absolute highest output current of the transconductor, and x is the output current or derivative change of the transconductor's output voltage on a Planck capacitor, i.e., analogous to the velocity or rate of change of the voltage. Since the linear transconductor does not saturate and slew, its incremental transconductance remains constant with signal level. Hence the overall transconductance of the emulated quantum admittance, which is given by the square-root of the two incremental transconductances has a $1/\sqrt{(1-x^2)}$ dependence. Since x is analogous to velocity, such behavior manifests as a quantum oscillation with a linear spring and a relativistic mass, with $x=1$ corresponding to the speed of light. Thus, our emulated quantum admittance is useful in both non-relativistic and relativistic emulations of quantum mechanics.

Figure 5:
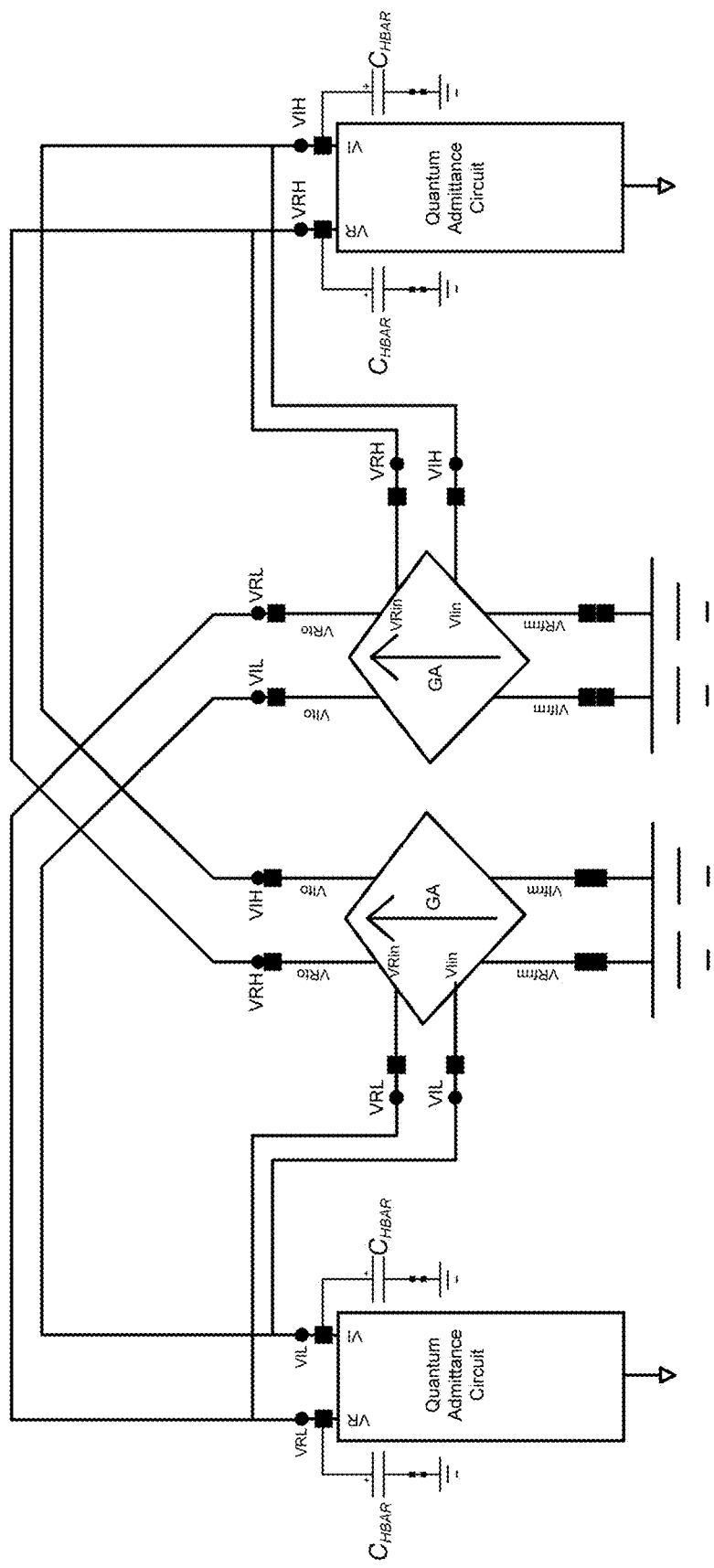
FIG. 5 shows that the emulation of quantum transadmittances requires that complex voltage variables from one state variable control transconductance currents that are directed towards another variable such that quantum transadmittances can couple quantum admittances and emulate a quantum two-state system.
Figure 6:
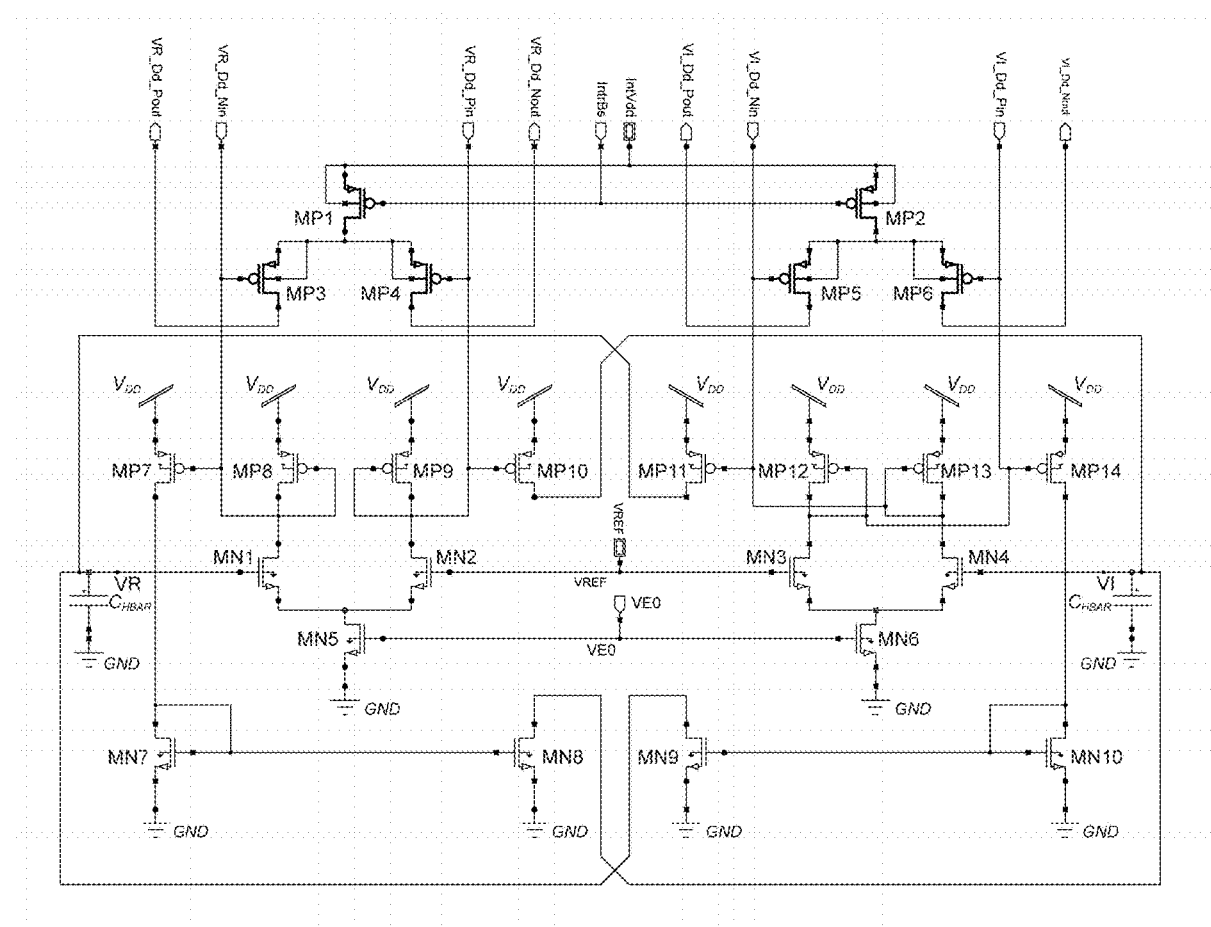
FIG. 6 shows that by sharing existing circuitry already created for emulating a quantum admittance, the classical emulation of a quantum transadmittance can be fairly efficient and only a few extra transistors.

FIG. 5 shows how quantum transadmittance coupling represented in FIG. 1 by the iA symbols can be emulated by classical transadmittance circuits with real and imaginary variables just as described for the emulated quantum admittance circuits. The figure shows a classic circuit that is an exact emulation of the quantum circuit shown in FIG. 1. The complex control voltages from one emulated quantum variable direct the output currents of the transadmittances to another emulated quantum variable with transconductance $G_A$. Other than that $G_A$ behaves just like $G_{E0}$. That is, the iA term in FIG. 1 maps to a $G_A$ transconductance exactly as the $iE_0$ term maps to a $G_{E0}$ transconductance. However, there is no need to replicate a lot of redundant circuitry that already exists in the emulated quantum admittance circuits in electronic implementations: FIG. 6 shows that, with just 3 more transistors MP5, MP6, and MP2, we can couple VI in one quantum admittance to VR in another by hooking the drain outputs of MP6 and MP5 in one emulated quantum admittance to the diode inputs of MP8 and MP9 in another quantum admittance (not the one shown but the one that the transadmittance couples to as in FIG. 5). Similarly, with just 3 more transistors, MP3, MP4, and MP1, we can couple VR in one quantum admittance to VI in another by hooking the drain outputs of MP3 and MP4 to the diode inputs of MP13 and MP12 in the other quantum admittance. By reciprocity, 6 more transistors in the other quantum admittance will couple back to this quantum admittance as well. The signs of the coupling (iA versus −iA) are determined by whether we connect the positive drain outputs to the negative diode inputs or the positive diode inputs in FIG. 6. Thus, with just 12 more transistors, the circuit of FIG. 5 can couple two emulated quantum states to one another, with 6 transistors for one transadmittance coupling and 6 transistors for another transadmittance coupling. The strength of the coupling w.r.t. $E_0$ is determined by the interaction bias, shown as IntrBs in FIG. 6. While this embodiment for the transadmittance uses a separate IntVdd rather than the same power-supply $V_{DD}$ for the emulated quantum admittance, anyone with ordinary skill in the art could imagine at least 10 more embodiments that accomplish the same function. For example, we could recreate whole new transconductors (inefficient); or use mirrored copies of the currents in MP8, MP9, MP12, and MP13 and a current multiplier to adjust the strength of coupling. Our embodiment is shown because it is efficient. It illustrates that any transadmittance coupling that senses a signal proportional to $V_I/V_R$ in one emulated quantum state and couples a current of $G_A V_I$/−$G_A V_R$ to the other state will emulate a quantum transadmittance element. The sign of $G_A$ can be negative and will decide whether we couple to (+,−) or (−,+) terminals in differential implementations such as the ones shown here.

Figure 7:
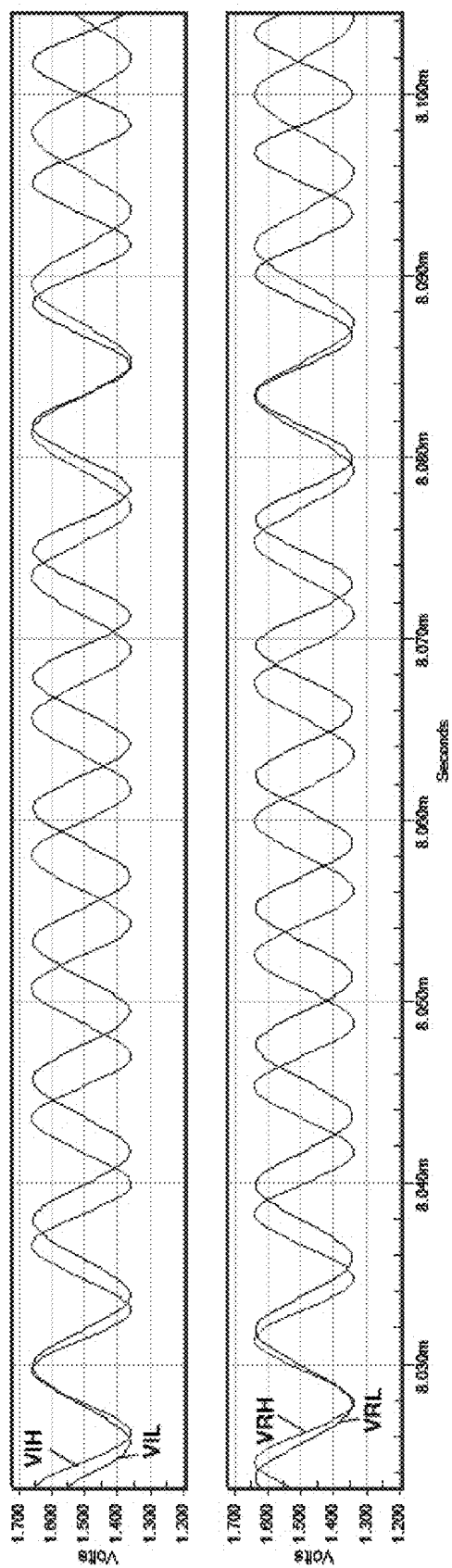
FIG. 7 illustrates the dynamics of two emulated quantum admittances coupled to each other via emulated quantum transadmittances.

FIG. 7 shows that transadmittance coupling can lead to a gradual oscillatory shuttling of energy between in-phase and out-of-phase eigenmodes with different energy. As FIG. 1 shows, such behavior is predicted by quantum mechanics: In a quantum two-state system, $E_0$−A and $E_0$+A eigen-frequency oscillations with [1, 1] or [1,−1] eigenmodes result if A is negative; the eigenmodes flip sign if A is positive. Note that probability and energy are conserved in FIG. 7 as energy shuttles between the sum and difference eigenmodes in the electronic transistor emulation of FIG. 7. Note also that VIH always leads VRH by 90° and similarly VIL always leads VRL by 90° as would also be expected from the equations of an emulated quantum admittance element with $E_0$ positive (the sign we have chosen for this illustration). FIG. 1-7 illustrate that a ~50-transistor emulation of the complete coupled two-state system shown in FIG. 5 is possible. This emulation was intentionally architected by operating transistors mostly in the exponential subthreshold regime of operation where a wide dynamic range of transconductance change and scale-invariant operation can be achieved with modest voltages. However, subthreshold operation, while beneficial, is not essential or enabling for any of our inventions.

Figure 8:
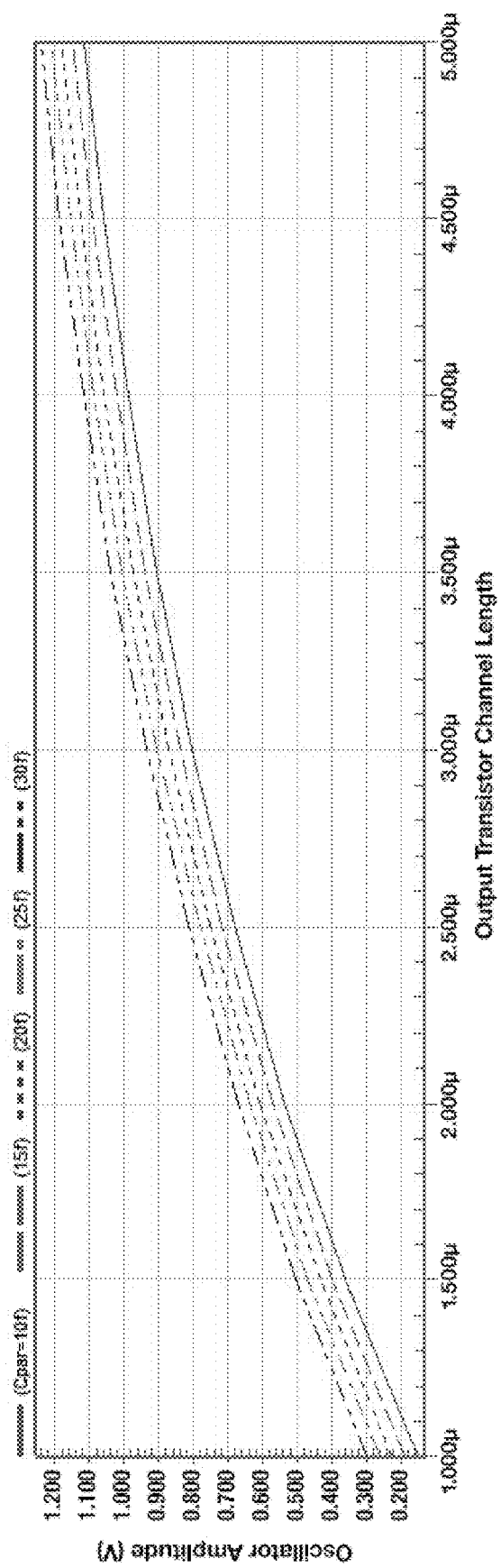
FIG. 8 illustrates that the oscillatory amplitude of an emulated electronic quantum admittance can be controlled by changing the effective d.c. gain of the electronic transconductors used to create it.

FIG. 8 illustrates that the oscillatory amplitude of our emulated electronic quantum admittance can be controlled by changing the effective d.c. gain of the electronic transconductors used to create it. Thus, as the output transistor channel length in the transconductors of an emulated quantum admittance is altered, oscillatory amplitude increases. Different parasitic capacitances also increase the size of the oscillatory amplitude.

Figure 9:
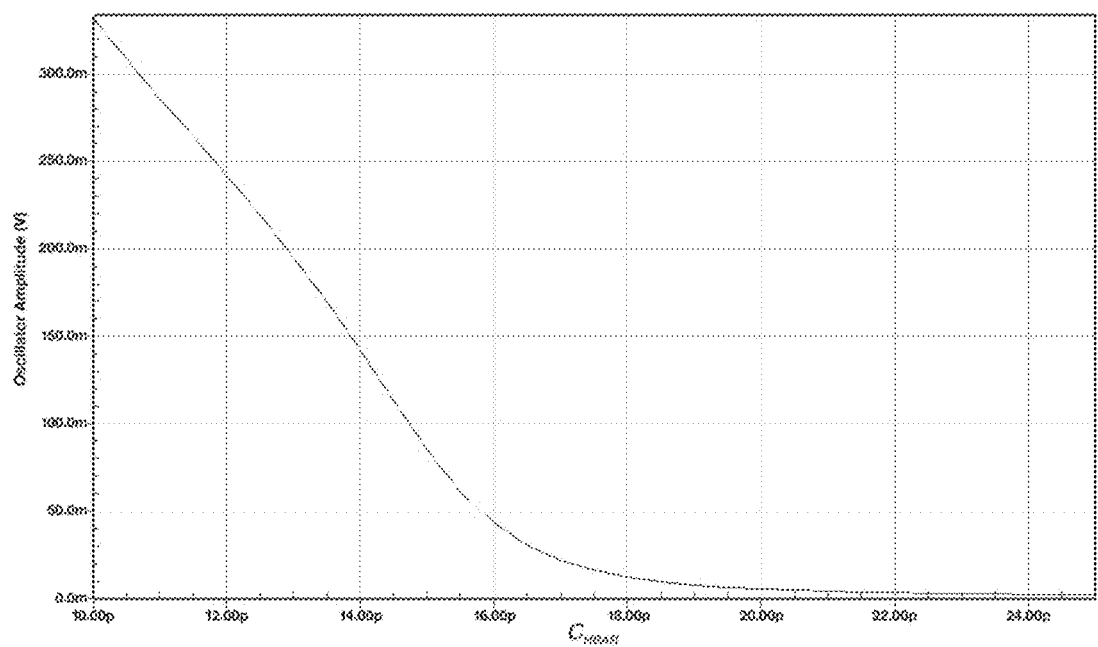
FIG. 9 illustrates that the value of the Planck capacitor can also control the oscillatory amplitude of the quantum admittance.

FIG. 9 illustrates that the value of the Planck capacitor can also control the oscillatory amplitude of the quantum admittance. There is a minimum Planck capacitance after which, the transconductors will not create an oscillation unless $C_{par}$ is increased to provide additional phase margin in the emulated quantum-admittance negative-feedback loop.

Figure 10:
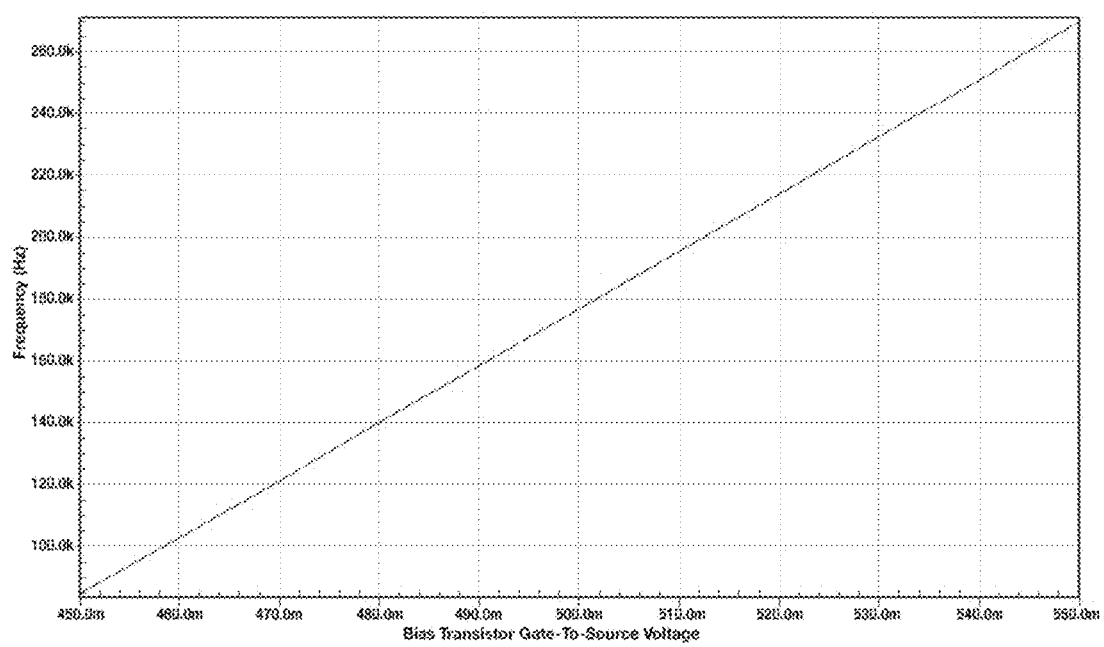
FIG. 10 illustrates that a subthreshold nFET bias transistor gate-to-source voltage can vary the oscillation frequency of an emulated quantum admittance as it varies the bias current of the transconductors used to create it.

FIG. 10 illustrates that a subthreshold nFET bias transistor gate-to-source voltage (VE0$_{BIAS}$ in FIG. 4) can vary the oscillation frequency of an emulated quantum admittance as it varies the bias current of the transconductors used to create it. For this particular embodiment, the quantum emulation is at ultrasonic frequencies.

Figure 11:
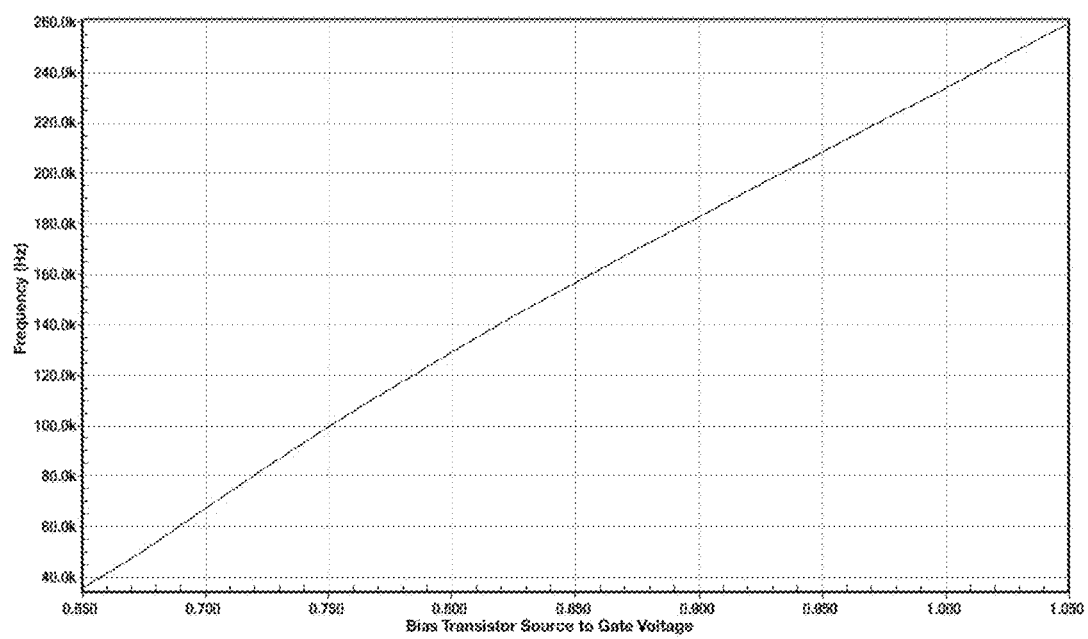
FIG. 11 illustrates that a subthreshold pFET bias transistor source-to-gate voltage can vary the oscillation frequency of an emulated quantum admittance as it varies the bias current of the transconductors used to create it.
Figure 20A:
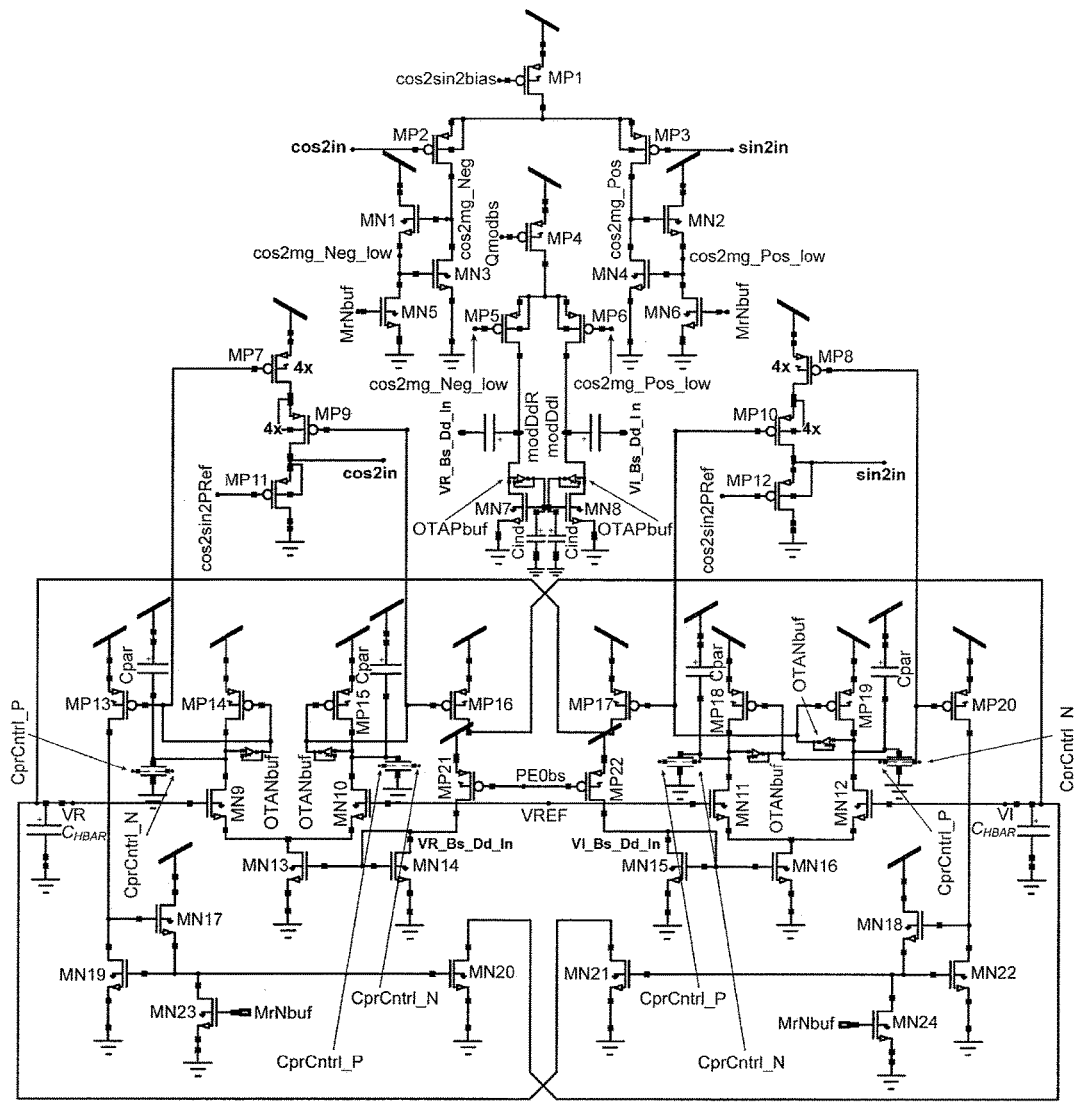
FIG. 20A illustrates an electronic transistor circuit that can be used with an emulated quantum state at eigenfrequency $\omega$ to create $\cos^2 \omega t$, $\sin^2 \omega t$, $\cos^2 \omega t$, and $-\cos 2\omega t$ signals, all of which are useful for measuring probability or for architecting parametric amplification or attenuation via positive or negative feedback to control the oscillatory amplitude of the state, and in general for quantum control of one admittance or state by another.

In some embodiments, it is more convenient to use a source-to-gate voltage on a subthreshold pFET transistor to vary the bias currents in transistors. For example, FIG. 20A shows a PE0bs voltage for this purpose. FIG. 11 illustrates that a subthreshold pFET bias transistor source-to-gate voltage can vary the oscillation frequency of an emulated quantum admittance as it varies the bias current of the transconductors used to create it as well.

Figure 12:
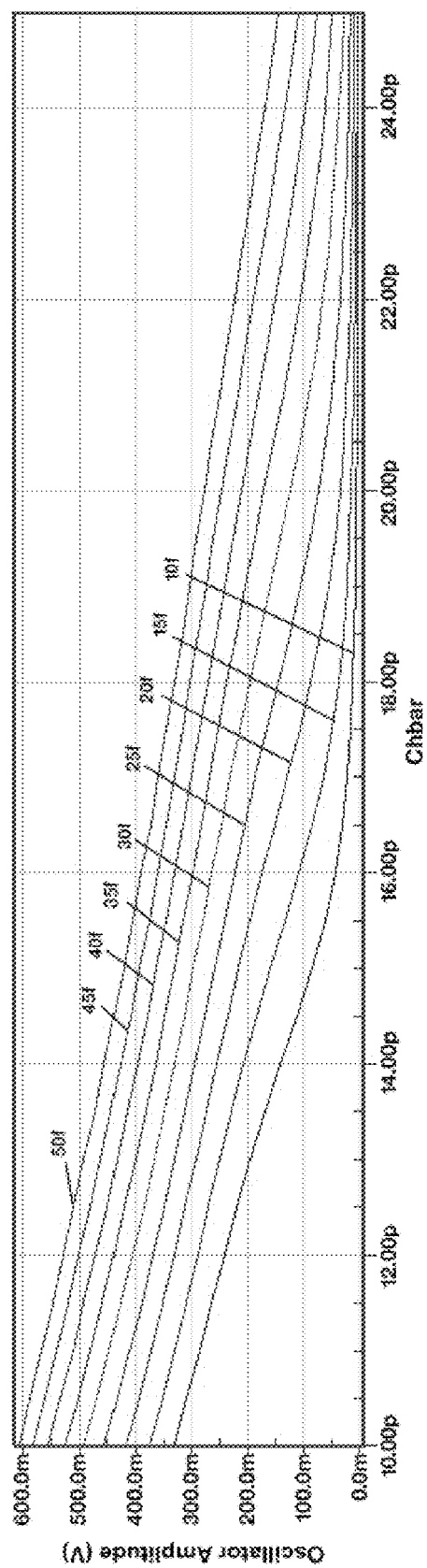
FIG. 12 illustrates that the value of the Planck capacitors as well as parasitic capacitances within the transconductors can vary the oscillatory amplitude of the quantum admittance over a wide range of values.

FIG. 12 illustrates that the value of the Planck capacitors as well as parasitic capacitances within the transconductors ($C_{PR}$ in FIG. 4) can vary the oscillatory amplitude of the quantum admittance over a wide range of values.

Figure 13:
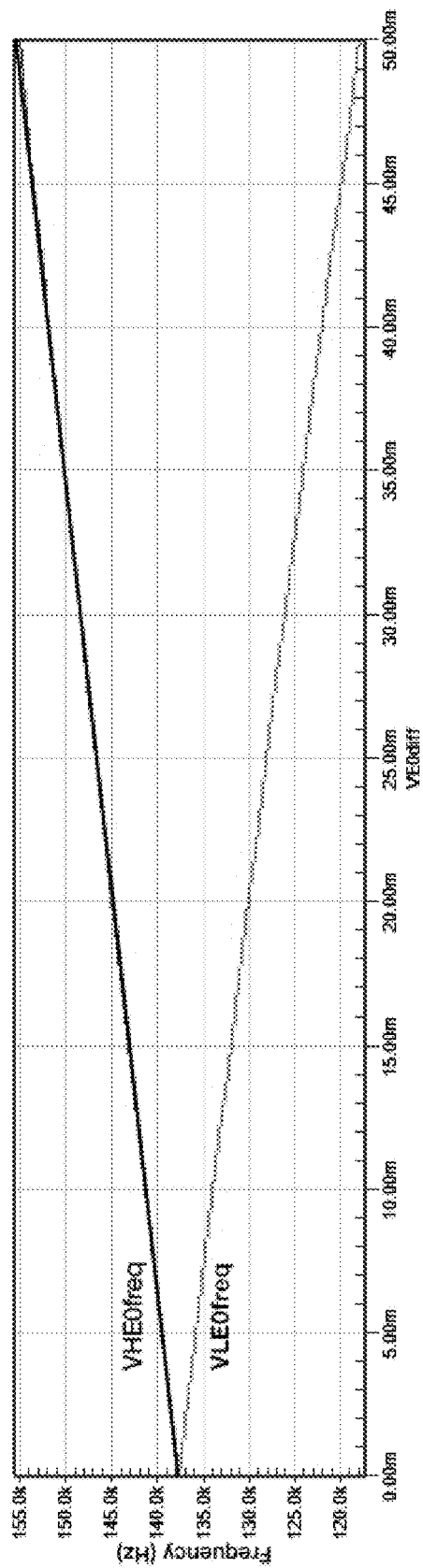
FIG. 13 illustrates that a differential bias voltage in a differential pair transistor current can conveniently arrange the oscillation frequency of one quantum admittance to go up while that of another goes down, thus providing a compact means for controlling the energy levels and oscillation frequencies of two emulated quantum states.

FIG. 13 illustrates that a differential bias voltage in a differential pair transistor current can conveniently arrange the oscillation frequency of one quantum admittance to go up while that of another goes down, thus providing a compact means for controlling the energy levels and oscillation frequencies of two emulated quantum states simultaneously. In particular, such a bias scheme can architect an energy difference in the two states of emulated quantum two-state systems, useful in several applications including Josephson-junction emulation.

Figure 14:
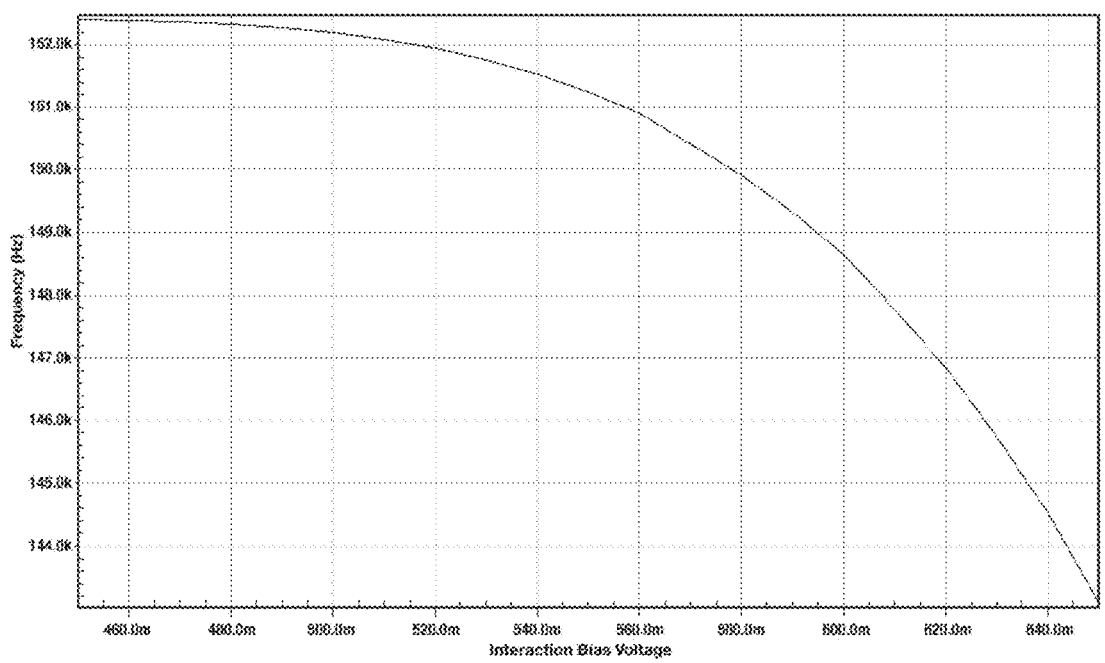
FIG. 14 illustrates that the coupling of emulated quantum states via control of transadmittance bias voltage strengths can sensitively affect the eigenfrequency of coupled oscillation in an exponential fashion as would be expected in the exponential subthreshold regime of transistor operation.

FIG. 14 illustrates that the coupling of emulated quantum states via control of transadmittance bias voltage strengths can sensitively affect the eigenfrequency of coupled oscillation in an exponential fashion as would be expected in the exponential subthreshold regime of transistor operation.

Figure 15:
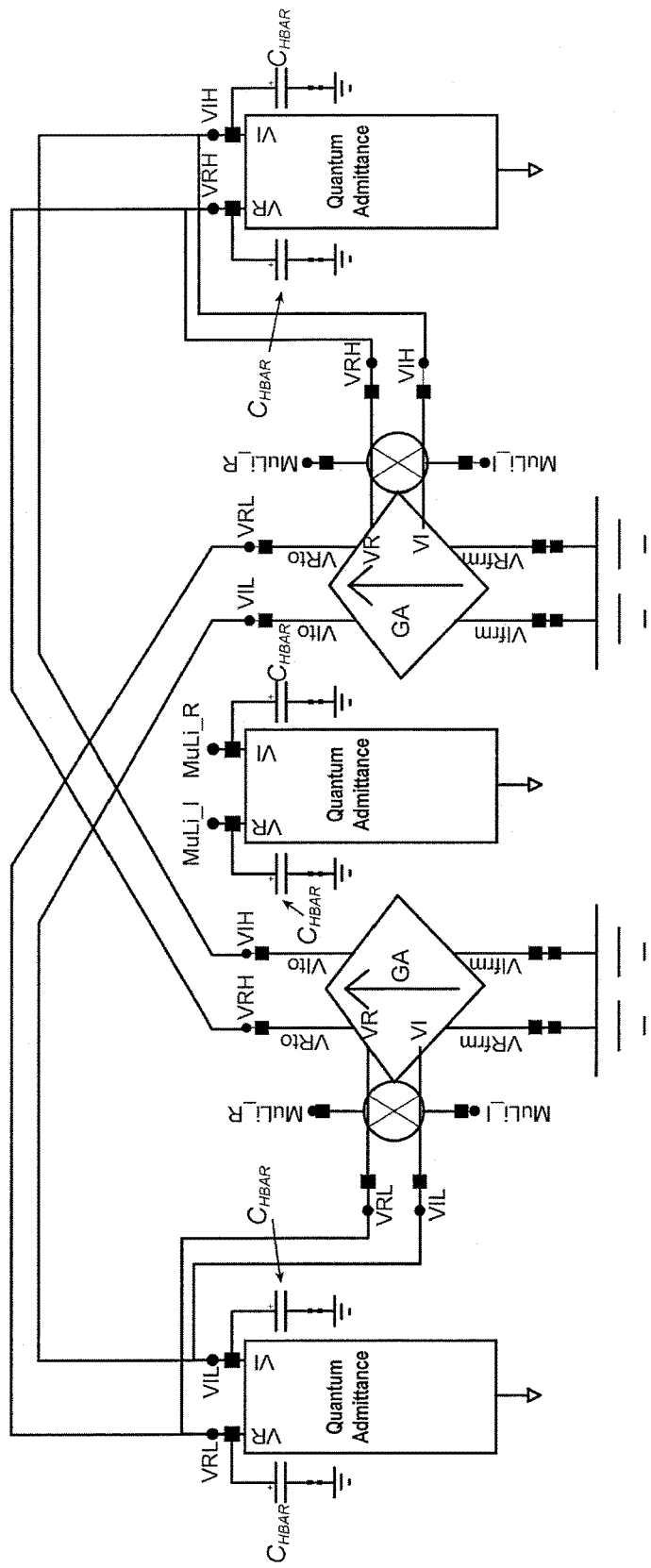
FIG. 15 illustrates raising and lowering emulated quantum transadmittance mixer elements that couple quantum states at different energies to one another via a control input at a frequency resonant or nearly resonant with the energy difference between the quantum states.
Figure 43A:
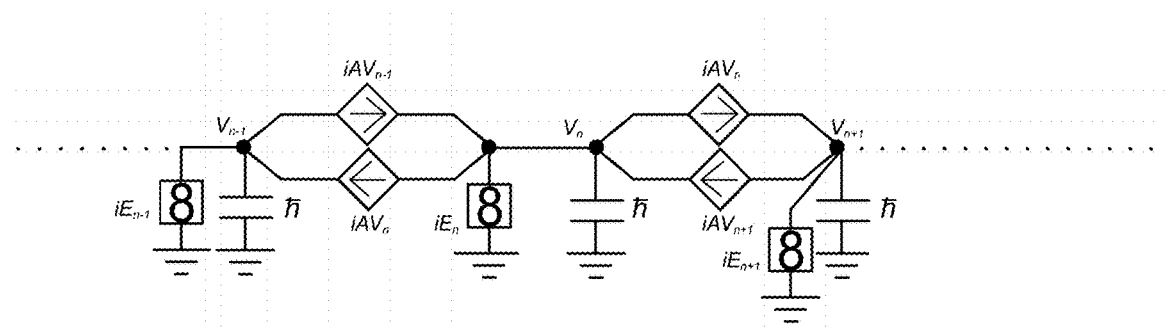
FIG. 43A shows that other examples of traveling-wave systems besides the quantum cochlea, in this case, the Schroedinger equation, can be emulated by nearest-neighbor quantum admittance and transadmittance circuits.
Figure 43B:
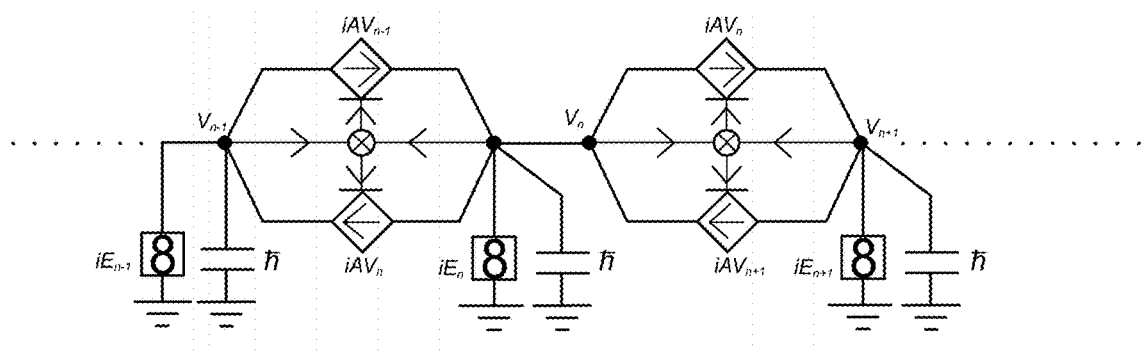
FIG. 43B shows how multi-input and nonlinear quantum transadmittance circuits can implement effects such as the inhibition of a quantum particle's transport in a traveling-wave quantum system by the presence of a strong probability amplitude at a neighboring location, e.g., due to electron-electron repulsion caused by the motion of many simultaneous electrons in the lattice.

Although we have mostly emphasized simple linear coupling, the use of linear and nonlinear classical electronic circuit elements that emulate quantum systems naturally affords one opportunities to explore obvious generalizations. Such generalizations may be useful in quantum-inspired systems as well as in actual quantum systems where multi-particle interactions, electrostatic charge feedback and screening, fast relativistic electron motion, and other effects require more sophisticated coupling. We discuss a few generalizations of our transadmittance circuits that are helpful in this regard: 1) A saturating nonlinearity that maximizes the strength of quantum interaction is already present in our embodiment in FIG. 6 but any current-mode polynomial input-output function from well-known current-mode transistor circuits (e.g. see Chapter 14 or 24 in R. Sarpeshkar, *Ultra Low Power Bioelectronics*, Cambridge University Press, 2010) could process current to architect such interactions; 2) Floating transadmittances that source current from one location and sink it another can always be converted to two grounded transadmittance sources that symmetrically source current at one location and sink that exact same current at another; This well-known circuit trick is indistinguishable from that of a truly floating current source, which is harder to implement in actual electronics, though not in behavioral computer simulations. We have actually kept such flexibility intact always by arranging 'from' and 'to' terminals for the transadmittance currents shown in FIG. 5; The emulation of Schroedinger's equation (FIG. 43A) requires floating transadmittances to model the mass of a particle in a potential well, and noise emulations do as well (FIG. 30A with the grounded equivalent in FIG. 30B). Both can be implemented via two grounded source-sink transadmittances. 3) As we show later, emulations of transadmittance mixers, which are essential in quantum mechanics actually require two control inputs rather than one for a transadmittance (FIG. 15). But, there are other kinds of emulations that require multi-variable input control of the transadmittance that are not necessarily multiplicative but that could model a different modulation of the transadmittance, empirically or fundamentally. For example, FIG. 43B shows an example where multiple particles on a lattice can hinder quantum transport of other particles on the lattice near them. In such cases, it is useful to have the probability of a particle located at neighboring locations modulate the transadmittance coupling strength of the quantum particle of interest. Or, hybrid quantum-classical systems could benefit from having a classical variable modulate a parameter in a quantum system. It will be understood by those of ordinary skill in the art of analog circuits, that, our emulations, which can leverage the full linear and nonlinear power of sub-threshold voltage-mode and current-mode electronics, for example, as discussed extensively in Chapter 14 and Chapter 24 of R. Sarpeshkar, *Ultra Low Power Bioelectronics*, Cambridge University Press, 2010, could easily architect such generalized transadmittances by extending our core emulated quantum transadmittance.

FIG. 15 shows the emulated transadmittance mixer, which is very useful for coupling quantum states to each other via a control input. This circuit operates very similarly to that of FIG. 5. However, the mixer modulates the transadmittance current as well. The mixer multiplies its two complex inputs $(V_{R1}+iV_{I1})(V_{R2}+iV_{I2})$ such that the output currents from the transadmittance mixer are given from the equations of FIG. 1 by $-iG_A (iV_{R1}V_{I2}+iV_{R2}V_{I1})+iG_A(V_{R1}V_{R2}-V_{I1}V_{I2})$, i.e. by $+G_A(V_{R1}V_{I2}+V_{R2}V_{I1})$ for its real part and $-G_A(V_{R1}V_{R2}-V_{I1}V_{I2})$ for its imaginary part. If the sign of $G_A$ is negative, the real and imaginary parts, each flip their signs. Since all the quantum equations operate on the field of complex numbers, the complex multiplication is crucial for ensuring that real and imaginary parts are combined appropriately, or a circuit emulation will be unsuccessful. If the dynamics of a given quantum state is given by $e^{-j\omega t}$, for mixing to be effective in causing a resonant coupling, the mixing control input for raising a lower energy state to a higher energy state (negative complex exponential, $\cos(\omega_{res}t)-i\sin(\omega_{res}t)$) must be the complex conjugate of that for lowering a high energy state to a lower energy state (positive complex exponential, $\cos(\omega_{res}t)+i\sin(\omega_{res}t)$). We are essentially upmixing to cause a raising transition or downmixing to cause a lowering transition. Thus, the signs of the imaginary inputs to the complex mixers have to be different. The complex mixing input can itself originate from a complex quantum signal as it indeed does when light couples one atomic energy state to another. Thus, in FIG. 15, a separate quantum admittance that generates the mixing input signal is explicitly shown (analogous to explicitly showing the light field and the atomic energy states), though it can, implicitly be from another part of the quantum system as well. Usually, the mixing input is a small but not necessarily perturbative term in the energy Hamiltonian of the quantum dynamical system being emulated.

Our method of only using one but not both positive or negative complex exponentials for a given direction of coupling is particularly useful in physically emulated quantum systems that have loss. It enforces directionality and improves signal-to-noise ratio even if the loss is relatively high and therefore incapable of perfectly rejecting an out-of-band signal, as is often assumed in the rotating-wave approximation in completely non-lossy quantum mechanics.

Figure 16:
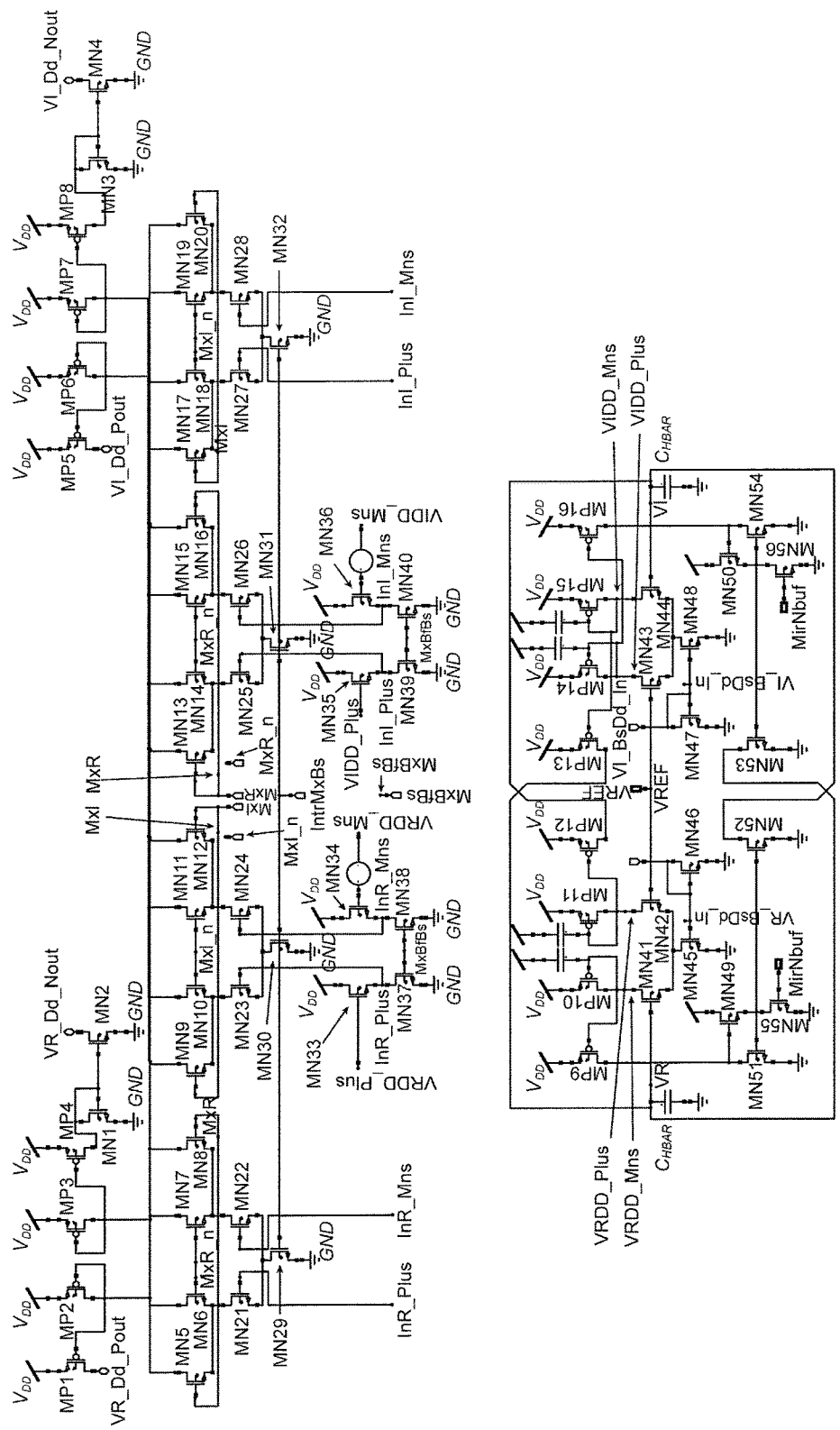
FIG. 16 illustrates how emulated quantum transadmittance mixer circuits can be created with electronic transistor circuits that appropriately multiply the real and imaginary parts of two differential input variables.
Figure 17:
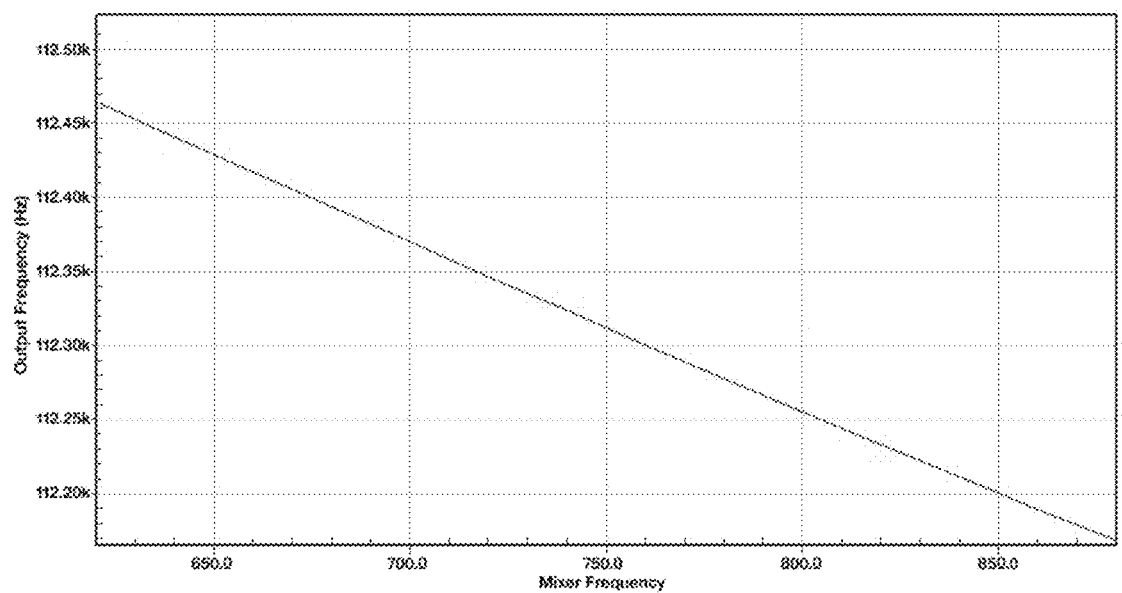
FIG. 17 illustrates how a control mixer input can effectively lower the output frequency of one quantum oscillatory state such that it is effective in coupling to another quantum state at a lower energy.
Figure 18:
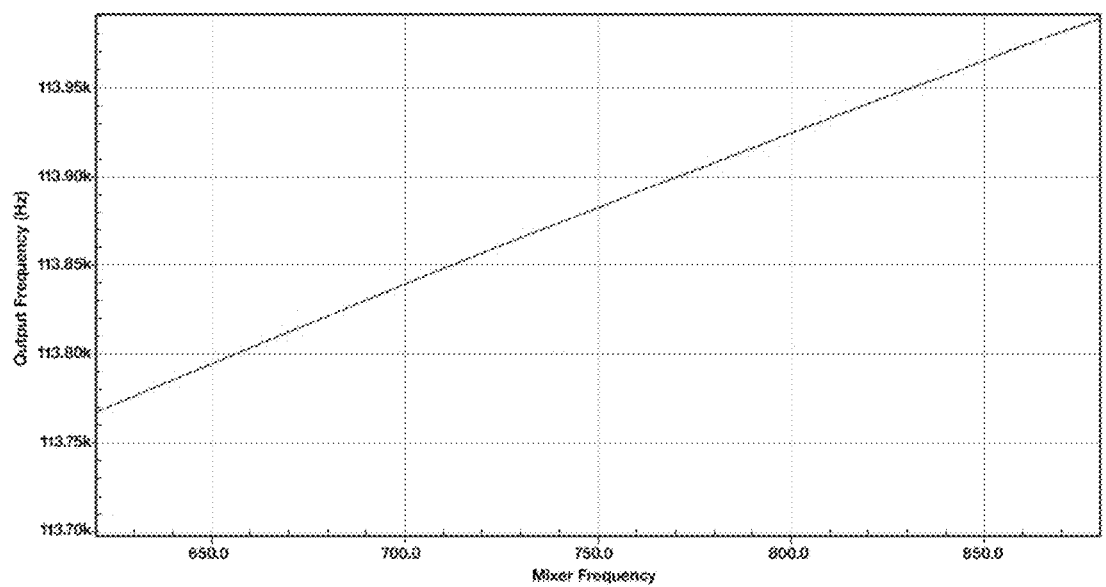
FIG. 18 illustrates how a control mixer input can effectively raise the output frequency of one quantum oscillatory state such that it is effective in coupling to another quantum state at a higher energy.
Figure 44:
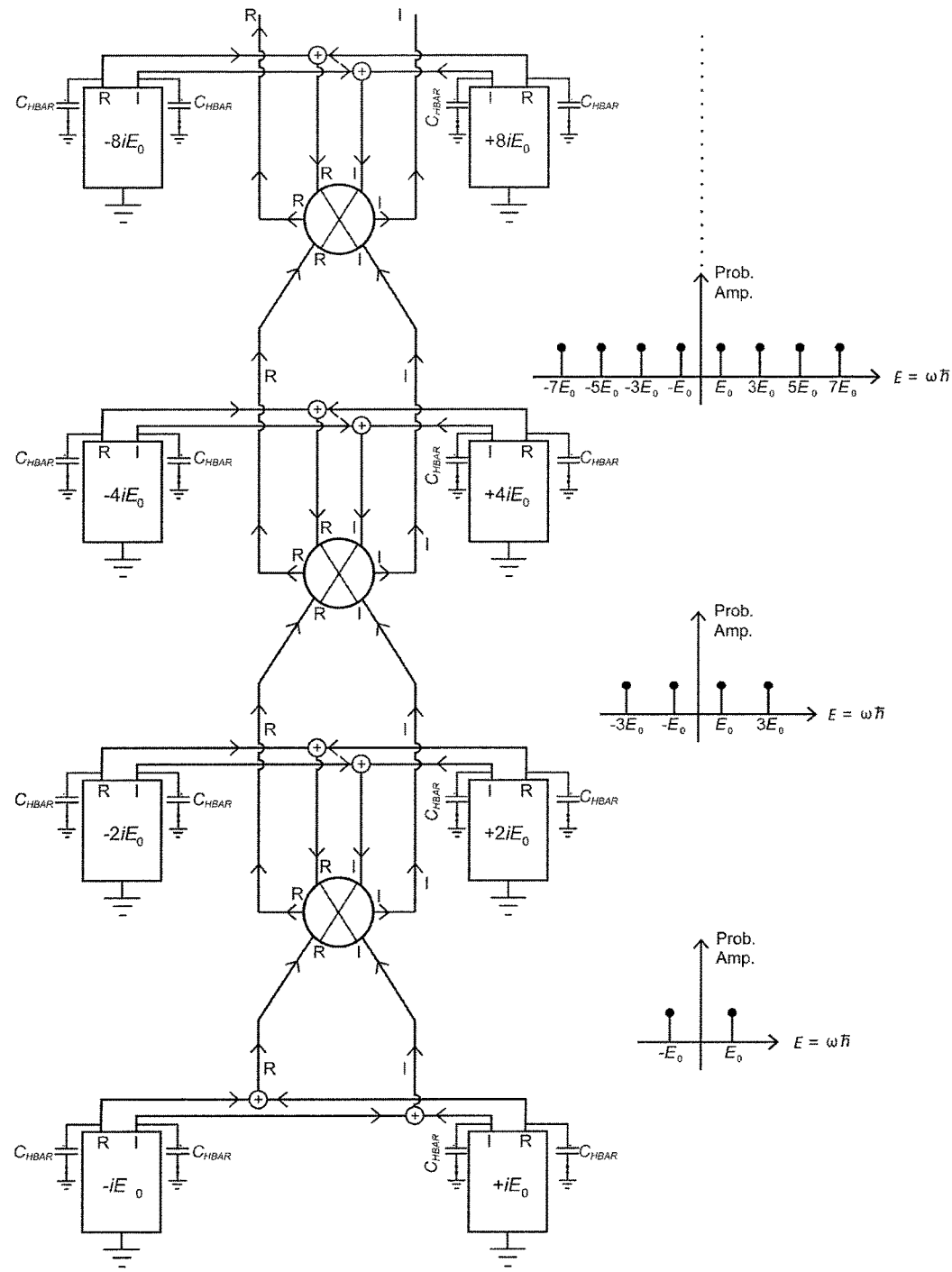
FIG. 44 shows how classical emulated quantum admittance circuits along with complex emulated quantum mixers, such as the emulated quantum transadmittance mixer, can be used to create an architecture that can enable a superposition of $2^N$ quantum states with arbitrary complex amplitudes for each state to be simultaneously represented in the spectrum of two output classical signals using hardware resources that only scale linearly with N.
Figure 45:
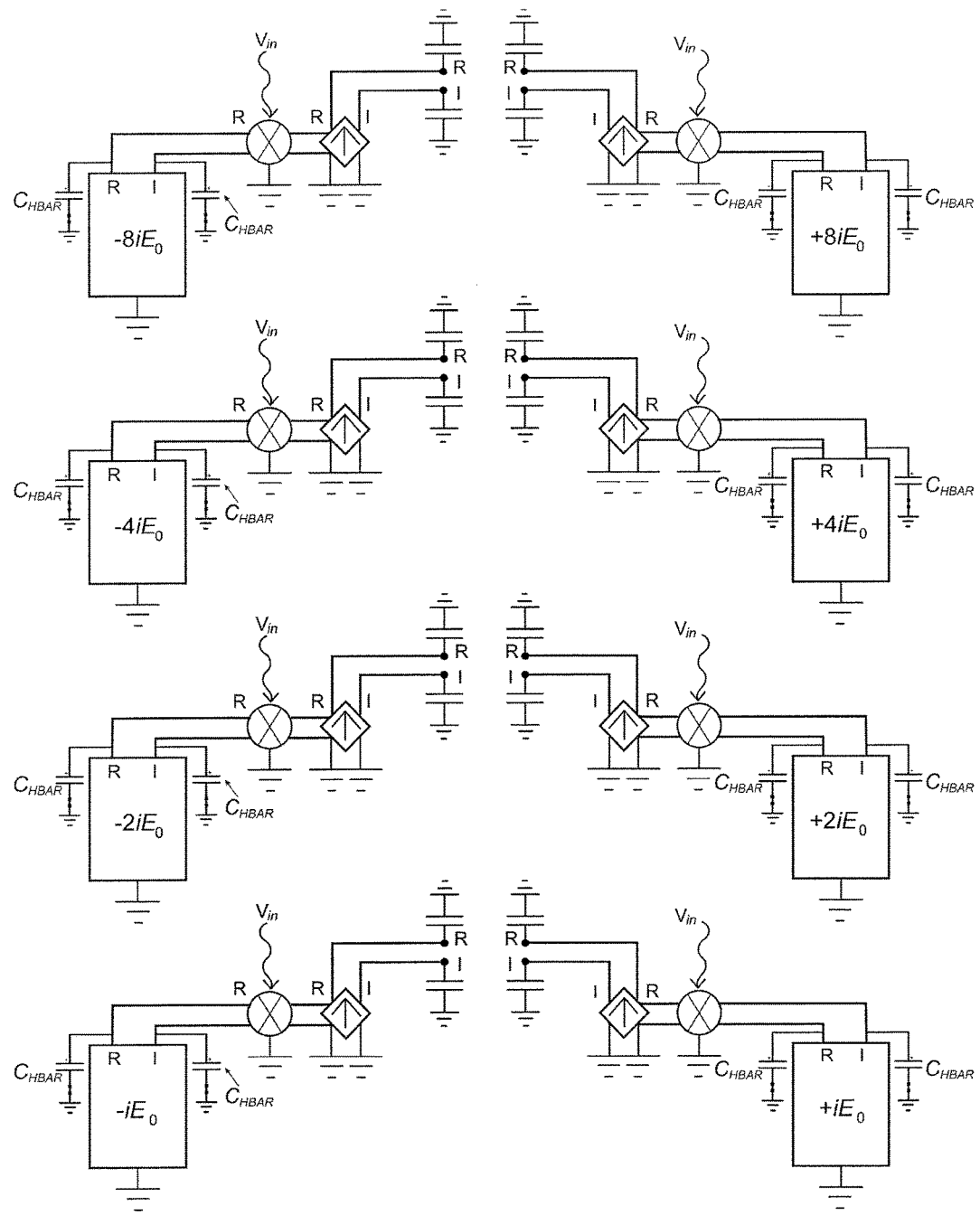
FIG. 45 shows an architecture for how a classical analog input signal can be used to efficiently encode initial conditions in an emulated quantum system with quantum admittances and quantum transadmittance mixer building blocks, a capability useful in many quantum computing applications that exploit quantum superposition.

FIG. 16 shows how a complex transadmittance mixer circuit can be built with transistors for use in the two-state system of FIG. 15. In this circuit, the bottom set of transistors are identical to that described previously for an emulated quantum admittance (FIG. 4) except that MN49, MN55, MN51, and MN50, MN54, MN56 implement fast current-mirror diode-like inputs that minimize unwanted parasitic dynamics in the admittance. The admittance provides buffered differential real and imaginary signals from its pFET diode outputs that are conveyed via the source followers in the middle part of the figure given by MN33-MN37, MN34-MN38, MN35-MN39, and MN36-40. Small offset-adjusting voltage sources that are part of the source-follower circuits for precision adjustments are also shown. The remaining stack of differential pairs implement the previously described equations of the complex mixer by performing multiplication of the differential voltage signals. In this circuit, the differential complex mixing input signal is denoted by the (MxI_n, MxI) and (MxR, MxR_n) pairs. The current outputs of the complex transadmittance mixer are conveyed to the current mirrors to finally generate differential current output signals that are shown at the top (VR_Dd_Pout, VR_Dd_Nout) and (VI_Dd_Pout, VI_Dd_Nout) respectively. Note that differential pFET diode outputs that drive the final mixer current outputs (MP2, MP3, MP6, and MP7) can also serve as voltage outputs of the complex mixer such that the mixer can also operate as a voltage-in-voltage-out device, which is useful in some applications (FIGS. 44 and 45 for example). FIG. 17 shows that the transadmittance complex mixer circuit is successful in downmixing, while FIG. 18 shows that the mixer is successful at upmixing. All the generalizations that we discussed for the emulated quantum transadmittance circuit also apply for the emulated quantum transadmittance mixer circuit that we have discussed.

Figure 19:
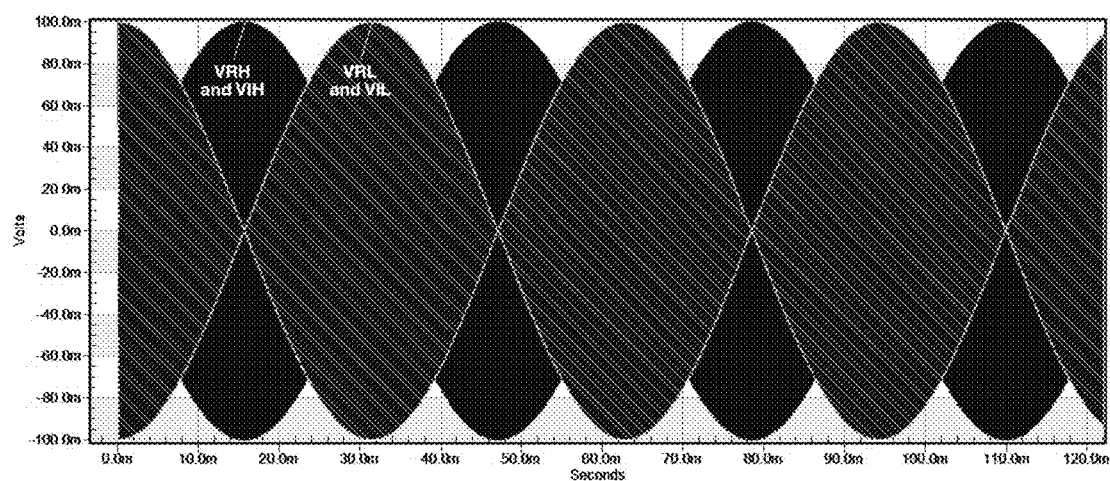
FIG. 19 illustrates that, similar to what is observed with light input in atoms or resonant B fields in Nuclear Magnetic Resonance (NMR), a constant resonant control input in the circuit of FIG. 15 can effectively couple two quantum states of different energy to one another in a two-state system to create a quadrature oscillation in their envelopes as probability flips back and forth between the two states in a conservative fashion.

FIG. 19 illustrates that, similar to what is observed with light input in atoms or resonant B fields in Nuclear Magnetic Resonance (NMR), a constant resonant control input in the transadmittance mixer circuit of FIG. 15 can effectively couple two quantum states of different energy to one another in a two-state system to create a oscillation in their envelopes as probability flips back and forth between the two states in a conservative fashion. In fact, if the mixing control input is stopped at the right point in a pulse, we can have the probability of one state at 0 and the other at 1 (termed a 180 degree pulse); or both at equal probability (termed a 90 degree pulse), or at any place in the Bloch sphere that defines the quantum state, as is well known Our emulations can do the same with resonant inputs and also with the use of initial-condition establishment at any arbitrary amplitude and phase (FIG. 45). Such systems also describe the oscillation of atomic energy states under a constant light field. One common effect in all of these systems that we shall exploit later in the quantum cochlea (see FIG. 38A, 40, or 41), made up of many cascaded emulated two-state systems is that the modulation frequency of the envelope is proportional to the strength of the mixer input. Thus, we can create a detector that measures modulation frequency to detect the strength of the mixer input. Such a scheme is inherently robust since it averages over more zero-crossings when the input is faint, and over fewer zero-crossings when the input is strong.

Two state systems composed with emulated transadmittances or transadmittance mixers are also extremely versatile. For example, a Josephson junction is a two-state system wherein the energy (or equivalently transconductance difference) of the two quantum admittances is proportional to the differential voltage across the junction, e.g., exactly as in the data of FIG. 13 where a differential pair is used to bias the transconductors in the two emulated quantum admittances. Josephson junctions can also exhibit classic resonant mixing input effects just like any other two-state systems that are configured to have different energies in their two states such that FIG. 15 is also useful in emulating Josephson junctions.

The current across a Josephson junction when there is no a.c. resonant input is given by the conservative probability current flows in a two state system coupled with transadmittances (as in FIG. 5). Since probability corresponds to actual charge energy on Planck capacitors in our emulation, the Josephson-Junction current corresponds to the power moving from Planck capacitors in one emulated quantum admittance to the other emulated quantum admittance. Since probability is conserved, such power flows are ideally symmetric and may be measured in either half of our emulated two-state circuit.

We can emulate current-voltage characteristics in a Josephson junction if we measure the power flows between the emulated quantum admittances in a coupled two-state system (FIG. 5) under an imposed differential voltage bias on their transconductances. To impose such a differential voltage bias, PEObs in FIG. 20A would be different for each emulated quantum admittance in the two state and biased from a differential pair as the data of FIG. 13 show.

To measure the power flows corresponding to probability-current flows, a simple embodiment could first use differential voltages that represent VR or VI (including coupling currents from FIG. 6 transadmittance circuits), e.g., such as from MP8-MP9 or MP12-MP13 in FIG. 6 respectively and multiply them together in a classic differential mixer (our claimed emulation of a transadmittance mixer that needs complex multiplication with just real parts would also work but would have redundant and unused circuitry and is overkill for this simple case). Such a scheme works because in our coupled transconductor system the voltage for one variable determines the current for the other and vice versa, such that a product of two voltages, corresponds to the product of a current and voltage.

Such applications motivate one to design schemes to measure probability-related signals in emulated quantum circuits, which could have many other uses, and also to architect fine control of probability-amplitude envelopes via feedback.

FIG. 20A illustrates an electronic transistor circuit that can be used with an emulated quantum admittance connected to Planck capacitors. If the quantum state is oscillating at frequency $\omega$, the circuit helps us create $\cos^r \omega t$, $\sin^2 \omega t$, $\cos 2\omega t = \cos^2 \omega t - \sin^2 \omega t$ and $-\cos 2\omega t = \sin^2 \omega t - \cos^r \omega t$, all of which are useful for squared-signal probability and power computations and parametric amplification. Parametric schemes are not only useful for feedback control of the oscillatory amplitude of one's own state, thus compensating for or increasing loss in an emulated quantum admittance as desired, but also for quantum control of one state by another quantum state, as we show later.

Figure 20B:
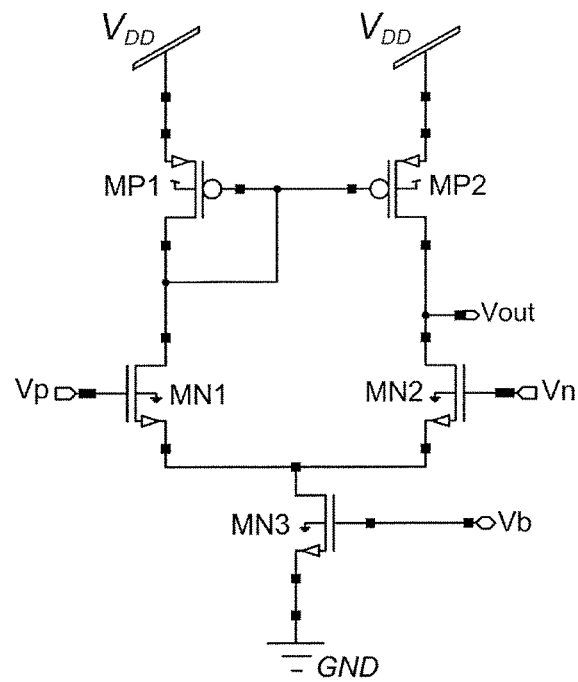
FIG. 20B illustrates a well-known transconductance amplifier circuit that is used in FIG. 20A.

In FIG. 20A, the bottom half shows an emulated quantum admittance that we have described several times in this application, for example, when discussing FIG. 4 or FIG. 6. The circuit has, however been slightly modified to incorporate opamp-based buffers (OTANbuf) in the MP14-MP15 and MP18-MP19 mirrors, using well-known circuits, shown in FIG. 20B for the sake of completion. Such buffers serve to allow us to effectively minimize any inherent transistor parasitic capacitance in the mirrors (which we have exploited in the past, e.g., see FIG. 8 or FIG. 12), and introduce our own well-controlled capacitances. They also enable us to introduce varactors or voltage-controlled capacitances (shown by the capacitors controlled by CpCntrl_P and CpCntrl_N inputs) for fine-control of oscillator amplitude, which we will later exploit and discuss. Varactors can be implemented with various means including with depletion capacitances and MOSCAPs biased in the subthreshold-above-threshold transition.

We will now focus on the top half of FIG. 20A, wherein all the second-harmonic signal generation and processing of signals from the quantum emulated admittance is performed.

A key feature of FIG. 20A is the 4× transistor current scaling of MP7 and MP9 w.r.t. the equally-sized MP14 or MP15 and of the 4× transistor current scaling of MP8 and MP10 w.r.t. the equally-sized MP18 and MP19. Such scaling enables us to extract $\cos^2 \omega t$ or $\sin^2 \omega t$ signals in a very compact fashion with just two transistors in a series stack in the subthreshold regime of transistor operation as we now explain.

In the differential pairs of the transconductors used in emulating a quantum admittance shown in FIG. 20A or in any of our other embodiments, the differential half currents in the differential transconductor that takes input from the $V_R$ node are well represented by $I_{BIAS}(1+\sin(\omega t))/2$ and $I_{BIAS}(1-\sin(\omega t))/2$ over a good linear range of operation, with their sum equal to the constant bias current of MN13. Similarly, the differential half currents in the transconductor that takes input from the VI node are well represented by $I_{BIAS}((1+\cos(\omega t))/2$, and $I_{BIAS}(1-\cos(\omega t))/2$ over a good linear range of operation, with their sum equal to the bias current of MN16. We have used the same $I_{BIAS}$ current for MN13 and MN16 since, except in the case of squeezed quantum states discussed previously, these currents are nominally equal. In the subthreshold regime of operation, a series stack of transistors such as MP7-MP9 and MP8-MP10 outputs a current equal to the product of the currents driving the gate nodes of the input transistors of the current stack, divided by their sum. Since the sum of the currents from a differential pair is a constant given by the bias current of the differential pair, the series stack effectively outputs a current equal to the bias-current-normalized product of its inputs. Now $4[(1+\sin(\omega t))/2][[(1-\sin(\omega t))/2]=\cos^2 \omega t$. Similarly, $4[(1+\cos(\omega t))/2][[(1-\cos(\omega t))/2]=\sin^2 \omega t$. Thus, we can very efficiently (with just 4 additional transistors) compute key squared signal deviations from a reference and output currents that vary as $I_{BIAS} \sin^2 \omega t$ and $I_{BIAS} \cos^2 \omega t$.

It is also important to note, that even when the differential pairs are in a saturated or nonlinear regime of operation, the outputs from the drains of MP9 or MP10 never exceed $I_{BIAS}$ and are automatically normalized to it, thus normalizing out the absolute probability, which is useful in many quantum applications, e.g, in operators used for measurement that are probability-normalized. Since $I_{BIAS}$ is proportional to the transconductance $G_{E0}$ in the subthreshold regime of operation as is well known ($G_{E0}=\kappa I_{BIAS}/(kT/q)$ where $kT/q$ is the thermal voltage and $\kappa$ is the subthreshold exponential coefficient), the output drain currents of MP9 and MP10 in FIG. 20A are proportional to $\omega_0 C_{HBAR}(kT/q)\cos^2 \omega t$ and $\omega_0 C_{HBAR}(kT/q)\sin^2 \omega t$ and provide a measure of power flow. Squared signals could also obviously be generated by mixing a differential signal with itself in a simple real mixer or in our more complex mixer (FIG. 16), but would not be as compact as our two-transistor implementations.

Figure 20C:
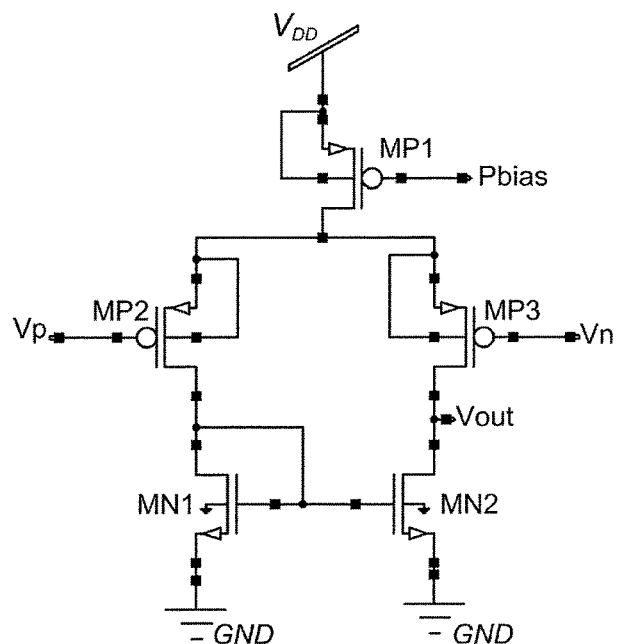
FIG. 20C illustrates another well-known transconductance amplifier circuit that is used in FIG. 20A.

In FIG. 20A, the output $I_{BIAS} \cos^2 \omega t$ current from the drain of MP9 and the $I_{BIAS} \sin^2 \omega t$ from the drain of MP10 are converted to an intermediate voltage across MP11 and MP12 respectively and differenced via the MP1-MP2-M3 differential pair with fast-current-mirror diode-like loads (as described for and shown in the bottom half of FIG. 16 already). These fast diode-like loads in each differential half are comprised of MN1-MN3-MN5 and MN4-MN6-MN2 respectively. Output voltages from these loads then represent $\cos 2\omega t$ and $-\cos 2\omega t$ respectively and are in turn sent to a current-mode high-pass filter comprised of MP5-MP6-MP4-MN7-MN8 and the OTAPbufs. The OTAPbuf is shown in FIG. 20C. If any instance of it is biased with a sufficiently high bias voltage on the Pbias terminal of FIG. 20C such that MP1 has a small bias current, FIG. 20A reveals that MN7 and MN8 will operate in a slow fashion to subtract out d.c. bias currents from MP5 and MP6 respectively, but let a.c. currents proportional to $-\cos 2\omega t$ and $+\cos 2\omega t$ be capacitively coupled out to parametrically and differentially modulate bias currents of the core $G_{E0}$ transconductors via VR_BS_Dd_In and VI_Bs_Dd_In at the gates of MN14 and MN15 respectively. Thus, we can create a complete feedback loop wherein transconductor output voltages, which behave like $\cos \omega t$ and $\sin \omega t$ lead to $-\cos 2\omega t$ and $+\cos 2\omega t$ modulating inputs that feedback to amplify or attenuate them. The amplification or attenuation has to do with whether we couple $-\cos 2\omega t$ to VR_Bs_Dd_In and $\cos 2\omega t$ to VI_BS_Dd_In or vice versa to create a positive-feedback loop or negative-feedback loop respectively, as we explain below.

Figure 21:
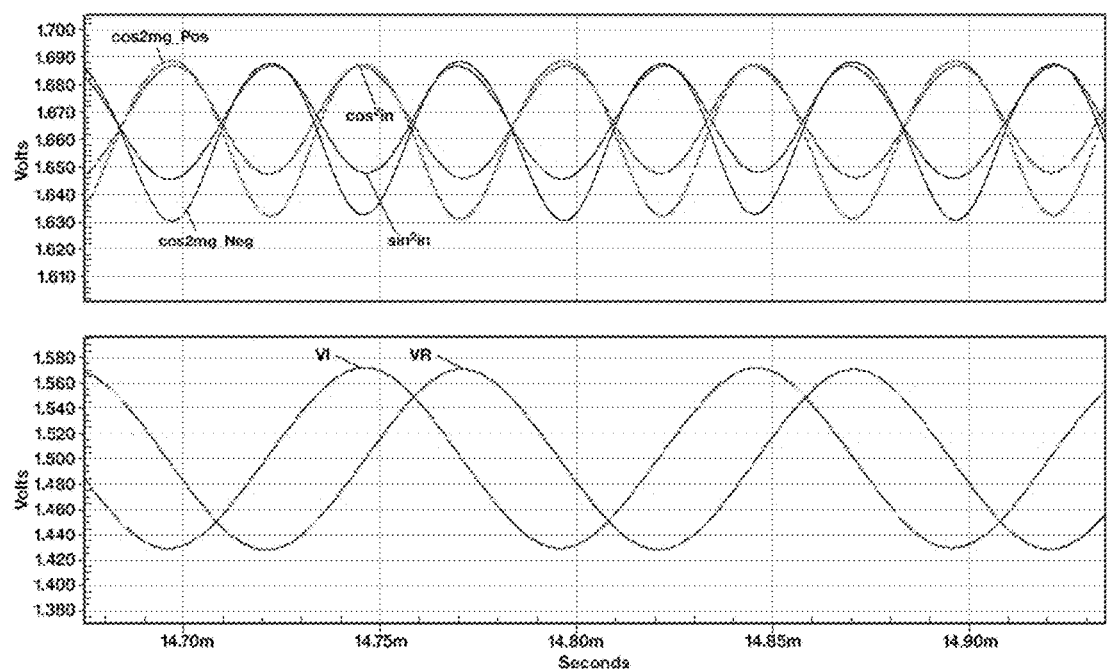
FIG. 21 shows waveforms that illustrate the operation of the circuit of FIG. 20A.

FIG. 21 shows waveforms that illustrate the operation of the circuit of FIG. 20A. We see that the difference between the squared cosine and sine terms lead to second-harmonic cosine terms. The squared cosine term aligns with the VI cosine waveform and the square sine term aligns with the VR sine waveform in the emulated admittance of FIG. 20A.

Figure 22:
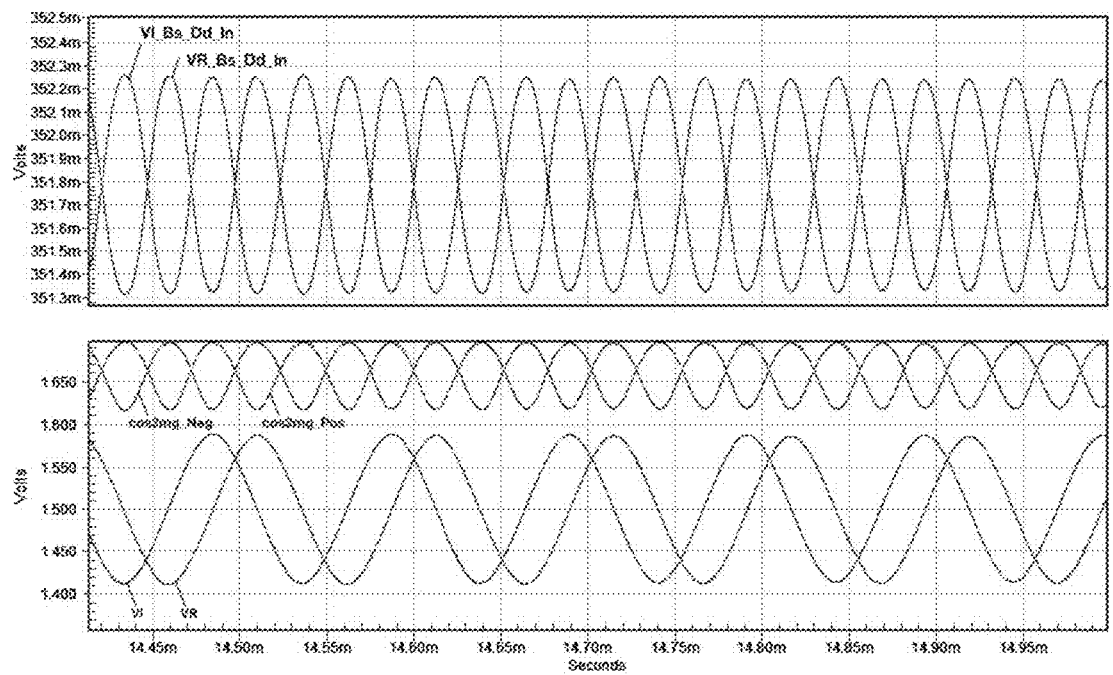
FIG. 22 shows waveforms that illustrate the operation of the circuit of FIG. 20A when parametric amplification is used for positive feedback.

FIG. 22 shows waveforms that illustrate the operation of the circuit of FIG. 20A when parametric amplification is used for positive feedback. In this case, the transconductance of each transconductor in the emulated admittance has its bias current increased when its output voltage is at a zero crossing. In the opposite case of negative feedback, when the transconductance is decreased at a zero crossing, there is attenuation.

Figure 23:
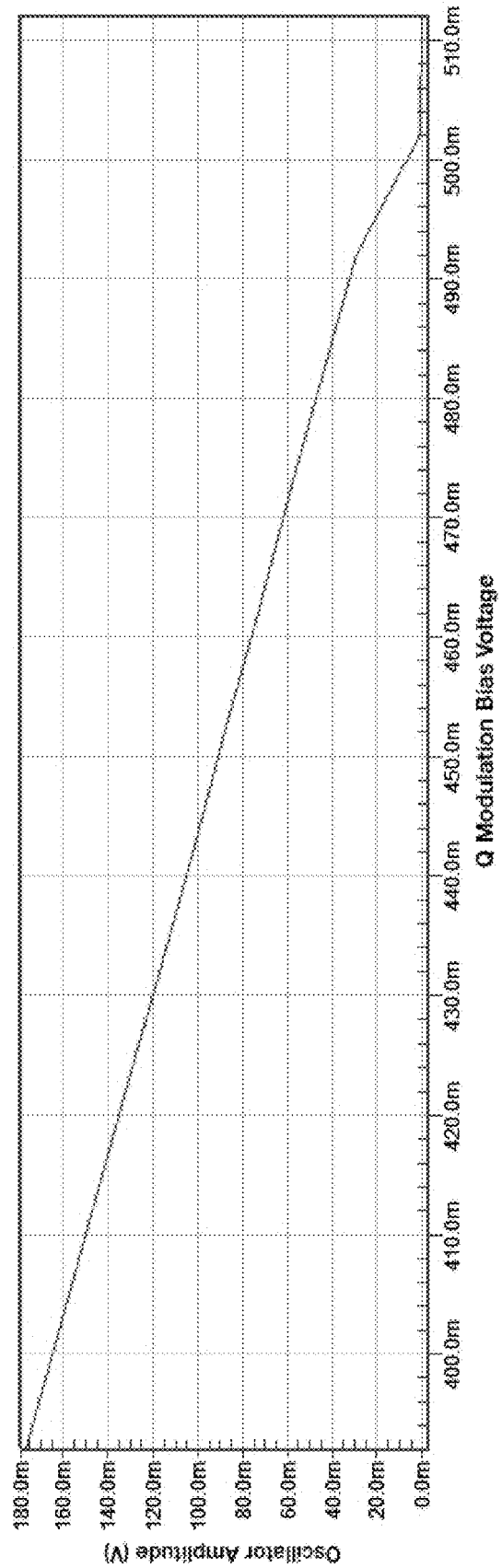
FIG. 23 shows that increasing the strength of parametric amplification under negative feedback can successfully attenuate the oscillatory amplitude of the emulated quantum state.

FIG. 23 shows that under negative feedback, as we change the modulation bias voltage of the cos 2 $\omega t$-generating circuit (The deviation from $V_{DD}$ of Qmodbs in FIG. 20A), the oscillatory amplitude decreases. Thus, increasing the strength of parametric amplification under negative feedback can successfully attenuate the oscillatory amplitude of the emulated quantum state.

Figure 24:
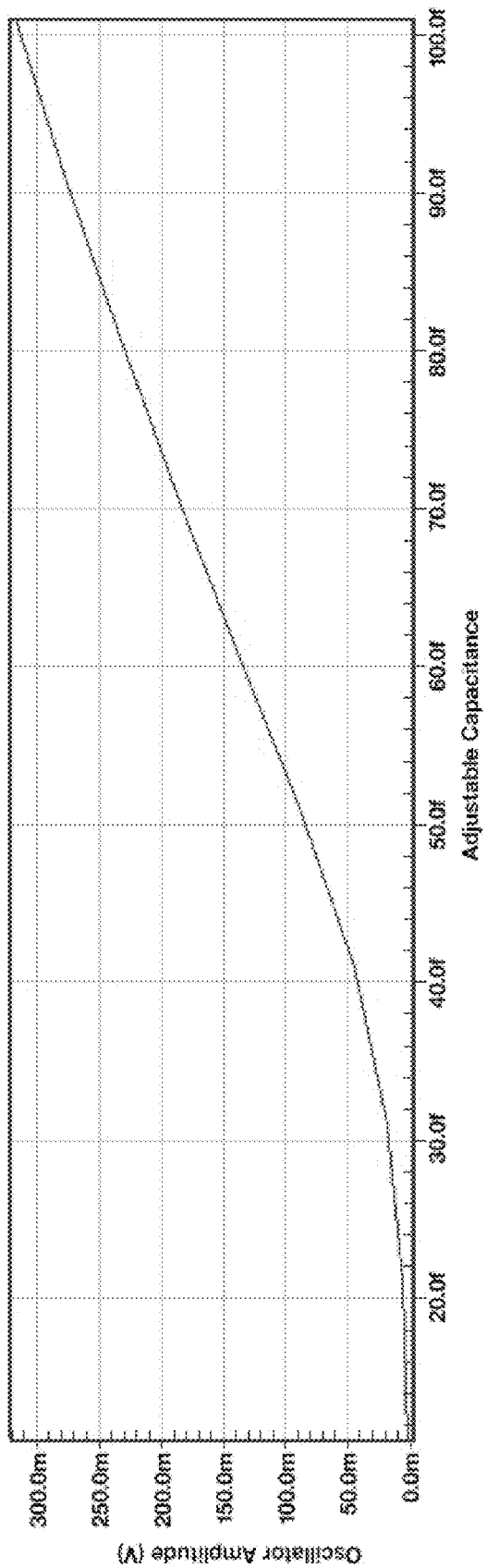
FIG. 24 shows that an adjustable capacitance within an electronic emulated quantum admittance circuit is effective in controlling its oscillatory amplitude and is therefore useful for quantum control.

FIG. 24 shows that an adjustable capacitance (all the $C_{par}$ capacitors in FIG. 20A) can intentionally worsen the phase margin of the emulated-admittance negative-feedback loop, and thus introduce small-signal instability into it. Nevertheless, the oscillatory amplitude of the emulated-admittance circuit stabilizes. It is because the nonlinearities inherent in the circuit, in this case due to the bias-current saturation of the circuit's differential pairs, stabilize the oscillatory amplitude at a value where there is no effective loss or instability, and the phase margin is zero. Thus, rather than attempt to build emulated quantum admittances that have zero loss, which is impossible to do practically, we can use means to control the oscillatory amplitude and achieve stable and practical operation. We can increase the oscillator amplitude through positive-feedback parametric amplification or through small-signal instability; we can decrease and it via negative-feedback parametric amplification or nonlinearity. It is worth noting that even modest positive-feedback parametric amplification, i.e., that which makes the positive feedback loop gain greater than 1, causes instability as well. Thus, it is important for quantum state preparation and controlled dynamics in quantum networks of emulated admittances that we can control the amplitude of oscillation. We shall soon show that we can control instability with negative feedback for quantum and quantum-inspired control and dynamical systems emulation. To do so, it is important to measure the oscillatory amplitude. We now show a means to do so.

Figure 25:
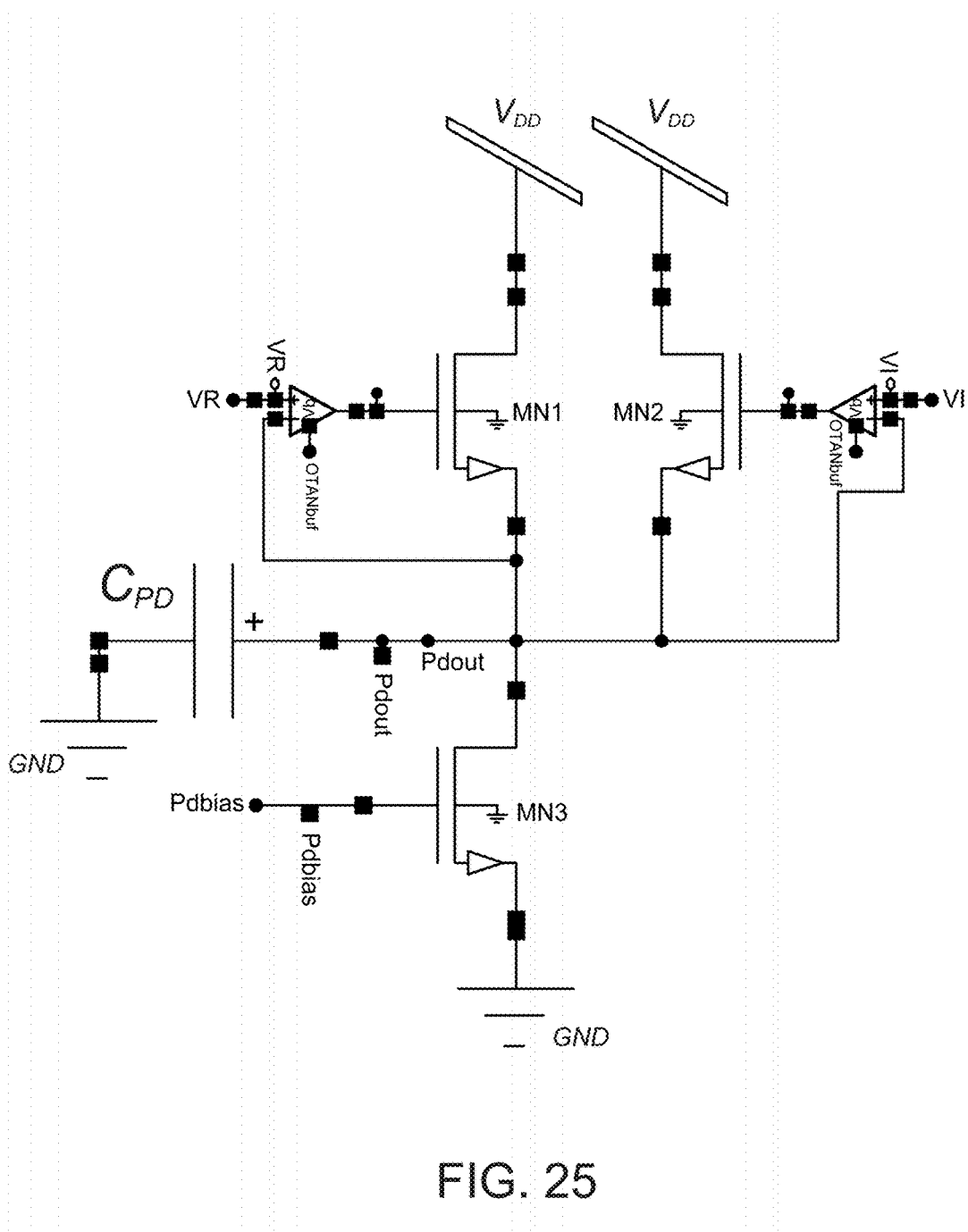
FIG. 25 shows an electronic transistor circuit that is useful for measuring the amplitude of oscillation of a quantum state.
Figure 26:
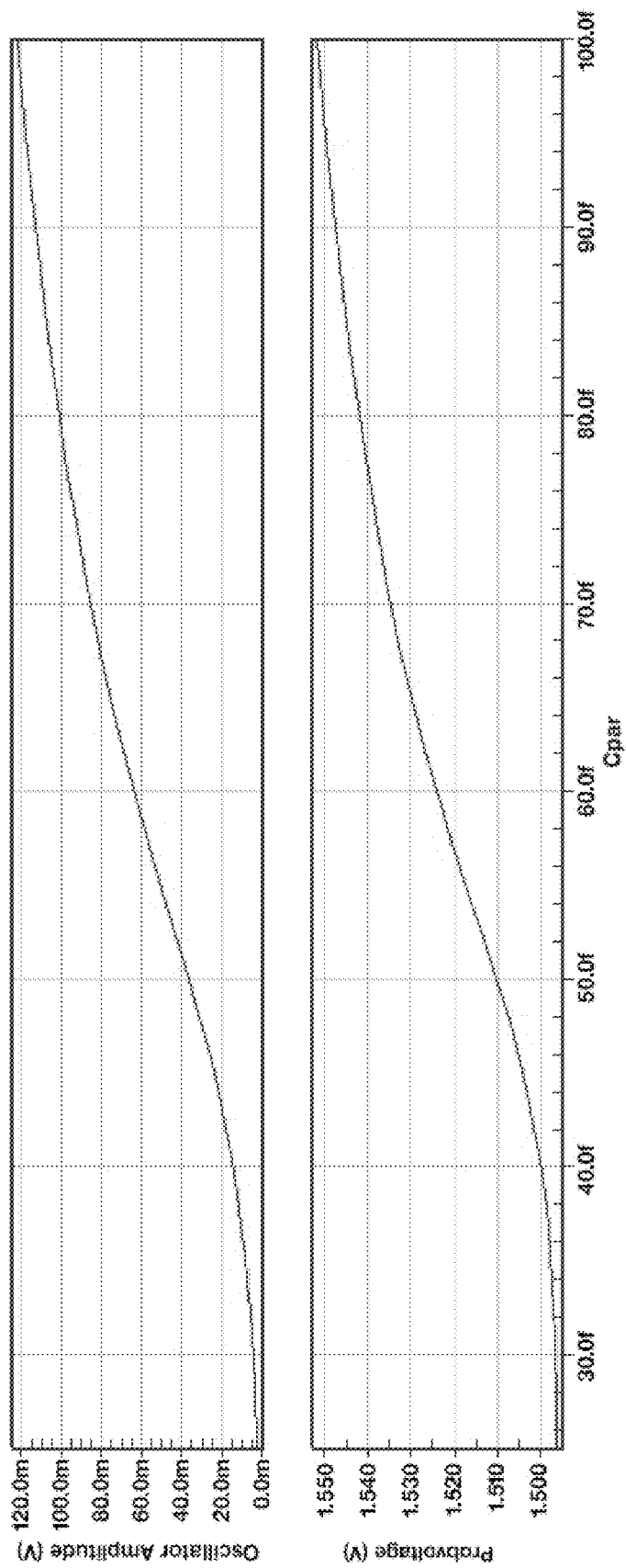
FIG. 26 shows that the electronic transistor circuit of FIG. 25 does faithfully correlate with the oscillatory amplitude.

FIG. 25 shows an electronic transistor circuit that is useful for measuring the amplitude of oscillation of an emulated quantum state. MN1 and MN2 are driven when either the real part, VR, or imaginary part, VI of the quantum state are high, making Pdout high. When either decrease, Pdout only falls slowly, due to MN3 being biased with a very small bias current through a small subthreshold Pdbias voltage, and the capacitance $C_{pd}$ being sufficiently large. Thus, we are able to measure the peak value of the oscillation amplitude. The OTANbuf opamp-based buffer, a circuit identical to that shown in FIG. 20B, enables even small oscillatory amplitudes to be sensed accurately due to its high gain. Such gain effectively increases the small-signal transconductance of MN1 and MN2 by the gain of the opamp such that even small amplitudes of VR or VI will lead to large enough driving currents through the transistor to be sensed. FIG. 26 shows that the oscillator amplitude is faithfully measured by the circuit at its output Pdout, whose voltage is labeled as Probvoltage in FIG. 26.

Figure 27A:
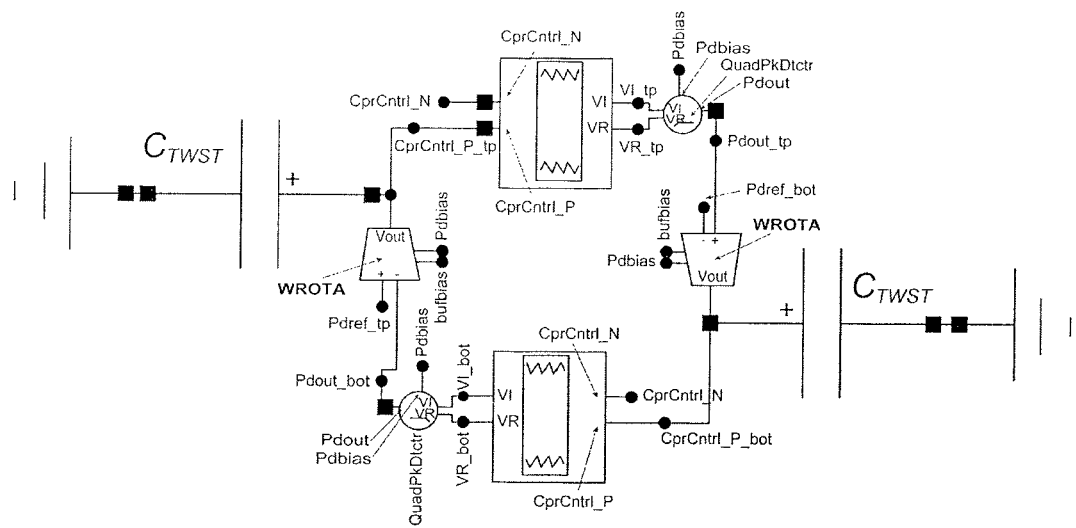
FIG. 27A shows one example of a quantum-inspired symmetric control circuit architected for creating oscillatory coupling between quantum states.
Figure 27B:
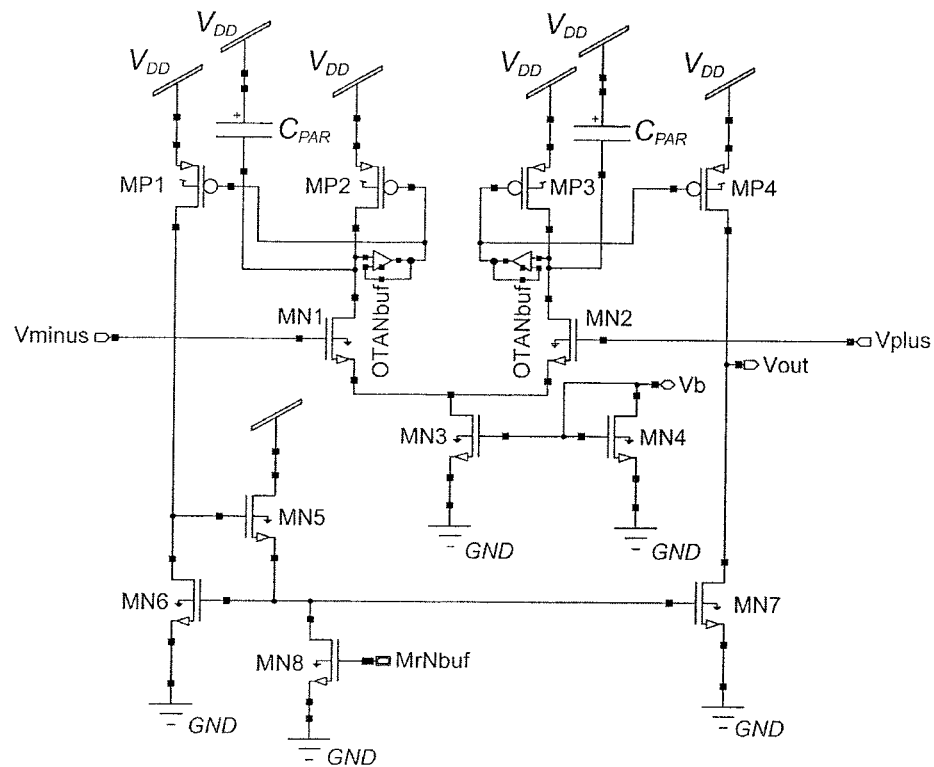
FIG. 27B shows the schematic for a well-known electronic transistor circuit used in FIG. 27A.
Figure 28:
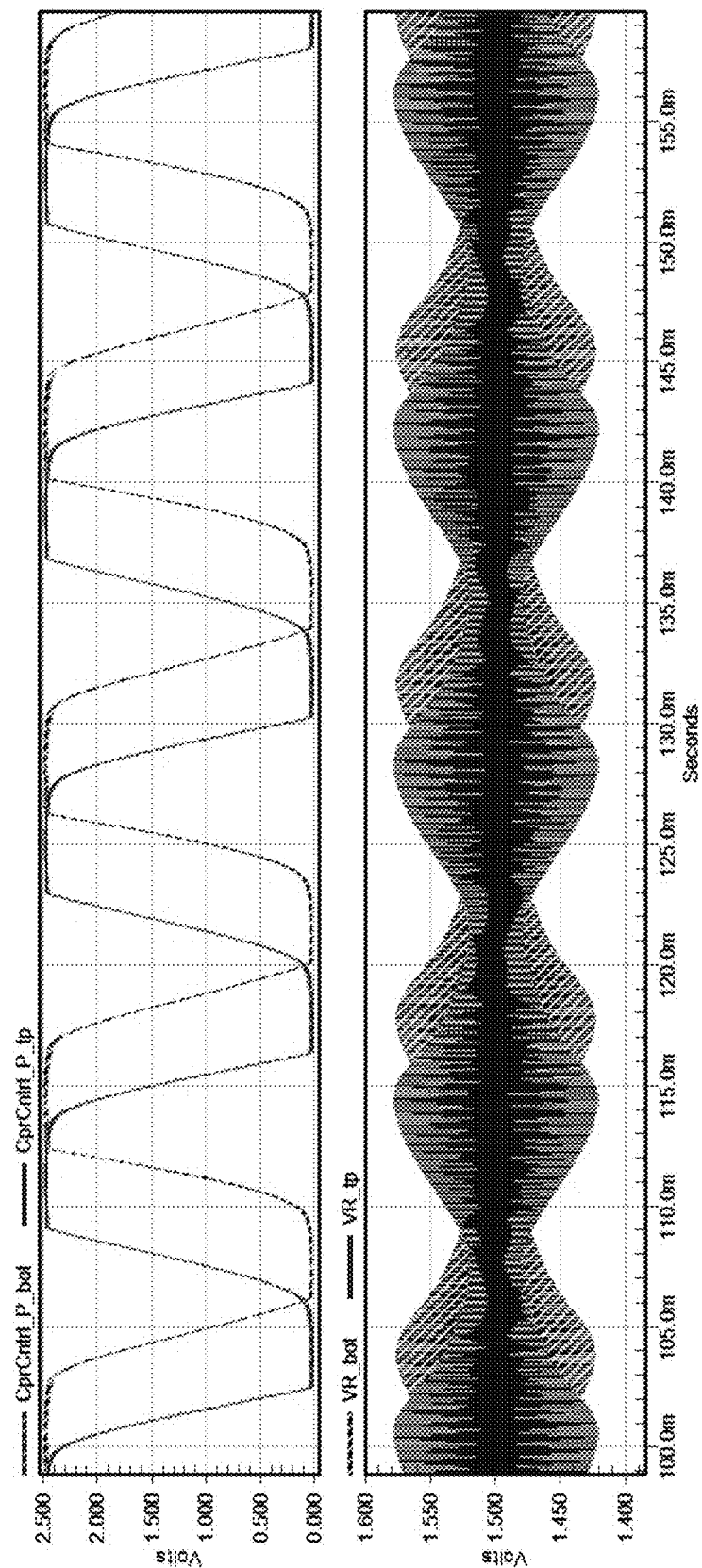
FIG. 28 illustrates fine quantum-inspired control of oscillations between two emulated lossy quantum states with relatively fast coupling.
Figure 29:
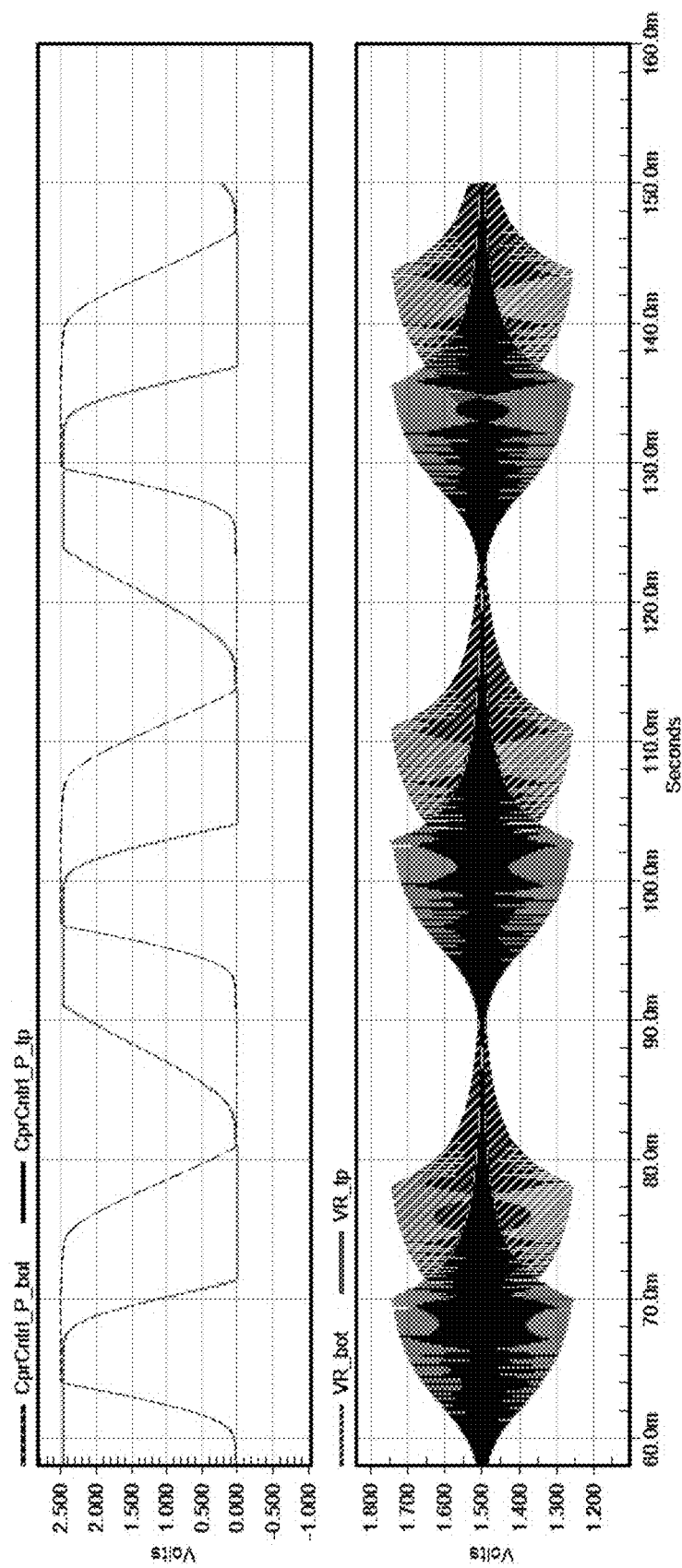
FIG. 29 illustrates fine quantum-inspired control of oscillations between two emulated lossy quantum states with relatively slower coupling.

FIG. 27A shows one example of a quantum-inspired symmetric control circuit architected for creating oscillatory coupling between quantum states. The rectangular wave-like symbols correspond to the building-block circuit of FIG. 20A with inputs and outputs emphasizing the quantum state (VR, VI) and varactor differential control voltage inputs (CprCntrl_P, CprCntrl_N). The circular symbols serve as a short hand for the oscillatory-amplitude or peak-detector circuit of FIG. 25. The bias voltage, Pdbias determines the peak-detector time constant. The WROTA block is a transconductor shown in FIG. 27B that enables us to alter set-point amplitudes in the control as well as time constants of coupling between emulated quantum states. The capacitors $C_{TWST}$ along with the WROTA transconductor allow us to alter the time constant of coupling. FIG. 27B shows the schematic for the WROTA transconductor used in FIG. 27A. FIG. 28 illustrates fine quantum-inspired control of oscillations between two emulated lossy quantum states with relatively fast coupling. Note that, just as in the emulated transadmittance-mixer circuit with no loss (FIG. 15), which leads to the usual quantum-two-state oscillation driven by the mixer input (FIG. 19) as in NMR applications, here, inspite of the loss, we get a controlled oscillation as well; but, the two states directly interact via the transconductor-capacitor-based setpoint and time constant control circuit rather than via a resonant input. The oscillations still have a sine-cosine-like phase as in FIG. 19 in spite of nonlinearity, loss, instability, and control. FIG. 29 illustrates fine quantum-inspired control of oscillations between two emulated lossy quantum states with relatively slower coupling. Here, we see quantum wave-packet-like oscillations with the rising time constant related primarily to the buildup of oscillation via instability and the falling time constant related primarily to the decay of oscillation due to loss. Once again, the sine-cosine-like phase is present.

FIG. 15 uses a transadmittance mixer to couple emulated quantum admittances while the example architecture of FIG. 27A does not. It is easy to combine such schemes or use them in isolation: The transadmittance architecture of FIG. 15, along with the actual transistor-based emulations of quantum transadmittance mixing of FIG. 16 can down mix (FIG. 17) or up mix (FIG. 18) waveforms from one emulated quantum admittance at one transconductance (or equivalently at one energy or one eigenfrequency) to another at its eigenfrequency to architect resonant coupling (as in the NMR example of FIG. 19). However, if there is loss, such coupling may not lead to oscillations that preserve (analogous to the $T_1$ and $T_2$ decays that cause actual quantum states to also stop oscillating). In such cases, it is beneficial to actively use the second-harmonic parametric amplification scheme (FIGS. 20A-23) with mixer output waveforms to compensate for loss. For example, the drain output currents of MP1 and MP4, or those of MP5 and MP8 in the mixer circuit of FIG. 16 can be differenced and renormalized in a diode-output differential pair rather than subtracted from each other as shown, and these diode-output voltages can be fed to the circuitry shown in FIG. 20A to create second-harmonic waveforms suitable for parametric amplification in the quantum admittance that we are coupling to. We are in essence, having one emulated quantum admittance amplify or excite another in a resonant fashion rather than architect positive feedback to oneself as we have previously discussed (FIGS. 20A-23). In fact, we can also have one emulated quantum admittance attenuate or inhibit another in a resonant fashion if we arrange the parametric amplification to attenuate rather than amplify (FIGS. 20A-23). FIGS. 27-29 illustrate that we could also have the resonant output waveforms from the mixer subject to peak detection and time-constant processing and upregulate or downregulate $C_{par}$ as we have previously shown. Thus, FIGS. 15-29 and the associated discussion and data around them illustrate that we can easily generalize a 2×2 network of emulated quantum or quantum-inspired admittances that are coupled to each other (FIG. 27A) to an N×N network of emulated quantum or quantum-inspired admittances that couple to each other. Such coupling can be resonant, non resonant, amplifying, or attenuating, and use instability promotion, parametric amplification or both. Thus, our detailed discussion of arbitrary two-state quantum and quantum-inspired network emulations shows that arbitrary N-state quantum and quantum-inspired network emulations with flexible means of coupling form a straightforward generalization.

Figure 30A:
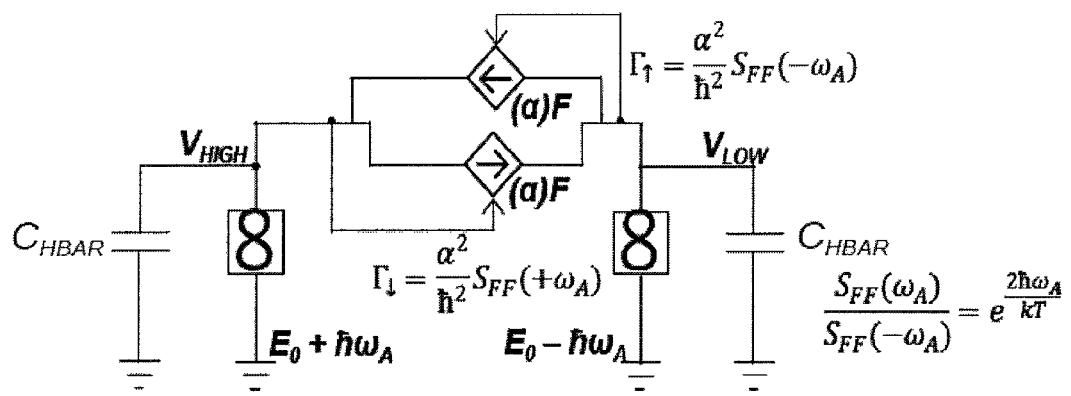
FIG. 30A illustrates how two quantum states coupled to the environment experience noise-induced transitions and damping of the high-energy state w.r.t. the low-energy state.
Figure 30B:
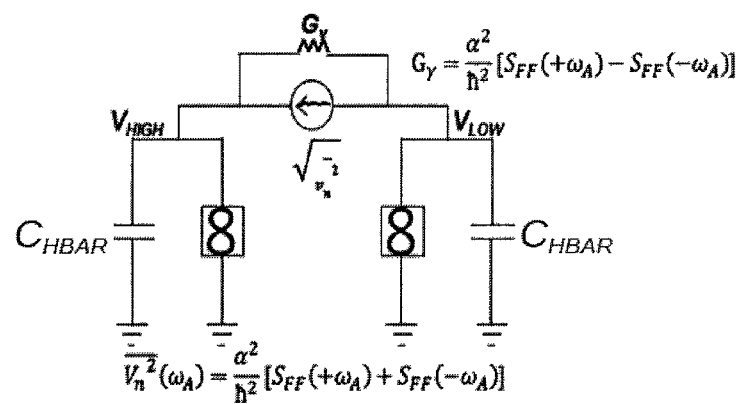
FIG. 30B illustrates how fluctuations and damping are related in quantum systems, yielding quantum equivalents of classical fluctuation-dissipation relations.

FIG. 30A illustrates how two quantum states coupled to the environment experience noise-induced transitions and damping of the high-energy state w.r.t. the low-energy state in a two-state system. Environmental noise is represented by the power spectral density of the forcing noise in a narrow band around the two energy levels, i.e., $S_{FF}(\omega_A)$ and $S_{FF}(-\omega_A)$ in FIG. 30A. Noise that is too far outside the band is ineffective but can be formally considered in a full integrative treatment involving $\text{sinc}^2$ functions. Examples of such noise include the electric field noise in the environment that can inadvertently cause transitions in atomic energy states. As the figure illustrates, transitions from a high energy state to a low-energy state are more likely because of the higher capacity of the more-entropic thermal environment to absorb emitted radiation than to give it back to the atom. Consequently, the higher energy state equilibrates at a lower probability w.r.t. the lower energy state. The loss of energy to environment causes damping. Equilibrium results when this energy returns back to the atom as higher forcing noise at the higher energy state such that there is detailed balance and cancellation in the noisy flux of Poisson transitions flowing from one state to the other. The difference in the two fluxes causes damping while the sum causes noise, yielding the quantum version of the well known fluctuation-dissipation theorem for classical noise (of which the Nyquist-Johnson noise in a resistor is a special case). FIG. 30B illustrates how fluctuations and damping are related. It can be shown that the ideas of FIG. 30 encompass both the Planck spectral noise of radiation and the zero-point fluctuation (due to non commutativity in quantum systems not predicted by classical noise) to yield the total noise that is actually measured.

Figure 31:
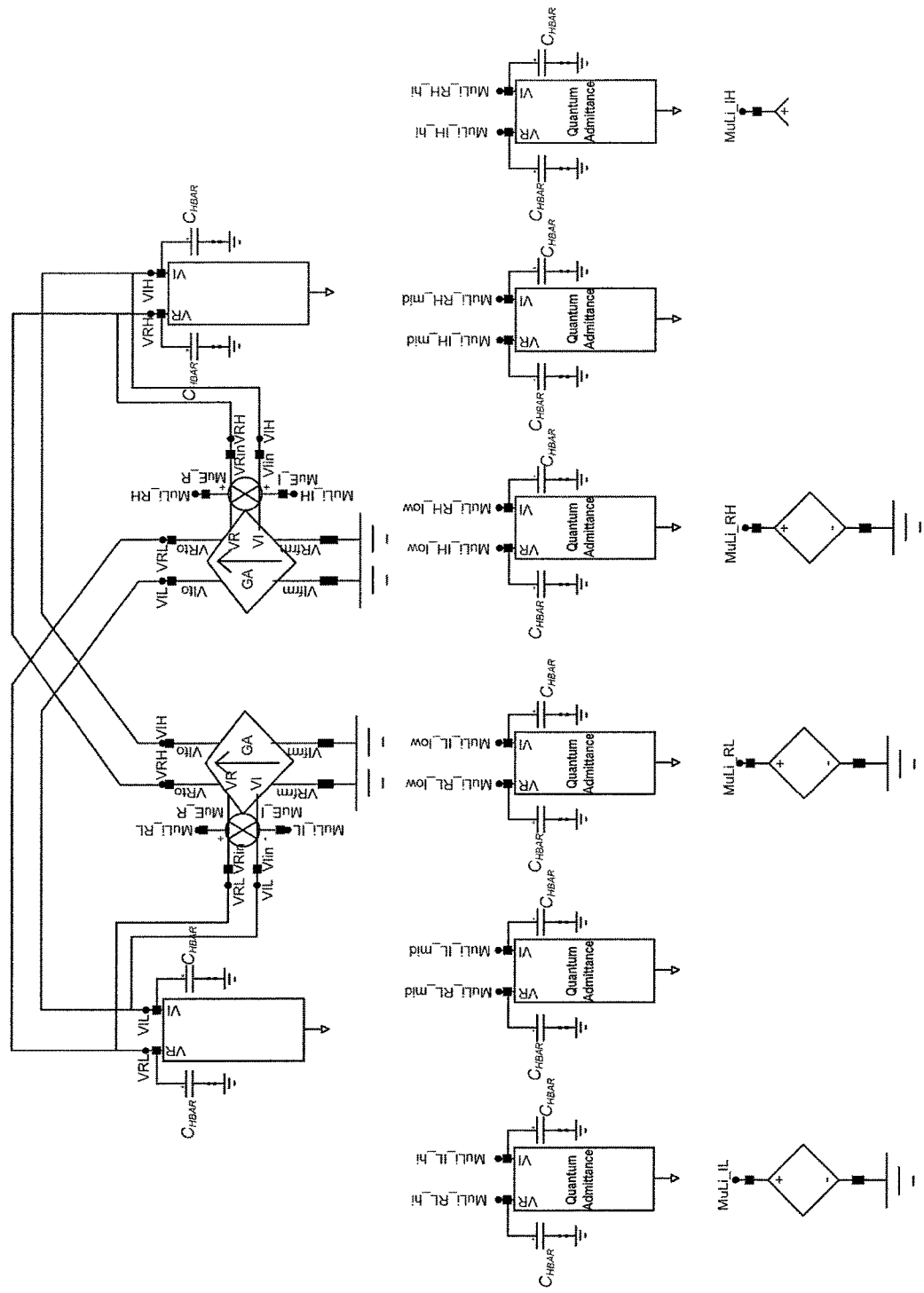
FIG. 31 illustrates how quantum fluctuation-dissipation relations may be emulated with quantum admittance and quantum transadmittance mixer circuits including circuits that capture the asymmetry in the environmental noise at different frequencies that leads to both quantum damping and quantum dissipation.
Figure 32:
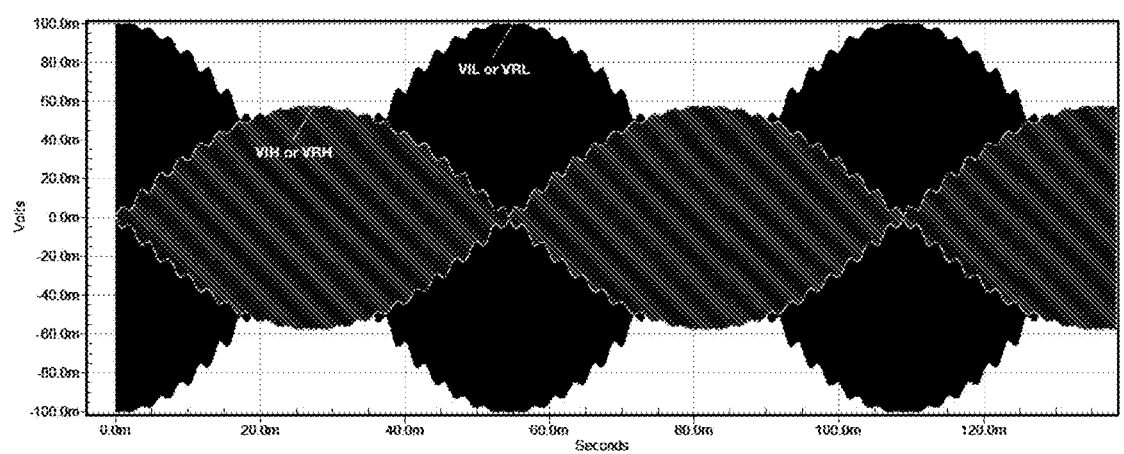
FIG. 32 illustrates that, unlike the undamped and noiseless dynamics of the quantum two-state system of FIG. 15 with a perfectly resonant input, which is exhibited in FIG. 19, the circuit of FIG. 31 successfully emulates damped and noisy dynamics.

FIG. 31 illustrates how quantum fluctuation-dissipation relations may be emulated with quantum admittance and quantum transadmittance mixer circuits including circuits that capture the asymmetry in the environmental noise at different frequencies that leads to both quantum damping and quantum dissipation. To illustrate the idea, and to mimic the narrowband noise of the environment that is dominant, the figure shows three random-phase environmental noise sources that are at resonance, slightly below resonance, and slightly above resonance for both the raising and lowering transadmittance mixers. They are provided by the three quantum admittance field oscillators connected to the Planck capacitors. The dependent voltage source adds these contributions and provides them as mixer inputs to the raising and lowering operators. The raising transadmittance mixer on the left is less likely to excite a transition than the lowering transadmittance mixer on the right. Consequently, if we have a constant noisy exposure to these environmental signals, the higher energy state will damp. Therefore, FIG. 32 illustrates that, unlike the undamped and noiseless dynamics of the quantum two-state system of FIG. 15 with a perfectly resonant input and a transadmittance mixer, which is exhibited in FIG. 19, the circuit of FIG. 31 successfully emulates damped and noisy dynamics.

Though FIG. 31 illustrates the key ideas, practical emulations would likely implement it in one of two ways: 1) A pseudo-random noise source is converted from the digital domain by a digital-to-analog converter and added to the mixer inputs in FIG. 31; 2) Naturally occurring thermal noise that exists for free in all electronic devices with a white narrowband spectrum can be spectrally filtered, e.g. by an LCR circuit, amplified if needed, and then be input to the mixer. Both these schemes have been used successfully in prior work on emulations of large-scale stochastic biochemical reaction networks.

It is worth noting that we have used the trick of converting floating transadmittances into equivalent grounded ones through our use of raising and lowering transadmittance mixers, which we have mentioned previously with respect to transadmittances. FIG. 30 implicitly uses this trick as well.

Transadmittances themselves have noisy currents, e.g., as in tunneling currents in a Josephson junction that may lead to stochastic and Poisson tunneling of quantum particles. The simplest way to emulate such noise sources is already found in electronics. Every deterministic diffusion (but not drift current) current has associated with it, a deterministic mean current, but also in parallel, a random Poisson current generator that obeys the classic shot noise power spectral density relations seen in white noise. Thus, we can easily add such noise sources to our emulation. If physical subthreshold electronic devices are used to emulate quantum and quantum-inspired systems, such emulation can be automatic, since such shot noise is already present, but artificial amplification of such noise is often needed when very low numbers of particles are present.

Finally, we may wonder how the electric field noise relates to thermal noise, kT, as in FIG. 30 or FIG. 31. The Planck version of the equipartition theorem along with zero-point quantum fluctuations provides the needed power spectral density, which is related to kT. In practice, emulations will just have a programmable variable that can be adjusted with simple means, such as a digitally programmable digital-to-analog converter that converts programmed bits into analog currents or voltages that affect the noise amplification or power spectral density.

In general, digitally programmable analog circuits can be used for the setting of all parameters that we have described including voltage biases, current biases, and other needed parameters, as is now common in the digital age. Such programmability combines the flexibility and robustness of digital design with the efficiency of analog emulation of physical systems.

Thus far, all of our emulations have involved voltage-mode transconductor-capacitor circuits. However, it will be obvious to those of ordinary skill in the art of analog circuits that such emulations could be easily converted to current-mode equivalents or equivalents with inductors and mutual inductances.

Figure 33A:
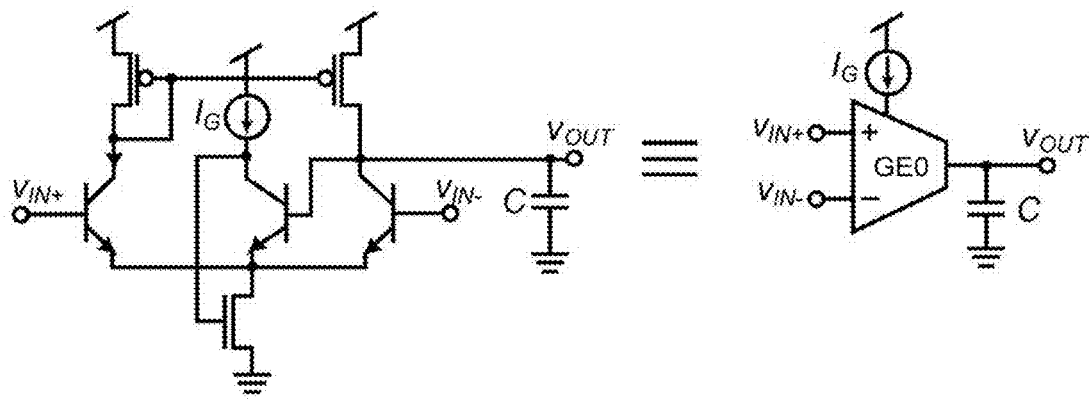
FIG. 33A illustrates a well-known circuit for a current-mode transconductor.
Figure 33B:
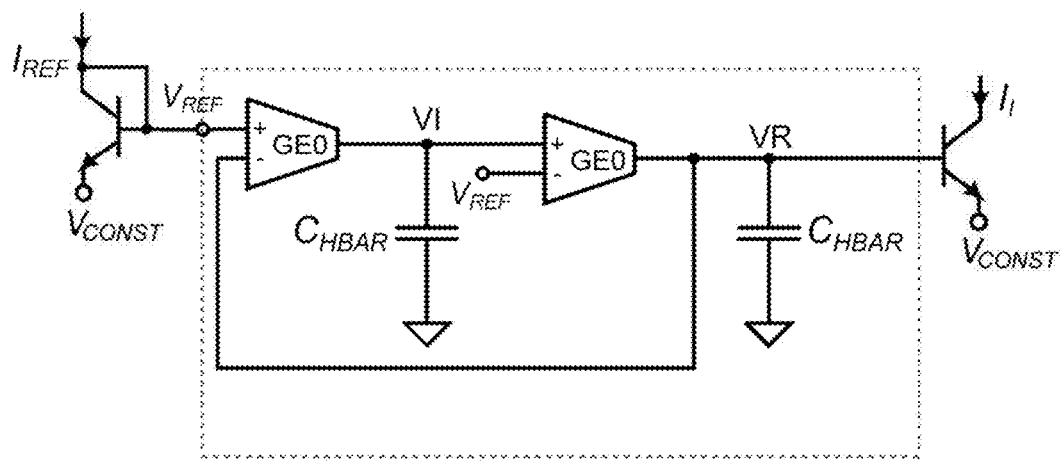
FIG. 33B illustrates how voltage-mode transconductor-capacitor circuits can be converted to current-mode transconductor-capacitor circuits that operate with a current input and output rather than with a voltage input and output.

FIG. 33A illustrates a well-known circuit for a current-mode transconductor and FIG. 33B illustrates how voltage-mode transconductor-capacitor circuits can be converted to current-mode transconductor-capacitor circuits that operate with a current input and output rather than with a voltage input and output. Such circuits use a logarithmic current to voltage converter, replace voltage-mode transconductor-capacitor circuits with equivalent current-mode versions in FIG. 33A, and then exponentiate the desired output back to current as shown. In fact, we have intentionally shown how our emulated quantum admittance circuit in the voltage domain could be exactly transformed as an example in FIG. 33A and FIG. 33B.

Similarly, Planck inductors can replace Planck capacitors and mutual inductances can replace transadmittances to create a substantially equivalent circuit. In such cases, a parallel-to-series or series-to-parallel transformation can transform nodal equivalents to loop circuits and vice versa.

Figure 34A:
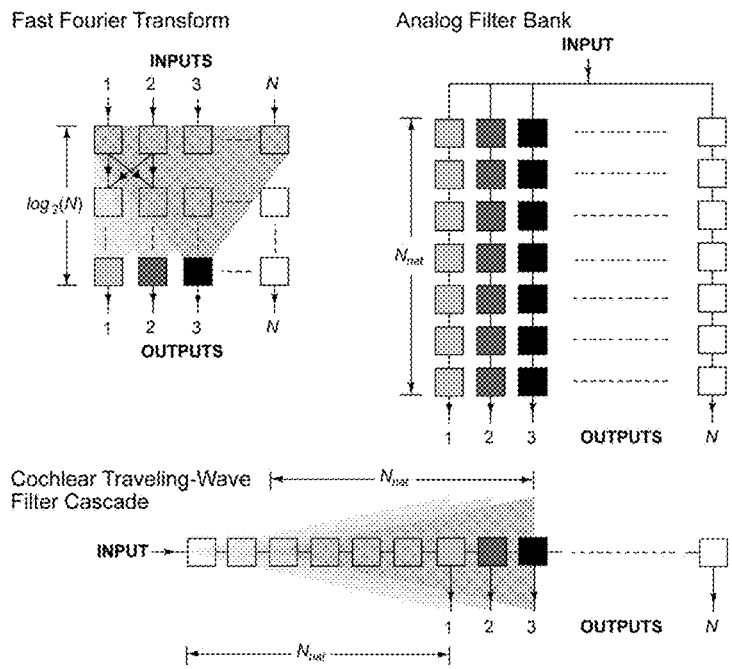
FIG. 34A illustrates why the biological cochlea, which uses an exponentially tapered traveling-wave architecture for spectrum analysis, is more efficient in its use of hardware resources than the Fast Fourier Transform or an analog filter bank.

FIG. 34A illustrates why the biological cochlea or inner ear, which uses an exponentially tapered traveling-wave architecture for spectrum analysis, is more efficient in its use of hardware resources than the Fast Fourier Transform (FFT) or an analog filter bank for spectrum analysis. Suppose this filter bank has a total of $N=5N_{nat}$ filter outputs and $N_{nat}$ filters for every e-fold in frequency range. The Fast Fourier Transform exploits odd-even symmetry in its matrix and the logarithmic benefits of recursion to use $N \log_2 N$ hardware for N outputs. An analog bandpass filter bank needs N high-order filters, each with $N_{nat}$ first-order stages in cascade to precisely distinguish neighboring filter outputs from each other with a high-order rolloff slope, consuming $NN_{nat}=5N_{nat}^2$ outputs. The biological cochlea cleverly creates an exponential taper of low-order resonant lowpass filter stages, tapered from high frequency to low frequency with $N_{nat}$ filter stages per octave. These filters effectively implement a tapered traveling-wave filter-cascade.

Each filter stage in the cochlea is a resonant lowpass stage. Thus, regardless of where the filter is located in the exponentially tapering traveling-wave cascade, a scale-invariant block of $N_{nat}$ filters behind every spectrum-analysis filter output contributes to creating an output with a high rolloff slope. The remaining filters even further behind that are not resonant merely act as passthroughs having no effect on the signal. Due to the collective scale-invariant window at each spectrum-analysis output location in the cascade, one new filter is needed for each new spectrum-analysis output, rather than $N_{nat}$ for an analog filter bank. Thus, starting from the first octave, which cannot be collectively shared amongst many filter stages, the biological cochlea requires $6N_{nat}$ stages, the FFT needs $5N_{nat} \log_2(5N_{nat})$ and the analog filter bank needs $5N_{nat}^2$. Thus, the biological traveling-wave spectrum-analysis architecture is the best classical wideband spectrum-analysis architecture that is known, outperforming even the highly efficient FFT and the quadratically scaling analog filter bank.

Figure 35:
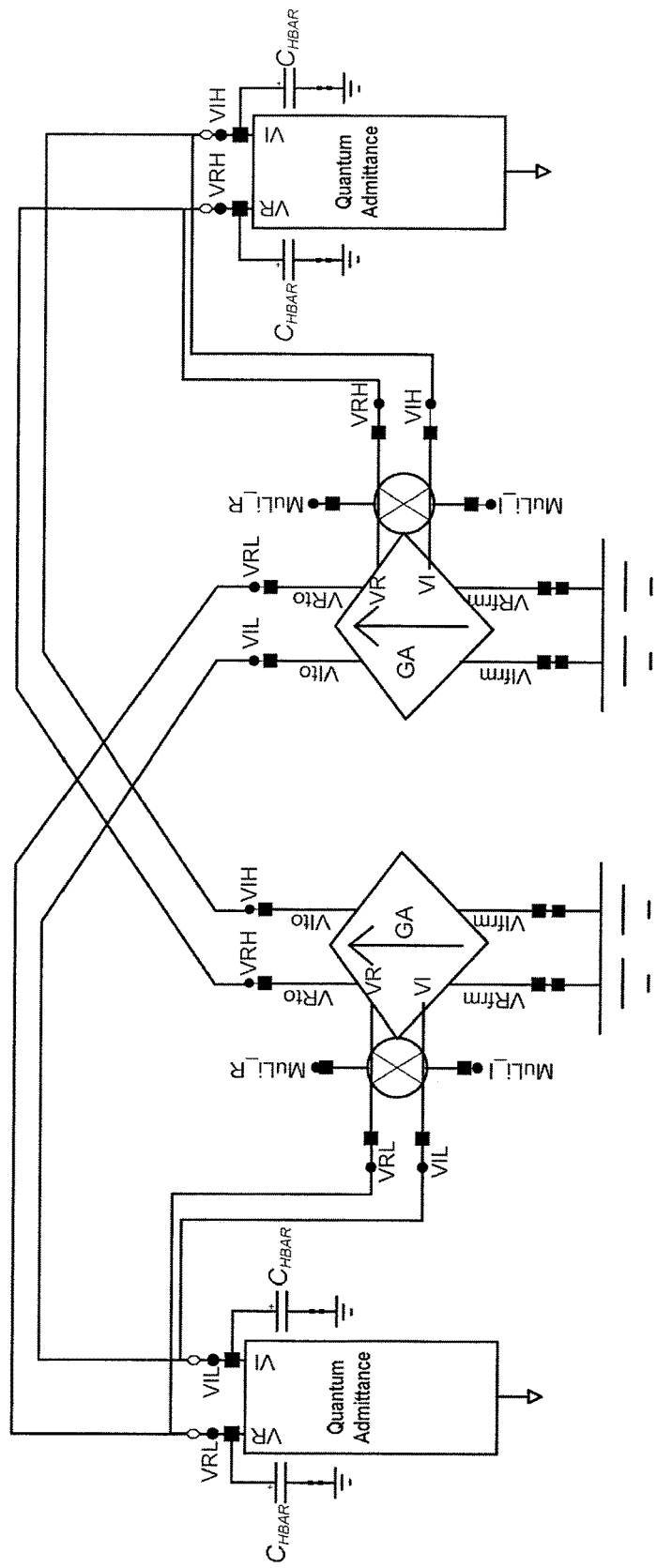
FIG. 35 illustrates the basic cochlear stage of an emulated quantum cochlea, a quantum two-state system, configured to sense resonant input with two admittances at different energy levels.

The key ideas of 1) passing non-resonant signals through or equivalently not affecting them; and 2) using some collective neighborhood of filters to contribute to sharper spectrum analysis is exploited in a novel bio-inspired architecture that we term a Quantum Cochlea. FIG. 35 illustrates the basic cochlear stage of a quantum cochlea, an emulated quantum two-state system, configured to sense a resonant input via a transadmittance-mixer (as we described in FIG. 15 as well and whose operation is shown in FIG. 19) with two emulated admittances at different transconductances or equivalently, energy levels. The input is a broadband signal whose spectrum we want to analyze. Luckily for us, such an elementary cochlear stage is already resonant and mostly only affected by signals in a certain neighborhood of frequency of the resonance. However, it is worth noting that non-resonant inputs do affect quantum two-state systems as is well known from the Fermi Golden Rule and sin c functions in quantum mechanics. Thus, the spectral resolving power of elementary quantum two-state systems is quite finite. We will show that the quantum cochlea improves on this resolution from a single cochlear stage significantly.

Figure 34B:
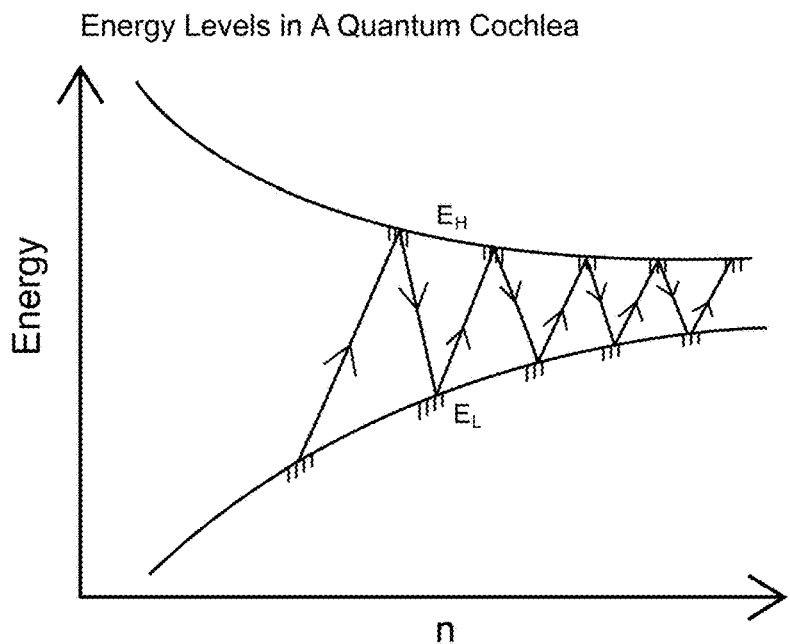
FIG. 34B illustrates how a graded exponential taper in the energy difference between quantum admittances in a traveling-wave architecture can mimick the biological cochlea and suggest the design of a novel quantum-inspired system, the quantum cochlea.

FIG. 34B illustrates the key idea behind a Quantum Cochlea. If we exponentially taper a cascade of emulated quantum two-state systems with transadmittance mixers such that the difference in their admittance transconductances (or equivalently energy) is an exponential, stages far away from a given stage will hardly affect the inputs that it is resonant with. Only certain stages in a neighborhood can collectively act on and affect inputs resonant with it. However, to create such an exponential taper, we will need to alternate the low-to-high versus high-to-low orientation of successive cochlear stages in a cascade to ensure that, where cochlear stages abut each other, emulated quantum admittances are at or nearly the same value such that high-energy admittances do not get shorted to low-energy admittances when cochlear stages abut and join, making for incompatible abrupt changes. Such changes will lead to reflections in a traveling-wave system like the quantum cochlea or in any transmission-line architecture. That is, we need to alternate cochlear stages in orientation, or as FIG. 34B shows, create coupled two state systems wherein the low-to-high energy taper goes in a zig-zag alternating polarization as we move along the cascade, but still with a gentle exponential taper.

Figure 36A:
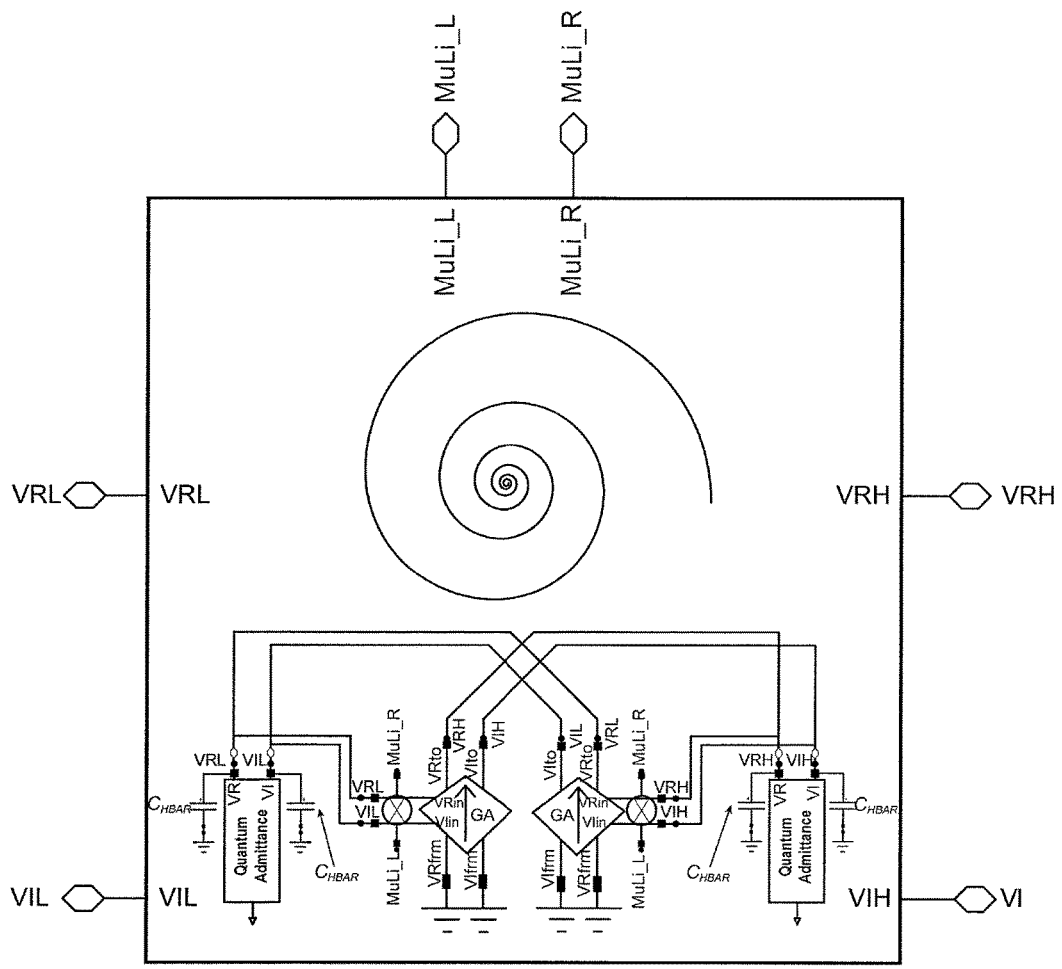
FIG. 36A illustrates a cochlear input-output symbol representation for a single cochlear stage.
Figure 36B:
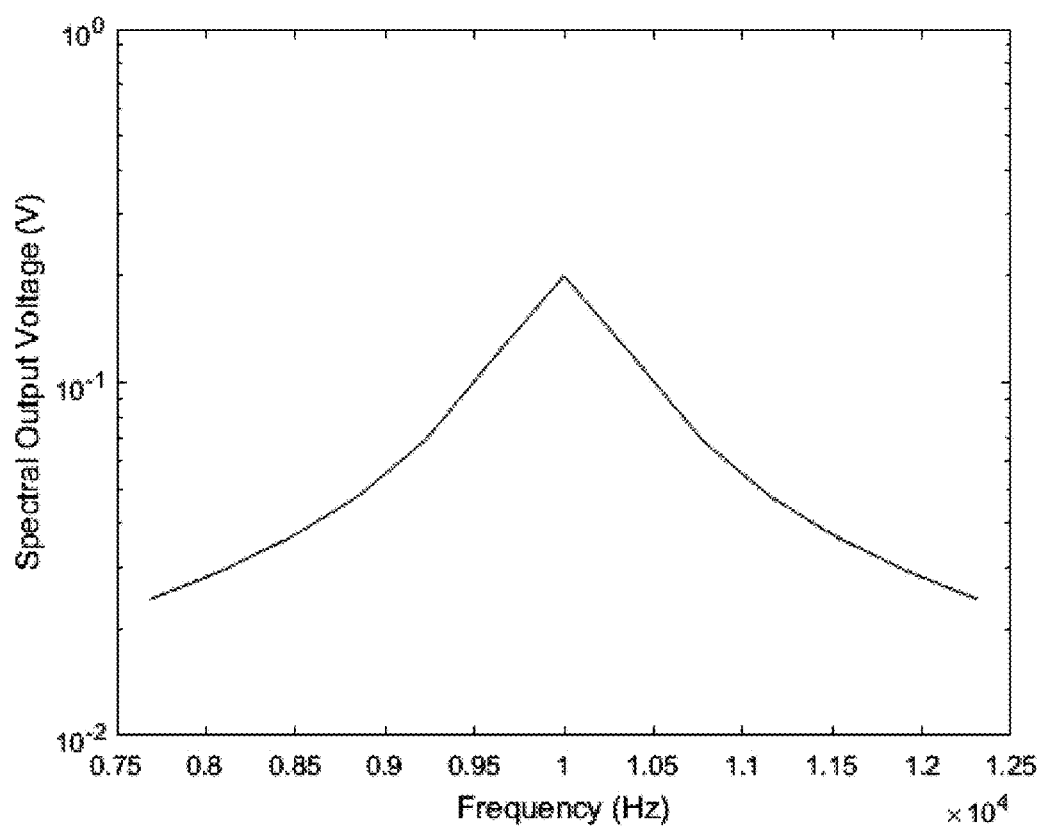
FIG. 36B illustrates that a quantum two-state system, such as that in a single cochlear stage, is not perfectly resonant and actually allows off-resonant coupling.

FIG. 36A illustrates a cochlear input-output symbol representation for a single cochlear stage and FIG. 36B shows its frequency response. FIG. 36B illustrates that a quantum two-state system, such as that in a single cochlear stage, allows off-resonant coupling as well. The off-resonant filter rejection is relatively gentle. Note that off-resonant coupling is important in evaluating quantum noise (as we have shown in FIGS. 30A, 30B, 31, and 32). It leads to the well-known sin c-based Fermi golden rule for probabilistic transitions.

Figure 37A:
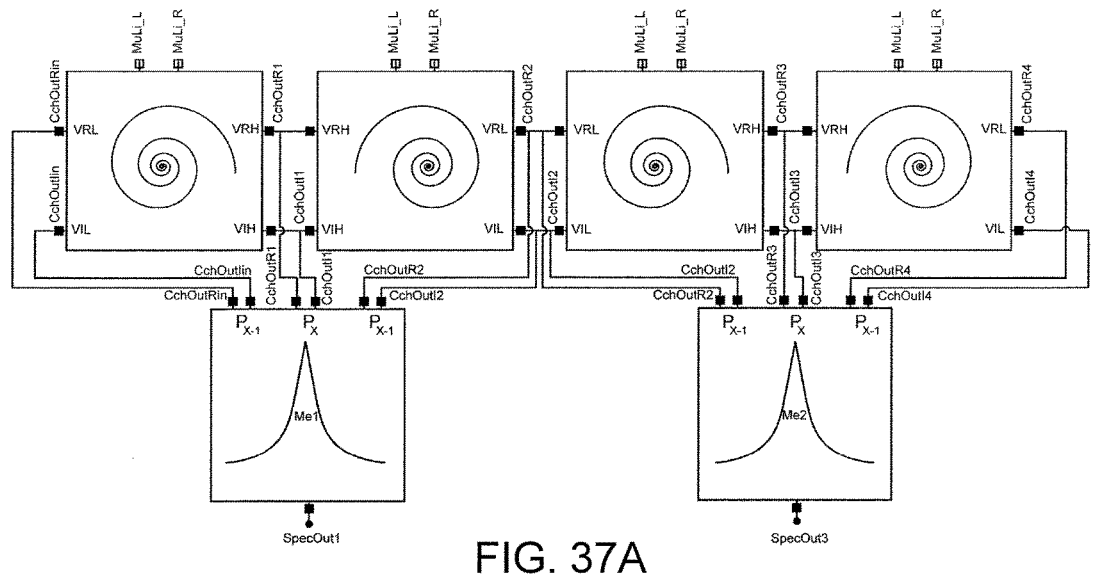
FIG. 37A illustrates how cochlear stages with alternating orientation are cascaded to form an architecture suitable for spectral analysis, the quantum cochlea, and how probability-based pattern-recognition circuits that are intended to sharpen cochlear frequency resolution can be constructed.
Figure 37B:
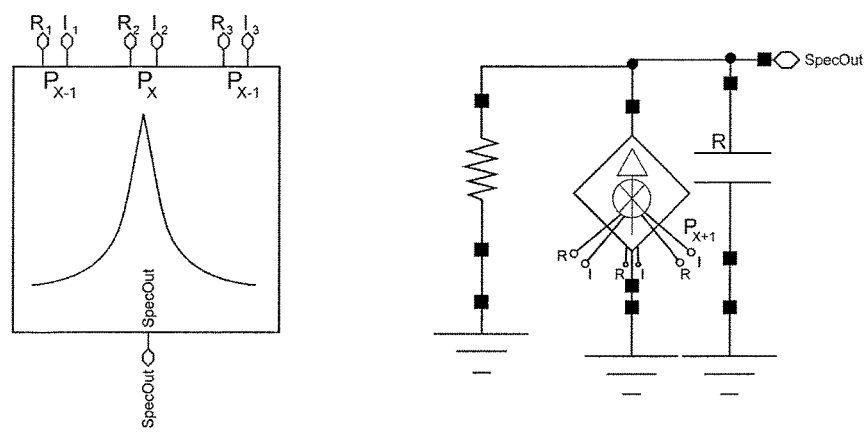
FIG. 37B shows a symbol and a circuit for the construction of probability-based pattern recognition circuits.

FIG. 37A illustrates how cochlear stages with alternating orientation (as in FIG. 34B) are cascaded and how probability-based pattern-recognition circuits that are intended to sharpen cochlear frequency resolution can be constructed. The probability-based pattern recognition circuits exploit the collective action of just 3 neighboring cochlear stages to improve filter resolution and are represented by the peaky circuits. FIG. 37B shows a symbol and a circuit for the construction of probability-based pattern recognition circuits.

The probability pattern-recognition circuit is comprised of a set of 3 paired inputs ($R_1$, $I_1$), ($R_2$, $I_2$), ($R_3$, $I_3$) each corresponding to the real and imaginary parts of a complex signal, from which a squared-sum probability-like measure, $p_1 = R_1^2 + I_1^2$, $p_2 = R_2^2 + I_2^2$, $p_3 = R_3^2 + I_3^2$ of each of these signals is computed (for example from the $\sin^2\omega$ and $\cos^2\omega$ variables shown in FIGS. 20A and 21). An output current that is proportional to $(1-p_1)p_2(1-p_3)$ is generated via a multiplicative transconductance circuit (a classical mixer circuit suffices since probabilities are real and do not need a complex mixer). The output current of the transconductance is filtered by a parallel RC circuit to generate an output voltage that is largest when patterns of correlated probability in the input that follow a Low-High-Low pattern are dominant with 1/RC determining the averaging bandwidth for estimating such correlations.

The motivation for the probability-based pattern-recognition circuit for recognizing the Low-High-Low pattern can be seen in FIG. 34B. At three adjacent stages, the gentle exponential taper and the fact that emulated quantum two-state systems with transadmittance mixers will have off-resonant absorption imply that, near an optimal resonant frequency, but not too far from it, there is a probability that two neighboring low-energy admittances have both responded to the input and transferred probability from the ground states to the excited state in their middle. The alternating cochlear orientation enables such transfer from two raising transadmittance mixers naturally.

Figure 38A:
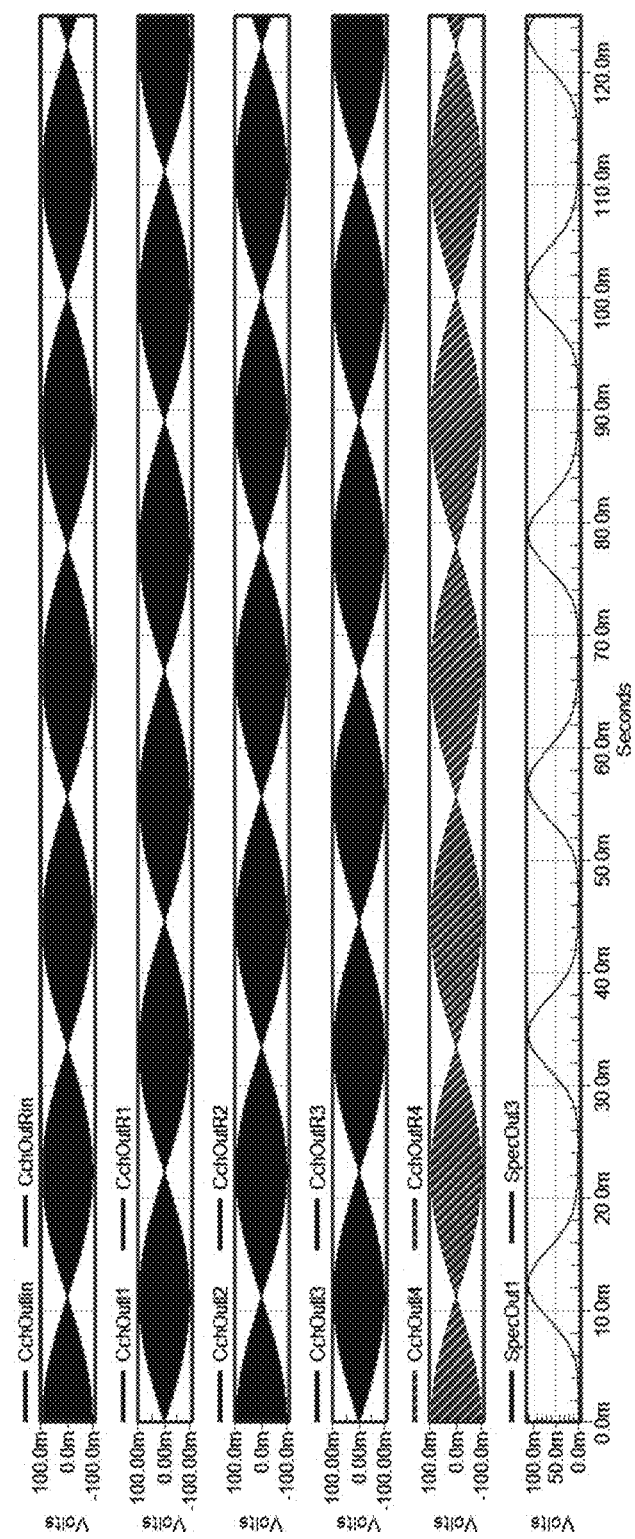
FIG. 38A shows large-amplitude modulation of the probability-based pattern recognition circuits when the cochlear input is resonant for a flat 4-stage quantum cochlea with no exponential taper.
Figure 38B:
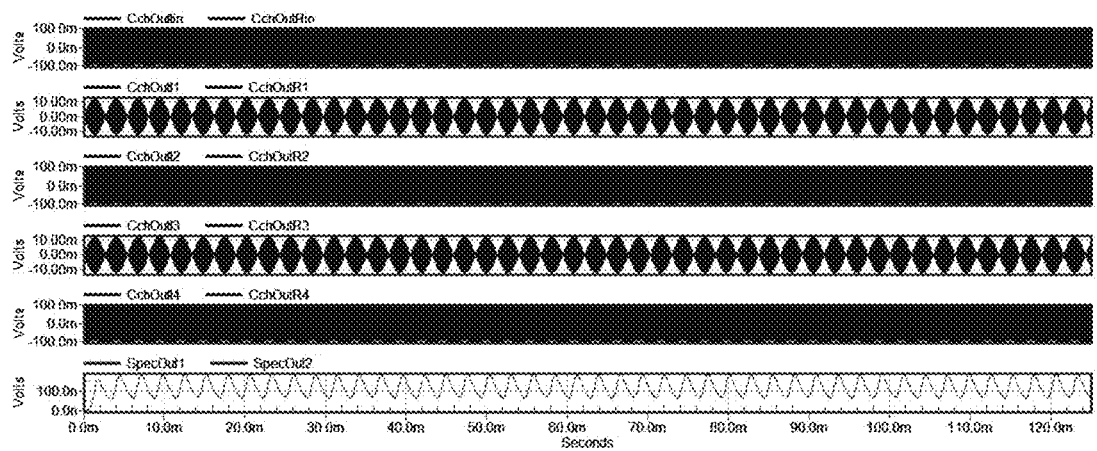
FIG. 38B shows small or negligible (100 nV vs. 100 mV in FIG. 38A) amplitude modulation of the probability-based pattern-recognition circuits when the cochlear input is below resonance for a flat 4-stage quantum cochlea with no exponential taper.
Figure 38C:
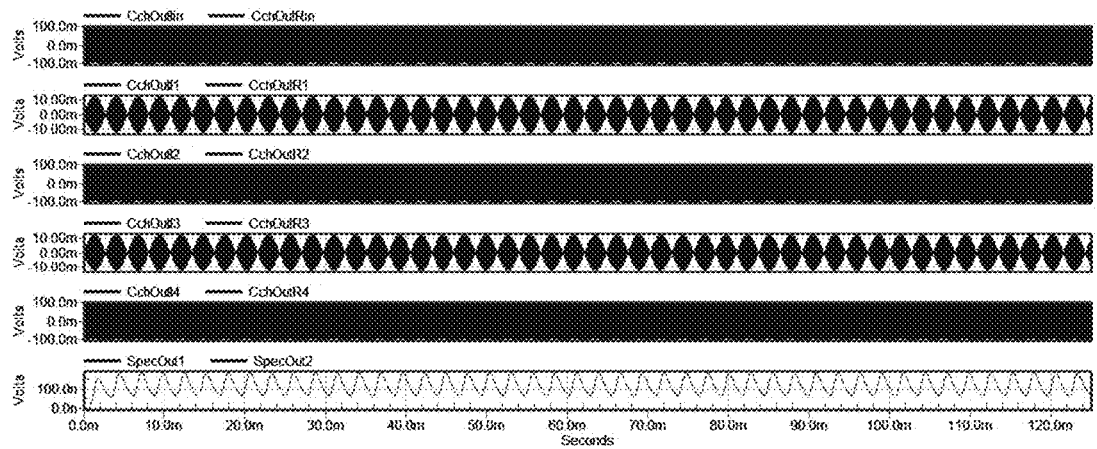
FIG. 38C shows small or negligible amplitude modulation of the probability-based pattern-recognition circuits when the cochlear input is above resonance for a flat 4-stage quantum cochlea with no exponential taper.

To get some insight, we can first study a quantum cochlea with just four stages and no taper (the one in FIG. 37A that we have already described). FIG. 38A shows that at the optimal resonant frequency, the Spectral Output Circuits (the probability-based pattern recognition circuits), termed SpecOut1 and SpecOut3 in FIG. 37A have a nice modulation pattern triggered by the Low-High-Low pattern of activation in the cochlear outputs. The usual NMR-like two-state oscillatory behavior is seen in the quantum cochlear outputs (like that in FIG. 19). The modulation frequency of the spectral outputs is, as expected, input signal-strength dependent. Thus, we can detect a signal and get amplitude information from frequency, a nice robust method for signal detection that is already built into NMR systems as we have discussed before. Such a scheme enables a longer time for detecting fainter signals and vice versa, a classic gain-bandwidth tradeoff. In contrast, off-resonance (FIG. 38B is lower than resonance and FIG. 38C is higher than resonance) the patterns of activation of the cochlea are more complex and lead to very weak activation (100 nV vs. 100 mV) of the spectral outputs. They are also symmetric.

Figure 39:
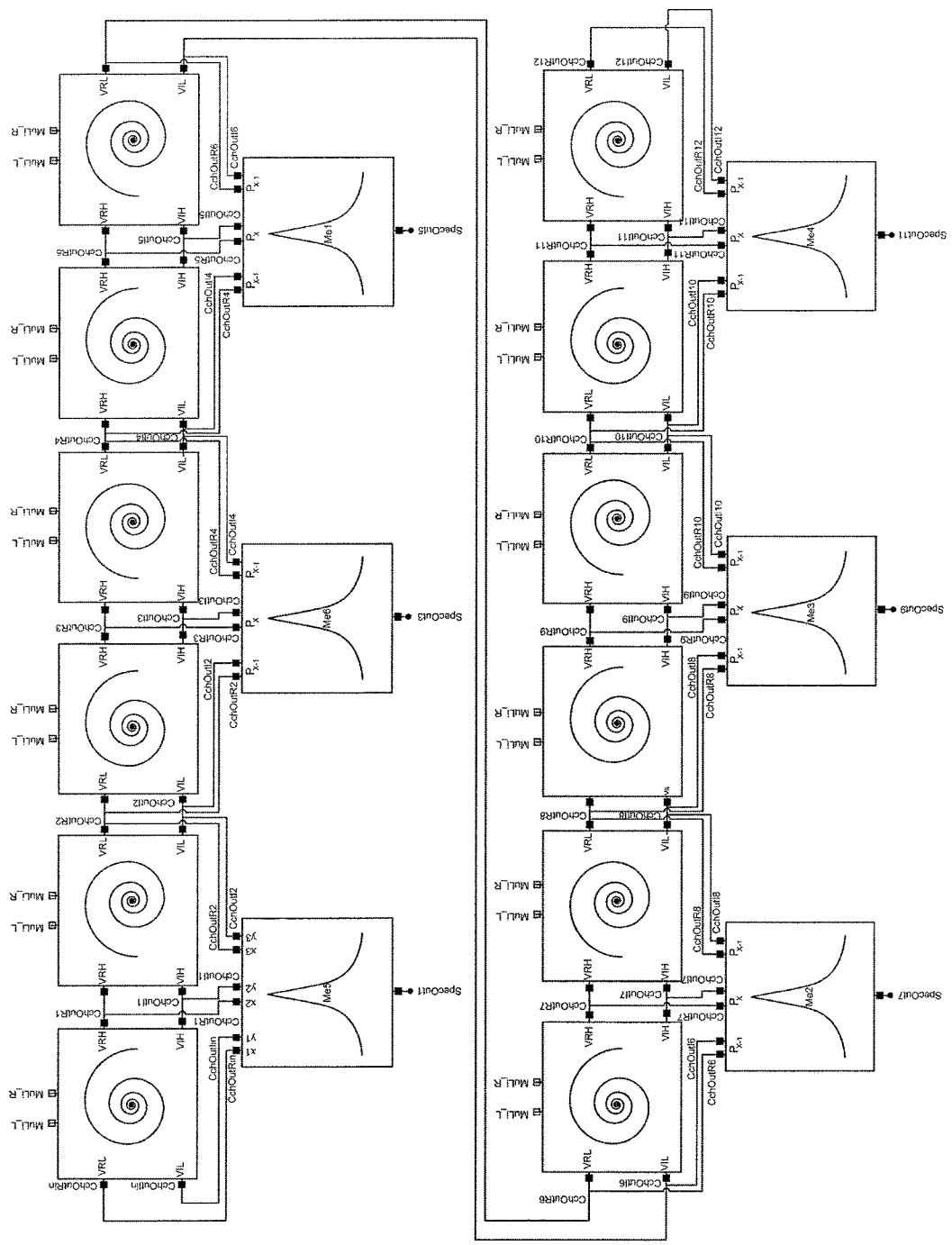
FIG. 39 shows the architecture of a 12-stage quantum cochlea.
Figure 40:
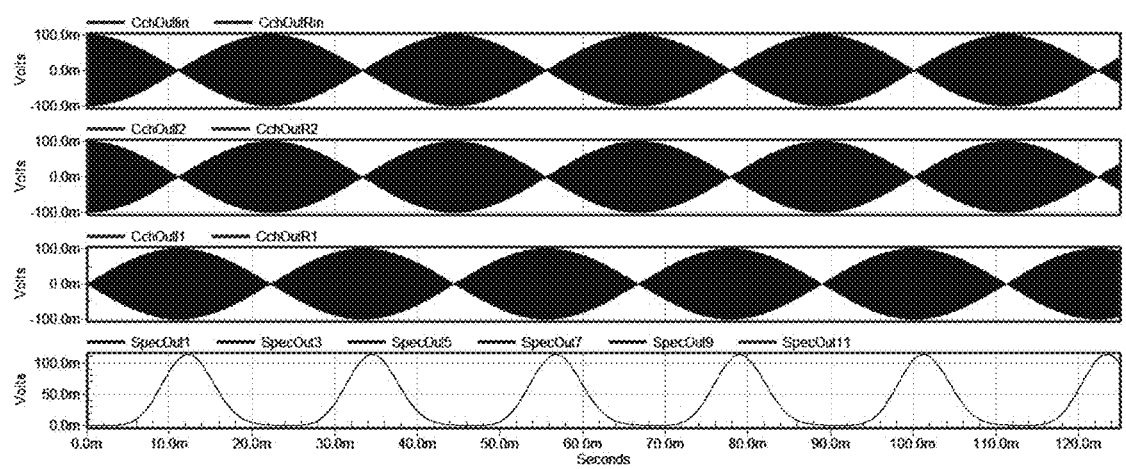
FIG. 40 confirms strong resonant modulation in the 12-stage quantum cochlea as in the 4-stage quantum cochlea with no taper.
Figure 41:
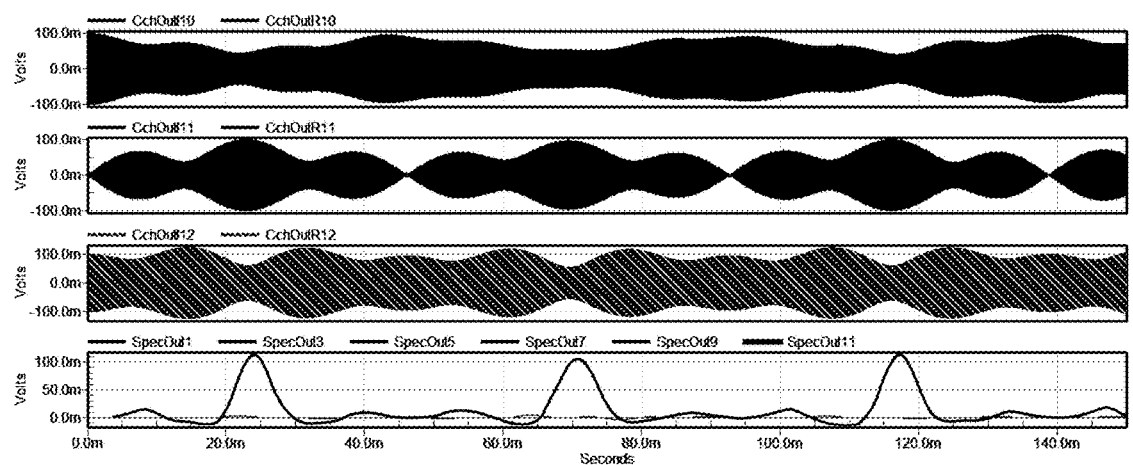
FIG. 41 shows that in the 12-stage quantum cochlea, exponentially tapered over 1 octave in frequency with 1 semitone per stage, there is still strong resonant modulation but only at SpecOut11, the $11^{th}$ output where the cochlear input is resonant.

FIG. 39 shows a 12-stage quantum cochlea. FIG. 40 shows that when there is no frequency taper, the pattern of activation is similar to that of the 4-stage quantum cochlea that we have already discussed in FIG. 38A at resonance. However, if we taper it over an octave with a gentle exponential taper, i.e, we use 12 semitones per octave, the pattern of activation is different. Only the on-resonance SpecOut 11 (the response of the probability pattern recognition circuit centered around the 11th stage) output yields significant output at the tested relatively low-frequency input while all the other outputs are nearly zero showing good frequency selectivity. The taper also yields some gentle reflections (the undershoots in SpecOut11, which are not seen in the flat-taper outputs of FIG. 40) as would be expected in a bidirectional traveling-wave transmission-line-like architecture like that of the cochlea. We found that increasing the gain of the forward transadmittance mixer w.r.t. the backward transadmittance mixer in FIG. 35 to encourage propagation along the cascade helped reduce such reflections. The actual biological cochlea exhibits such effects as well, one of the reasons we have otoacoustic emissions.

Figure 42:
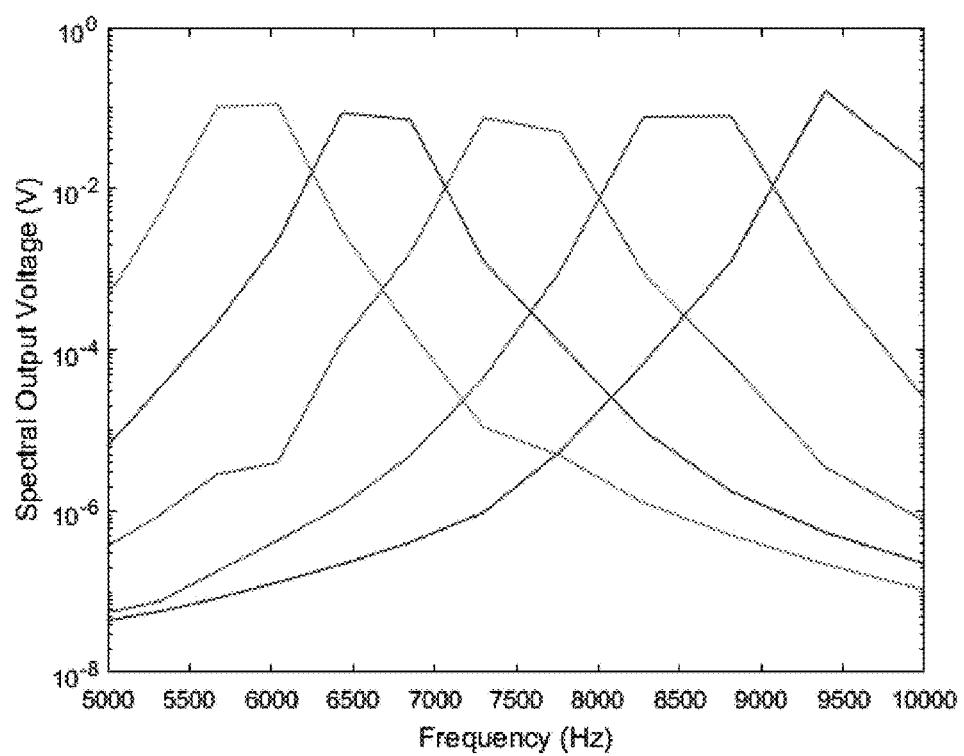
FIG. 42 shows that the quantum cochlea has a spatial response profile that is selective to its input frequency as one would expect of a spectrum analyzer and that its out-of-band rejection is significantly greater than that of a simple cochlear stage with no probability pattern recognition (FIG. 36B).

The spatial frequency response profile of the 12-stage exponentially tapered quantum cochlea is shown in FIG. 42. As expected of a cochlea, and as in the biological cochlea, the peaks for low-frequency correspond to the later stages and the peaks for high frequency correspond to the earlier stages. Thus, by design, the quantum cochlea does indeed map frequency to place as the biological cochlea does and proves that the spectrum-analysis has been successful. All stages have a relatively scale-invariant profile though there are small edge effects for boundary stages without any neighbors. Compared with the single-cochlear stage no-probability-pattern-recognition response of FIG. 36B, we see that the frequency response has significantly better off-resonance rejection (many orders of magnitude better). The coupling of the stages with slightly different admittances all contributing to the frequency response leads to an almost ideal flat passband response.

The Quantum Cochlea has some interesting features not seen in the biological cochlea: The mixing input is all in parallel to all stages even though the stages are in a cascade; the amplitude of the input is encoded in the frequency modulation of the cochlear output stage.

It is possible to introduce gain control into the quantum cochlea using the circuits that we have described that exploit parametric amplification, controlled instability, parametric attenuation, and nonlinearity. For example, we can purposely introduce loss at high amplitudes when we sense very high modulation frequencies signaling a strong input (via parametric attenuation) or parametrically amplify at weak signals when we sense very low modulation frequencies. Unlike many spectrum analyzers that have been proposed in quantum computing, the cochlea does not need infinite Q to operate (and does not have it in biology). Thus, quantum-inspired systems that operate with loss are feasible. For example, the lossy-NMR-like waveforms of FIGS. 28 and 29, and the example control architectures that we have described (e.g. FIG. 27A) prove that lossy quantum-inspired systems can lead to interesting dynamics. The biological cochlea also has nonlinear hair cells with saturating nonlinearities that automatically perform gain control, just like the saturating tan h amplifiers of our emulated quantum admittances.

One obvious generalization of our quantum cochlea is to explore if higher-order pattern recognition can be used. Certainly, it will help improve the spectral resolution at the cost of complexity. For example, we could look for other multiplicative patterns of correlated probability amongst the inputs such as $p_1 p_2 p_3$ or $(1-p_1)p_2$ in a High-High-High or Low-High-Neutral pattern respectively or any other combinatorial such combination of 3 inputs. The multiplicative design of only the transconductance portion of the circuit in FIG. 37A would need to change.

The Quantum Cochlea, could be implemented in physical quantum hardware. In such cases, physical quantum two-state systems such as those involving atoms, electrons, ions, spins, or Josephson junctions with different energy levels would replace the quantum two-state emulation circuits, and correspondingly electromagnetic waves, electric, or magnetic fields, or voltages would serve as the cochlear input. The atoms, electrons, ions, spins, or Josephson junctions would need to be coupled to each other via approximately-nearest-neighbor coupling in an exponentially tapered fashion to create the cochlear cascade FIG. 43A shows how other examples of traveling-wave systems besides the quantum cochlea can be emulated. In this case, we have chosen the Schroedinger equation, since it is well known, and therefore provides intuition. As shown, it can be emulated by nearest-neighbor quantum admittance and transadmittance circuits. The second spatial derivative term in Schroedinger's equation due to momentum or mass and kinetic energy is reflected in A. The effective mass in Schroedinger's equation is $\hbar^2/(2Ab^2)$ where b is the discrete sampling interval of the lattice grid used to represent continuous space. The spatially varying potential is reflected in the spatially varying admittance or energy values of the quantum admittances, shown with different values at adjacent locations in FIG. 43A. As we have shown for the biological cochlea and several of our other embodiments, we could map this distributed quantum dynamical system to one using emulated quantum admittances with real and imaginary parts (2 parts instead of 1 for all A transadmittances, admittances, and Planck capacitors).

A real emulation of Schroedinger's equation would also convert the floating transadmittances to two grounded ones at each location. To do so, we add 2A to each quantum admittance. Then, we add two quantum transadmittances proportional to A that cross couple between neighboring locations in a symmetric fashion only. With this transformation, Schroedinger's equation also becomes a set of coupled two-state systems just like the quantum cochlea. However, it has transadmittances rather than transadmittance mixers as in the quantum cochlea. An abrupt potential well is emulated by profiling $E_0$ to have a high admittance energy at the edges and a low one in the center.

FIG. 43B shows how multi-input and nonlinear quantum transadmittance circuits can implement effects such as the inhibition of a quantum particle's transport in a traveling-wave quantum system by the presence of a strong probability amplitude at a neighboring location, e.g., due to electron-electron repulsion caused by the motion of many simultaneous electrons in the lattice. In this case, we have shown inhibition of A, a place holder for a functional attenuation of quantum transport (indicated by the T junction synapsing on the A generator), if there is high probability at neighboring locations. Any lattice model could be emulated by choosing the appropriate traveling-wave parameters and interaction functions.

One important benefit of quantum systems is that they can simultaneously be in a superposition of many states even if we cannot access all of them simultaneously. We show how this benefit can be emulated as well, with an efficient use of classical resources using our circuits.

FIG. 44 shows how N+1 classical emulated quantum two-state systems in a complex mixing chain with different emulated quantum-admittance energies that are 2× further apart than each previous two-state system in the chain and N complex emulated quantum mixers can be used to create an architecture that can enable a superposition of $2^N$ quantum states. These states can have arbitrary complex amplitudes and are simultaneously represented in the spectrum of two output classical signals. In this case, we use the voltage-in, voltage-out embodiment of our transadmittance complex mixer that we have discussed previously, or simply convert its current outputs to a voltage output with an impedance circuit element.

The core idea is that each complex mixing operation in a cascade exponentially multiplies the possibilities of discrete spectral content by 2, with each spectral line corresponding to one eigenstate possibility of a quantum system. All possibilities are simultaneously represented in the spectrum in two signals, implicitly being stored in the time domain. We always need two signals to keep phase and amplitude at every eigen-possibility in the system intact. The complex mixing preserves the phase and amplitude of all previous spectral content by ensuring that the successive mixing operations do not cause new spectral content to destroy any old spectral content. Such a constraint necessitates that the energies of the successive emulated quantum admittance at each level at least double. The new content merely modulates the old possibilities with more options in the tree without destroying any branches taken before.

More formally, the classical circuit shown in FIG. 44 architecture represents a superposition of $2^N$ quantum states as the spectrum of two real and imaginary output classical signals. The circuit hardware resources are proportional to N+1 as can be easily seen from the figure. These comprise N emulated quantum two-state systems, indexed by k=0, 1, 2, 3, ... N, with each two-state system with two emulated quantum admittance circuits with quantum admittance values of $+iE_0 2^k$ and $-iE_0 2^k$. The complex outputs of each of the two admittances at each level are summed to architect a superposition of two states within each two-state system. These are then mixed, in a complex mixer, with analogous superposed signals from the corresponding two-state system with index k+1 such that the resulting mixed signal creates a new signal that represents a superposition of $2^{k+1}$ states at distinguishable frequency locations. We then re-initiate this process in a recursive fashion such that recursive process initiates at k=0 and terminates at k=N−1, the final output signals will represent a superposition of $2^N$ quantum states.

For maximum superposition capabilities, the probability of the two states of each of the emulated two-state quantum systems of any index k is ½. In this case, the superposition of all $2^N$ quantum states in the final output signal has an equally balanced probability amongst all states, as for well known Hadamard basis functions in quantum computing.

The initial-condition probability amplitudes of the states of each emulated two-state quantum system with index k are transiently established with the use of transadmittance mixer circuits and configured with a control input resonant with the energy difference between the two states corresponding to k. Thus, N+1 resonant control inputs can transiently couple all the two emulated quantum admittance circuits within a two-state system to establish or alter their initial conditions but then be subsequently turned off (as we have discussed previously for controlled pulse lengths in NMR). Hence, we can enable write capability that also scales with N+1 hardware resources.

Now, if any of the k=0, 1, 2, ... N−1 output signals from successive stages of the recursive architecture of FIG. 44 are fed to the Quantum Cochlea the emulated quantum states of the superposition may be spectrally analyzed and measured, without destroying the superposition as would occur in an actual quantum system. The cost of doing so requires that the cochlea to have sufficient spectral resolution. Fortunately, we see from FIG. 34A, that, in all cases, analog cochlear scaling is linear rather than quadratic in the number of spectral outputs that it needs to resolve, and therefore superior to an analog filter bank that would be otherwise needed, or even a Fast Fourier Transform.

Note that a different set of exponentially spaced $E_k$ can be used as well with the exponential radix not necessarily being 2. The $E_k$ must just be sufficiently different from one another such that all quantum-state superposition information in the spectral domain is preserved by one or more cascaded complex mixing operations.

When an emulated quantum or quantum-inspired system is actually used, it is useful to have a means to setup the initial conditions of all the emulated quantum admittances appropriately. FIG. 45 shows an architecture for how a classical analog input signal can be used to efficiently encode initial conditions in an emulated quantum system with quantum admittances and quantum transadmittance mixer building blocks, a capability useful in many quantum computing applications, particularly spectral ones, that exploit quantum superposition.

The circuit architecture comprises 2(N+1) emulated quantum-admittance circuits attached to $C_{HBAR}$ capacitors indexed by k=0, 1, 2, ... N with quantum admittance energies of $-iE_0 2^k$ and $+iE_0 2^k$ at each k and 2(N+1) associated emulated quantum transadmittance mixer circuits. All mixer circuits receive a classical signal $V_{in}$ at one of their real or imaginary inputs, and mix it with complex real-and-imaginary signals output by the emulated quantum admittances to create current outputs. These outputs are averaged on a capacitor for a fixed period of time to create 4(N+1) real and imaginary output signals. The output signals then represent either spectral-analysis outputs of the input signal $V_{in}$ or a means for using $V_{in}$ to establish initial conditions on quantum or quantum-inspired state variables. The averaging capacitors can be replaced by leaky capacitors with time constant RC such than an analog continuous running average may be obtained.

If the circuit architecture of FIG. 45 is used to establish initial conditions for the superposition circuit architecture, the emulated quantum admittances within the emulated two-state systems in FIG. 44, which are identical to those in FIG. 45, can be shared via multiplexing.

Our work could be useful in controlling an actual quantum system by using the emulator as a real-time Kalman-filter (the emulator is a model of the actual system and is therefore efficient in controlling it).

What is claimed is:

1. A circuit comprised of:
   two classical circuit elements each of which emulates a quantum admittance with their transconductance being proportional to the uncoupled eigenstate energy of the corresponding quantum state;
   four capacitors of value $C_{HBAR}$ that are connected to the real and imaginary terminals of each of the said circuit elements with the capacitor value $C_{HBAR}$ proportional to the quantum Planck constant; and
   two other classical circuit elements each of which emulates a quantum transadmittance that causes the probability amplitude of one state of a quantum two-state system to be dynamically changed by the probability amplitude of the other state,
   wherein said circuit facilitates the emulation of a quantum or quantum-inspired two-state system.

2. The circuit of claim 1 wherein the quantum transadmittance coupling is symmetric.

3. The circuit of claim 1 wherein the quantum transadmittance coupling is asymmetric.

4. The circuit of claim 1 wherein each of the two emulated quantum transadmittances are replaced by emulated quantum transadmittance mixers.

5. The circuit of claim 4 wherein the two quantum transadmittance mixers are configured such that one creates a positive complex exponential dynamic coupling between one state to the other while the other creates a negative complex exponential dynamic coupling between one state to the other.

6. The circuit of claim 4 for emulating quantum dynamics or steady-state behavior corresponding to two-state quantum spin systems in nuclear magnetic resonance, optical control of atomic energy transitions between two energetically different or energetically identical states, or for the emulation of qubit control and dynamics in quantum or quantum-inspired computing.

7. The circuit of claim 4 for emulating the effects of pulse-based quantum control and state preparation that architects Bloch-sphere phase changes of a qubit corresponding to a fixed control input pulse length.

8. The circuit of claim 1 for emulating local quantum interactions in distributed quantum systems including for the emulation of nearest-neighbor coupling as in Schroedinger's equation or the emulation of nearest neighbor coupling in quantum particle motion in solids.

9. The circuit of claim 1 wherein the quantum transadmittance elements or the quantum transadmittance mixer elements are configured to implement current-conserving floating interactions between the two quantum states.

10. The circuit of claim 1 wherein any of the quantum admittance or transadmittance, elements exhibit nonlinear operation.

11. The circuit of claim 1 configured to measure or emulate current-voltage characteristics seen in a quantum Josephson junction.

12. The circuit of claim 1 wherein the quantum transadmittance elements are configured to have additional control inputs such that multi-particle interactions in quantum systems or modulations of the transadmittance current due to one input by another input can be emulated.

13. A classical circuit for computing signal variables that are monotonic functions of either the peak, absolute, or squared-signal amplitude deviation from a reference of either or both of the real or imaginary probability-amplitude voltage variables of an emulated quantum-admittance circuit, both of whose outputs are connected to $C_{HBAR}$ capacitors.

14. The circuit of claim 13 wherein such real and imaginary signal deviations are measured from differential signals in a transistor circuit emulating the quantum admittance.

15. The circuit of claim 14 wherein the squared-signal deviation of either the real or imaginary component of the probability amplitude is generated by a stack of two transistors in series each of which is configured to have a current-scaling ratio, nominally at 4, with respect to transistors whose currents differentially represent the real or imaginary components of a probability amplitude.

16. The circuit of claim 14 wherein each differential signal is multiplied with itself in a differential-mixer transistor circuit to generate squared-signal deviations.

17. Any circuit of claim 13 wherein the computed signal variables are used to estimate a signal monotonically related to the probability of an emulated quantum signal with real and imaginary parts by summing or monotonically combining circuit outputs corresponding to the real and imaginary portions of said circuit.

18. Any circuit of claim 17 wherein the probability is automatically normalized to a value proportional to an adjustable bias current regardless of whether the real and imaginary components of a quantum signal are operating in a small-signal linear regime or large-signal regime.

19. A classical circuit that takes the difference of the outputs of the circuit of claim 15 and generates output signals whose energy is dominantly at twice the frequency of that of either the real or the imaginary signals of the quantum admittance.

20. A classical circuit that uses the output signals from the circuit of claim 19 to alter the bias currents of transconductors in an emulated quantum admittance circuit in a feedback fashion such that one can parametrically amplify or attenuate the probability-amplitude signals connected to the quantum admittance circuit.

21. The circuit of claim 4 wherein, to improve resonant mixing under a finite quality factor, only one of a raising or lowering operator is emulated in the system in a particular direction of coupling between emulated quantum states.

22. The circuit of claim 1 wherein the relationships between damping and noise fluctuations between two quantum states of low and high energy or equivalently oscillation frequency is emulated by introducing one floating forward transadmittance-mixer classical circuit from low-to-high energy and one floating backward transmittance-mixer circuit from high-to-low energy, and wherein the mixer inputs are driven by environmental fluctuation noise inputs configured such that higher environmental forcing noise at high frequencies or equivalently higher energies, leads to a lower probability of occupation of the high-energy state with respect to the low-energy state.

23. The circuit of claim 22 wherein the floating transadmittance mixers are replaced by two equivalent grounded transadmittance mixers, also configured with asymmetric environmental noise to correctly emulate fluctuations and damping.

24. The circuit of claim 22 wherein the environmental noise is created by summing inputs from many frequencies on and near the two-state resonant transition frequency that have a random phase relationship to each other.

25. The circuit of claim 22 wherein the environmental noise is created by a digitally programmable pseudo-random-noise generator.

26. The circuit of claim 22 wherein the environmental noise is created by amplifying naturally occurring thermal or white noise in transistors or in other electronic devices.

27. The emulation of noise and damping in quantum dynamical systems or quantum-inspired dynamical systems that utilize the circuit of claim 4 for such emulation wherein all transadmittance mixers that are used for emulating the system, including those used for having measurement states that correlate with actual quantum states, have in addition to their deterministic current flow, a noisy current flow in parallel with the deterministic current flow, which is generated by adding appropriate environmental noise to the transadmittance mixer control inputs.

28. The emulation of noise and damping in quantum dynamical systems or quantum-inspired dynamical systems that utilize the circuit of claim 1 for such emulation wherein all transadmittances that are used for emulating the system, including those used for having measurement states that correlate with actual quantum state, have in addition to their deterministic current flow, a noisy current flow in parallel with the deterministic current flow, which is generated by adding a random shot-noise current proportional to the deterministic current flow.

29. The circuit of claim 1 wherein its emulated quantum admittances are lossy and such loss is compensated for with an intentionally introduced small-signal instability that is stabilized by large-signal saturating nonlinearities in the transconductors to reach an equilibrium oscillation voltage amplitude at which there is no effective loss.

30. The circuit of claim 29 wherein a parasitic capacitance is introduced to create instability.

31. The circuit of claim 29 wherein parametric amplification with second-harmonic stimulation of bias currents of transconductors in the emulated quantum-admittance circuit is used to amplify said circuit's oscillation amplitude, such second-harmonic stimulation being generated from internal oscillatory currents within the circuit itself to create an amplifying positive-feedback loop.

32. The circuit of claim 29 wherein parametric damping with second-harmonic stimulation of bias currents of transconductors in the emulated quantum-admittance circuit is used to help attenuate said circuit's oscillation amplitude, such second-harmonic stimulation being generated from internal oscillatory currents within the circuit itself to create an attenuating negative-feedback loop.

33. The circuit of claim 29 with a first emulated quantum admittance circuit and a second emulated quantum admittance circuit, with the transconductance and oscillation frequency of the second circuit being different from that of the first circuit, and with the second circuit's complex voltage waveforms being mixed upwards or downwards by an emulated complex transadmittance mixer circuit such that they provide output currents at the oscillation frequency of the first, which are then used to parametrically amplify or parametrically attenuate the voltage amplitude of the first circuit via second harmonic stimulation of the first circuit's transconductor bias currents, such second-harmonic stimulation being generated from said mixer's output waveforms.

34. The circuit of claim 29 with a first emulated quantum admittance circuit and a second emulated quantum admittance circuit, with the transconductance and oscillation frequency of the second circuit being different from that of the first circuit, and with the second circuit's complex voltage waveforms being mixed upwards or downwards by an emulated complex transadmittance mixer circuit such that they provide output currents at the oscillation frequency of the first, which are then used to amplify or attenuate the voltage amplitude of the first circuit by increasing or decreasing a parasitic capacitance within it respectively.

35. The circuit of claim 1 comprised of a means for one its emulated quantum admittances to affect its other emulated quantum-admittance and vice versa in a feedback loop, one or both of which may incorporate additional slow or fast sensing dynamics on their probability amplitudes that is used to control additional slow or fast actuating dynamics on parameters that affect the operation of the other, and one or both of which may be unstable or lossy in isolation, and one or both of which may incorporate a means to affect the state of the other via parametric amplification, parametric attenuation, instability increase, or instability decrease.

36. The emulation of quantum and quantum-inspired dynamical systems that use multiple instantiations of the two-state circuit of claim 1 to emulate pairwise interactions between any two dynamical state variables in the system.

37. The emulation of quantum and quantum-inspired dynamical systems that use multiple instantiations of the two-state circuit of claim 4 to emulate pairwise interactions between any two dynamical state variables in the system.

* * * * *